US012641952B2

(12) United States Patent (10) Patent No.: US 12,641,952 B2
Yanagisawa et al. (45) Date of Patent: May 26, 2026

(54) METHOD FOR MANUFACTURING DISPLAY APPARATUS

(71) Applicant: SEMICONDUCTOR ENERGY LABORATORY CO., LTD., Atsugi (JP)

(72) Inventors: Yuichi Yanagisawa, Atsugi (JP); Shinya Sasagawa, Chigasaki (JP); Shiro Nishizaki, Kai (JP); Ryota Hodo, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 482 days.

(21) Appl. No.: 18/263,362

(22) PCT Filed: Jan. 20, 2022

(86) PCT No.: PCT/IB2022/050453
§ 371 (c)(1),
(2) Date: Jul. 28, 2023

(87) PCT Pub. No.: WO2022/167883
PCT Pub. Date: Aug. 11, 2022

(65) Prior Publication Data
US 2024/0147761 A1 May 2, 2024

(30) Foreign Application Priority Data
Feb. 3, 2021 (JP) ................................. 2021-015903

(51) Int. Cl.
*H10K 59/12* (2023.01)
*H10K 59/121* (2023.01)
(Continued)

(52) U.S. Cl.
CPC ..... *H10K 59/1201* (2023.02); *H10K 59/1213* (2023.02); *H10K 59/35* (2023.02); *H10K 59/38* (2023.02)

(58) Field of Classification Search
CPC .. H10K 59/1201; H10K 59/124; H10K 59/35; H10K 59/38
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 102760698 A 10/2012
CN 108074953 A 5/2018
(Continued)

OTHER PUBLICATIONS

Lamprecht.B et al., "Organic optoelectronic device fabrication using standard UV photolithography", Phys. Stat. Sol. (RRL) (Physica Status Solidi. Rapid Research Letters.), Oct. 30, 2007, vol. 2, No. 1, pp. 16-18.
(Continued)

*Primary Examiner* — Daniel P Shook
(74) *Attorney, Agent, or Firm* — Fish & Richardson P.C.

(57) ABSTRACT

A method for manufacturing a display apparatus with high display quality is provided. The method is for manufacturing a display apparatus including first to third insulators, first and second conductors, and a first EL layer. The first conductor is formed over the first insulator, and the second insulator is formed over the first insulator and over the first conductor. Next, a first opening portion reaching the first conductor is formed in a region of the second insulator overlapping with the first conductor. A positive photoresist
(Continued)

is applied to regions over the first and second insulators and over the first conductor, and a second opening portion with an inversely tapered structure reaching the first conductor and the second insulator is formed in a region of the photoresist overlapping with the first opening portion and the first conductor. The first EL layer, the second conductor, and the third insulator are sequentially formed on a bottom portion of the second opening portion of the photoresist and over the photoresist, and then, the photoresist and the first EL layer, the second conductor, and the third insulator formed over the photoresist are removed.

8 Claims, 24 Drawing Sheets

(51) Int. Cl.
    *H10K 59/35*        (2023.01)
    *H10K 59/38*        (2023.01)

(56)         References Cited

U.S. PATENT DOCUMENTS

| | | |
|---|---|---|
| 9,219,253 B2 | 12/2015 | Izumi et al. |
| 10,374,020 B2 | 8/2019 | Kang |
| 10,636,853 B2 | 4/2020 | Kang |
| 10,991,782 B2 | 4/2021 | Lee et al. |
| 11,004,921 B2 | 5/2021 | Kang |
| 11,423,844 B2 | 8/2022 | Ikeda et al. |
| 2002/0072139 A1 | 6/2002 | Kashiwabara |
| 2011/0148290 A1 | 6/2011 | Oota |
| 2012/0256204 A1 | 10/2012 | Yoshizumi et al. |
| 2012/0273804 A1 | 11/2012 | Hatano |
| 2012/0276484 A1 | 11/2012 | Izumi et al. |
| 2013/0084531 A1 | 4/2013 | Hamaguchi et al. |
| 2013/0084664 A1 | 4/2013 | Yoshitoku et al. |
| 2013/0084666 A1 | 4/2013 | Oshige |
| 2013/0280839 A1 | 10/2013 | Sonoda et al. |
| 2013/0295705 A1 | 11/2013 | Sonoda et al. |
| 2014/0004640 A1 | 1/2014 | Hamaguchi et al. |
| 2014/0004642 A1 | 1/2014 | Otsuka et al. |
| 2015/0060826 A1 | 3/2015 | Matsumoto et al. |
| 2015/0069360 A1 | 3/2015 | Sato |
| 2015/0076476 A1 | 3/2015 | Odaka et al. |
| 2016/0172595 A1 | 6/2016 | Malinowski et al. |
| 2016/0315133 A1 | 10/2016 | Sato |
| 2017/0141167 A1 | 5/2017 | Naganuma |
| 2017/0256754 A1 | 9/2017 | Defranco et al. |
| 2018/0138251 A1* | 5/2018 | Kang .................. H10K 59/873 |
| 2018/0190908 A1 | 7/2018 | Ke et al. |
| 2019/0173046 A1 | 6/2019 | Jeong et al. |
| 2019/0326373 A1 | 10/2019 | Kang |
| 2020/0057330 A1 | 2/2020 | Yamazaki et al. |
| 2020/0083307 A1 | 3/2020 | Lee et al. |
| 2020/0144529 A1 | 5/2020 | Lee et al. |
| 2020/0203662 A1 | 6/2020 | Mollard et al. |
| 2020/0227493 A1 | 7/2020 | Kang |
| 2020/0274110 A1 | 8/2020 | Chen et al. |
| 2021/0020868 A1 | 1/2021 | Ikeda et al. |
| 2021/0043877 A1 | 2/2021 | Defranco et al. |
| 2021/0225976 A1 | 7/2021 | Lee et al. |
| 2023/0022181 A1 | 1/2023 | Ikeda et al. |

FOREIGN PATENT DOCUMENTS

| | | |
|---|---|---|
| CN | 109873091 A | 6/2019 |
| CN | 110890400 A | 3/2020 |
| CN | 111162103 A | 5/2020 |
| CN | 111627957 A | 9/2020 |
| CN | 111628113 A | 9/2020 |
| CN | 112106446 A | 12/2020 |
| CN | 112119446 A | 12/2020 |
| DE | 102019120820 | 3/2020 |
| EP | 3321988 A | 5/2018 |
| EP | 4192219 A | 6/2023 |
| GB | 2578200 | 4/2020 |
| JP | 2000-036385 A | 2/2000 |
| JP | 2003-036971 A | 2/2003 |
| JP | 2003-059663 A | 2/2003 |
| JP | 2008-098106 A | 4/2008 |
| JP | 2008-147072 A | 6/2008 |
| JP | 2008-251270 A | 10/2008 |
| JP | 2012-160473 A | 8/2012 |
| JP | 2012-238580 A | 12/2012 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2017-529651 | 10/2017 |
| JP | 2018-081903 A | 5/2018 |
| JP | 2019-091642 A | 6/2019 |
| JP | 2019-179696 A | 10/2019 |
| JP | 2020-043058 A | 3/2020 |
| JP | 2020-160305 A | 10/2020 |
| KR | 2018-0054983 A | 5/2018 |
| KR | 2019-0065501 A | 6/2019 |
| KR | 2020-0029861 A | 3/2020 |
| KR | 2020-0053071 A | 5/2020 |
| KR | 2021-0007988 A | 1/2021 |
| KR | 2021-0007989 A | 1/2021 |
| TW | 202011092 | 3/2020 |
| TW | 202032827 | 9/2020 |
| TW | 202040843 | 11/2020 |
| WO | WO-2019/097823 | 5/2019 |
| WO | WO-2019/215530 | 11/2019 |
| WO | WO-2019/220278 | 11/2019 |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

(56)                      References Cited

OTHER PUBLICATIONS

International Search Report (Application No. PCT/IB2022/050453)
Dated Apr. 5, 2022.
Written Opinion (Application No. PCT/IB2022/050453) Dated Apr.
5, 2022.

\* cited by examiner

<u>100</u>

102  161  121a 150a 141a     121b 150b 141b     121c 150c 141c 165          112 111 122a  113a          122b  113b          122c  113c

<u>100</u>

102  161  121a 150a 141a     121b 150b 141b     121c 150c 141c 165  164  112 111 122a  113a          122b  113b          122c  113c 111     121a   112     121b     121c 111     121a   112     121b     132_1   121c 111     121a   112     121b     132_1   121c

141A 111     121a   112     121b     132_1   121c 122A     141A 111     121a   112     121b     132_1   121c 102 122a  150a    141a        122b  150b    141b        122c  150c    141c  161

111            121a 113a            121b  113b            121c 113c 102 122a 150a    141a        122a 150a    141a        122a 150a    141a 161

111        121a  113a            121b    113b            121c    113c

FIG. 18A
Intermediate state
New crystalline phase
| Amorphous | Crystalline | Crystal |
|---|---|---|
| •completely amorphous | •CAAC<br>•nc<br>•CAC<br><br>excluding single crystal and poly crystal | •single crystal<br>•poly crystal |
FIG. 18B
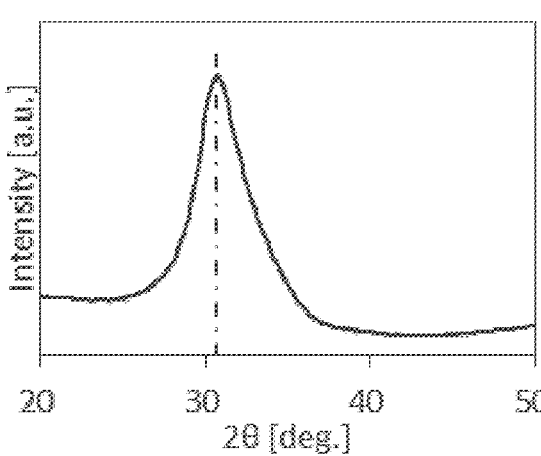
FIG. 18C
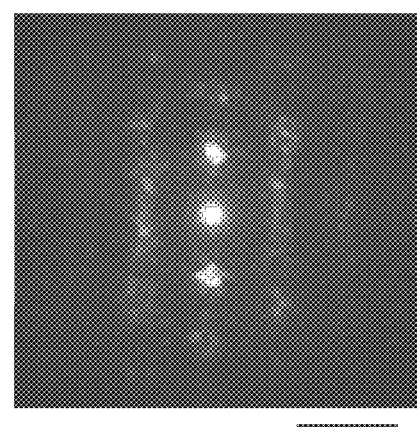
5nm⁻¹

FIG. 23A
FIG. 23B
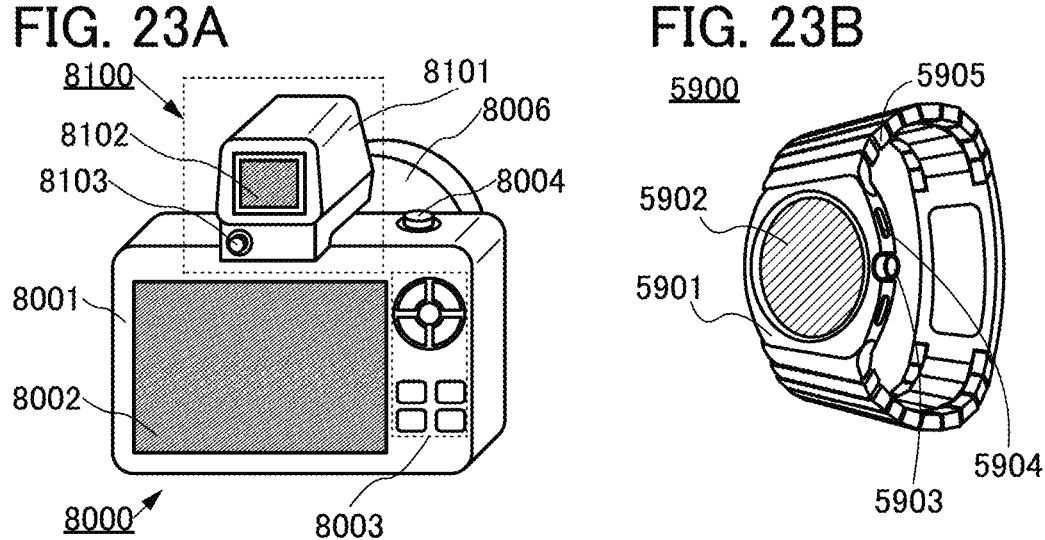
FIG. 23C
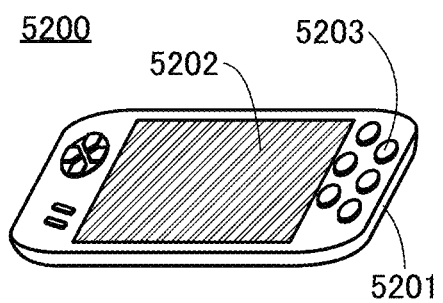

8200

8201
8202
8206
8205
8203
8204

8300

8301
8304
8304

8300

8301
8305
8302
8304
8304
8305

8300

8305
8301
8302
8305

METHOD FOR MANUFACTURING DISPLAY APPARATUS

CROSS REFERENCE TO RELATED APPLICATIONS

This application is a U.S. National Phase Application under 35 U.S.C. § 371 of International Application PCT/IB2022/050453, filed on Jan. 20, 2022, which is incorporated by reference and claims the benefit of a foreign priority application filed in Japan on Feb. 3, 2021, as Application No. 2021-015903.

TECHNICAL FIELD

One embodiment of the present invention relates to a method for manufacturing a display apparatus.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display apparatus, a liquid crystal display apparatus, a light-emitting apparatus, a power storage device, an imaging device, a memory device, a signal processing device, a processor, an electronic device, a system, a driving method thereof, a manufacturing method thereof, and a testing method thereof.

BACKGROUND ART

Display apparatuses that can be used for XR (Cross Reality or Extended Reality. A general term for VR (Virtual Reality), AR (Augmented Reality), and the like) have been required. Specifically, such display apparatuses have been desired to have high resolution, high color reproducibility, and the like so as to offer enhanced realistic feeling and an enhanced sense of immersion, for example.

Examples of apparatuses applicable to such display apparatuses include a liquid crystal display apparatus and a display apparatus including a light-emitting device such as organic EL (Electroluminescence) or a light-emitting diode (LED). Patent Document 1 discloses a display apparatus with a large number of pixels and high resolution, which includes a light-emitting device containing organic EL.

REFERENCE

Patent Document

[Patent Document 1] PCT International Publication No. 2019/220278

SUMMARY OF THE INVENTION

Problems to be Solved by the Invention

As described above, a display apparatus having high display quality is required for a device for XR. Since a display apparatus for XR needs to be provided in a glasses-type housing, a goggle-type housing, or the like, the size of the display apparatus needs to be reduced to approximately 2 inches or smaller or 1 inch or smaller.

Meanwhile, as the display apparatus provided in the display for XR, the resolution needs to be increased to offer enhanced realistic feeling and an enhanced sense of immersion. In that case, the number of pixels provided in a predetermined size can be increased by performing design such as reducing a pitch width between pixels, between wirings, or the like and reducing the size of a pixel, for example. However, in the case where a display apparatus including a light-emitting device using organic EL is considered as a display apparatus, formation of organic EL light-emitting layers with different colors between pixels is difficult as the pixel size becomes smaller; thus, a manufacturing process of the display apparatus is limited in some cases.

An object of one embodiment of the present invention is to provide a method for manufacturing a display apparatus with high definition. Another object of one embodiment of the present invention is to provide a method for manufacturing a display apparatus with low power consumption. Another object of one embodiment of the present invention is to provide a method for manufacturing a small-size display apparatus. Another object of one embodiment of the present invention is to provide a method for manufacturing a novel display apparatus. Another object of one embodiment of the present invention is to provide a display apparatus satisfying at least one of high definition, low power consumption, and a small area.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a method for manufacturing a display apparatus including a first insulator, a second insulator, a third insulator, a first conductor, a second conductor, and a first EL layer. The method for manufacturing the display apparatus includes a first step to a ninth step. The first step includes a step of forming the first conductor over the first insulator, the second step includes a step of forming the second insulator over the first insulator and over the first conductor, and the third step includes a step of forming a first opening portion reaching the first conductor in a region of the second insulator overlapping with the first conductor. The fourth step includes a step of applying a first positive photoresist to regions over the first insulator, over the second insulator, and over the first conductor, and the fifth step includes a step of performing light exposure and development on the first photoresist to form a second opening portion with an inversely tapered structure reaching the first conductor and the second insulator in a region of the first photoresist overlapping with the first opening portion and the first conductor. The sixth step includes a step of forming the first EL layer over the first conductor and the second insulator positioned on a bottom portion of the second opening portion of the first photoresist and over the first photoresist, the seventh step includes a step of forming the second conductor over the first EL layer, and the eighth step includes a step of forming the third insulator over the second conductor. The ninth step includes a step of performing light exposure and development on the first photoresist to remove the first photoresist and the first EL layer, the second conductor, and the third insulator formed over the first photoresist so that a light-emitting device including the first EL layer, the second conductor, and the third insulator is formed over the first conductor.

(2)

Another embodiment of the present invention may be a method for manufacturing a display apparatus according to (1) described above, in which the second insulator contains an organic material and an inorganic material overlapping with an upper portion of the organic material. The organic material preferably contains polyimide, and the inorganic material preferably contains at least one selected from silicon oxide, silicon oxynitride, silicon nitride oxide, silicon nitride, aluminum oxide, aluminum oxynitride, aluminum nitride oxide, and aluminum nitride.

(3)

Another embodiment of the present invention may be a method for manufacturing a display apparatus according to (1) or (2) described above, in which the display apparatus includes a first transistor positioned below the first insulator and a second transistor positioned below the first transistor. The first transistor may contain a metal oxide in a channel formation region, and the second transistor may contain silicon in a channel formation region.

(4)

Another embodiment of the present invention is a method for manufacturing a display apparatus including a first insulator, a second insulator, a third insulator, a first conductor, a second conductor, a third conductor, a fourth conductor, a first EL layer, a second EL layer, and a third EL layer. The method for manufacturing the display apparatus includes a first step to a sixteenth step. The first step includes a step of forming the first conductor, the second conductor, and the third conductor over the first insulator, the second step includes a step of forming the second insulator over the first insulator, over the first conductor, over the second conductor, and over the third conductor, and the third step includes a step of forming a first opening portion reaching the first conductor in a region of the second insulator overlapping with the first conductor. The fourth step includes a step of forming the first EL layer over the first conductor, over the second conductor, over the third conductor, and over the second insulator, and the fifth step includes a step of applying a first positive photoresist to a region over the first EL layer. The sixth step includes a step of performing light exposure and development on the first photoresist to form a second opening portion with an inversely tapered structure reaching the first EL layer in a region of the first photoresist overlapping with the second conductor and the third conductor. The seventh step includes a step of removing the first EL layer positioned on a bottom portion of the second opening portion of the first photoresist by dry etching treatment to expose the second conductor, the third conductor, and the second insulator at the bottom portion of the second opening portion of the first photoresist. The eighth step includes a step of forming the second EL layer over the first photoresist and over the second conductor, the third conductor, and the second insulator positioned on the bottom portion of the second opening portion of the first photoresist. The ninth step includes a step of performing light exposure and development on the first photoresist to remove the first photoresist and the second EL layer formed over the first photoresist. The tenth step includes a step of applying a second positive photoresist to regions over the first EL layer and over the second EL layer. The eleventh step includes a step of performing light exposure and development on the second photoresist to form a third opening portion with an inversely tapered structure reaching the second EL layer in a region of the second photoresist overlapping with the third conductor. The twelfth step includes a step of removing the second EL layer positioned on a bottom portion of the third opening portion of the second photoresist by dry etching treatment to expose the third conductor and the second insulator at the bottom portion of the third opening portion of the second photoresist. The thirteenth step includes a step of forming the third EL layer over the second photoresist, over the third conductor positioned on the bottom portion of the third opening portion of the second photoresist, and over the second insulator. The fourteenth step includes a step of performing light exposure and development on the second photoresist to remove the second photoresist and the third EL layer formed over the second photoresist. The fifteenth step includes a step of forming the fourth conductor over the first EL layer, over the second EL layer, and over the third EL layer, and the sixteenth step includes a step of forming the third insulator over the fourth conductor.

(5)

Another embodiment of the present invention may be a method for manufacturing a display apparatus according to (4) described above, in which the second insulator contains an organic material and an inorganic material overlapping with an upper portion of the organic material. The organic material preferably contains polyimide, and the inorganic material preferably contains at least one selected from silicon oxide, silicon oxynitride, silicon nitride oxide, silicon nitride, aluminum oxide, aluminum oxynitride, aluminum nitride oxide, and aluminum nitride.

(6)

Another embodiment of the present invention may be a method for manufacturing a display apparatus according to (1) or (2) described above, in which the display apparatus includes a first transistor positioned below the first insulator and a second transistor positioned below the first transistor. The first transistor may contain a metal oxide in a channel formation region, and the second transistor may contain silicon in a channel formation region. Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, and an electronic component having a chip put in a package are examples of the semiconductor device. Moreover, a memory device, a display apparatus, a light-emitting apparatus, a lighting device, an electronic device, and the like themselves are semiconductor devices or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether current flows or not.

For example, in the case where X and Y are functionally connected, one or more circuits that allow functional connection between X and Y (e.g., a logic circuit (an inverter, a NAND circuit, or a NOR circuit); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

This specification describes a circuit configuration in which a plurality of elements are electrically connected to a wiring (a wiring for supplying a constant potential or a wiring for transmitting a signal). For example, in the case in which X is directly connected to a wiring and Y is directly connected to the wiring, this specification may describe that X and Y are directly electrically connected to each other.

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like)

of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when a circuit diagram shows that independent components are electrically connected to each other, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a "resistor element" can be, for example, a circuit element having a resistance value higher than $0\Omega$ or a wiring having a resistance value higher than $0\Omega$. Therefore, in this specification and the like, a "resistor element" includes a wiring having a resistance value, a transistor in which current flows between its source and drain, a diode, a coil, and the like. Thus, the term "resistor element" can be sometimes replaced with the terms "resistor", "load", and "region having a resistance value", and the like; conversely, the terms "resistor", "load", and "region having a resistance value" can be sometimes replaced with the term "resistor element" and the like. The resistance value can be, for example, preferably higher than or equal to 1 m$\Omega$ and lower than or equal to 10$\Omega$, further preferably higher than or equal to 5 m$\Omega$ and lower than or equal to 5$\Omega$, still further preferably higher than or equal to 10 m$\Omega$ and lower than or equal to 1$\Omega$. As another example, the resistance value may be higher than or equal to 1$\Omega$ and lower than or equal to $1\times10^9\Omega$.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. The terms "capacitor", "parasitic capacitance", "gate capacitance", and the like can be replaced with the term "capacitance" and the like in some cases. Conversely, the term "capacitance" can be replaced with the terms "capacitor", "parasitic capacitance", "gate capacitance", and the like in some cases. The term "pair of electrodes" of "capacitor" can be replaced with "pair of conductors", "pair of conductive regions", "pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 µF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be sometimes replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of off-state current can be reduced, and the withstand voltage of the transistor can be increased (the reliability can be improved). Alternatively, with the multi-gate structure, drain-source current does not change very much even if drain-source voltage changes at the time of operation in a saturation region, so that a flat slope of voltage-current characteristics can be obtained. By utilizing the flat slope of the voltage-current characteristics, an ideal current source circuit or an active load having an extremely high resistance value can be obtained. Accordingly, a differential circuit, a current mirror circuit, and the like having excellent properties can be obtained.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. As another example, the case where a single capacitor is illustrated in a circuit diagram may indicate a case where two or more capacitors are electrically connected to each other in parallel. As another example, the case where a single transistor is illustrated in a circuit diagram may indicate a case where two or more transistors are electrically connected to each other in series and their gates are electrically connected to each other. Similarly, as another example, the case where a single switch is illustrated in a circuit diagram may indicate a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit structure, the device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a carrier with a positive charge moves, and the amount of current is expressed as a positive value. In other words, the direction in which a carrier with a negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. In addition, the terms do not limit the order of components. In this specification and the like, for example, a "first" component in one embodiment can be referred to as a "second" component in other embodiments or the scope of claims. As another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction in which the components are described. Thus, the positional relation is not limited to the terms described in the specification and the like, and can be described with another term as appropriate depending on the situation. For example, the expression "an insulator positioned over (on) the top surface of a conductor" can be replaced with the expression "an insulator positioned under (on) a bottom surface of a conductor" when the direction of a drawing showing these components is rotated by 180°.

Furthermore, the term "over" or "under" does not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. As another example, the term "insulating layer" or "insulating film" can be changed into the term "insulator" in some cases.

In this specification and the like, the term "electrode", "wiring", "terminal", or the like does not limit the function of a component. For example, an "electrode" is used as part of a "wiring" in some cases, and vice versa. Furthermore, the term "electrode" or "wiring" can also mean, for example, the case where a plurality of "electrodes" or "wirings" are formed in an integrated manner. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms "electrode", "wiring", "terminal", and the like are sometimes replaced with the term "region" or the like depending on the case.

In this specification and the like, the terms "wiring", "signal line", "power supply line", and the like can be interchanged with each other depending on the case or the situation. For example, the term "wiring" can be changed into the term "signal line" in some cases. As another example, the term "wiring" can be changed into the term "power supply line" or the like in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or the situation. Conversely, the term "signal" or the like can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conduction state (on state) or a non-conduction state (off state) to determine whether current flows or not. Alternatively, a switch has a function of selecting and changing a current path. Thus, a switch may have two or more terminals through which current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited or a state where current can be made to flow between the source electrode and the drain electrode. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification and the like, a device formed using a metal mask or an FMM (fine metal mask) may be referred to as a device having an MM (metal mask) structure. In this specification and the like, a device formed without using a metal mask or an FMM may be referred to as a device having an MML (metal maskless) structure.

In this specification and the like, a structure in which light-emitting layers in light-emitting devices of different colors (here, blue (B), green (G), and red (R)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

Light-emitting devices can be classified roughly into a single structure and a tandem structure. A device having a single structure includes one light-emitting unit between a pair of electrodes, and the light-emitting unit preferably includes one or more light-emitting layers. To obtain white light emission by using two light-emitting layers, two light-emitting layers are selected such that the light-emitting layers emit light of complementary colors. For example, when the emission color of a first light-emitting layer and the emission color of a second light-emitting layer are complementary colors, the light-emitting device can be configured to emit white light as a whole. To obtain white light emission by using three or more light-emitting layers, the light-emitting device is configured to emit white light as a whole by combining emission colors of the three or more light-emitting layers.

A device having a tandem structure includes two or more light-emitting units between a pair of electrodes, and each light-emitting unit preferably includes one or more light-emitting layers. To obtain white light emission, the structure is made so that light from light-emitting layers of the plurality of light-emitting units can be combined to be white light. Note that a structure for obtaining white light emission is similar to that in the case of a single structure. In the device having a tandem structure, an intermediate layer such as a charge-generation layer is suitably provided between the plurality of light-emitting units. When the above white-light-emitting device (having a single structure or a tandem structure) and the above light-emitting device having an SBS structure are compared to each other, the light-emitting device having an SBS structure can have lower power consumption than the white-light-emitting device. The light-emitting device having an SBS structure is suitable for the case where the power consumption is required to be low. Meanwhile, the white-light-emitting device is suitable in terms of lower manufacturing cost or higher manufacturing yield because the manufacturing process of the white-light-emitting device is simpler than that of the light-emitting device having an SBS structure.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

According to one embodiment of the present invention, a method for manufacturing a display apparatus with high definition can be provided. According to one embodiment of the present invention, a method for manufacturing a display apparatus with low power consumption can be provided. According to one embodiment of the present invention, a method for manufacturing a small-size display apparatus can be provided. According to one embodiment of the present invention, a method for manufacturing a novel display apparatus can be provided. According to one embodiment of the present invention, a display apparatus satisfying at least one of high definition, low power consumption, and a small area. Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted as appropriate from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 18A is a diagram showing classification of crystal structures of IGZO, FIG. 18B is a diagram showing an XRD spectrum of crystalline IGZO, and FIG. 18C is a diagram showing a nanobeam electron diffraction pattern of the crystalline IGZO.

FIG. 22A and FIG. 22B are diagrams illustrating a structure example of an electronic device.

FIG. 23A to FIG. 23C are diagrams illustrating structure examples of electronic devices.

MODE FOR CARRYING OUT THE INVENTION

Figure 1:
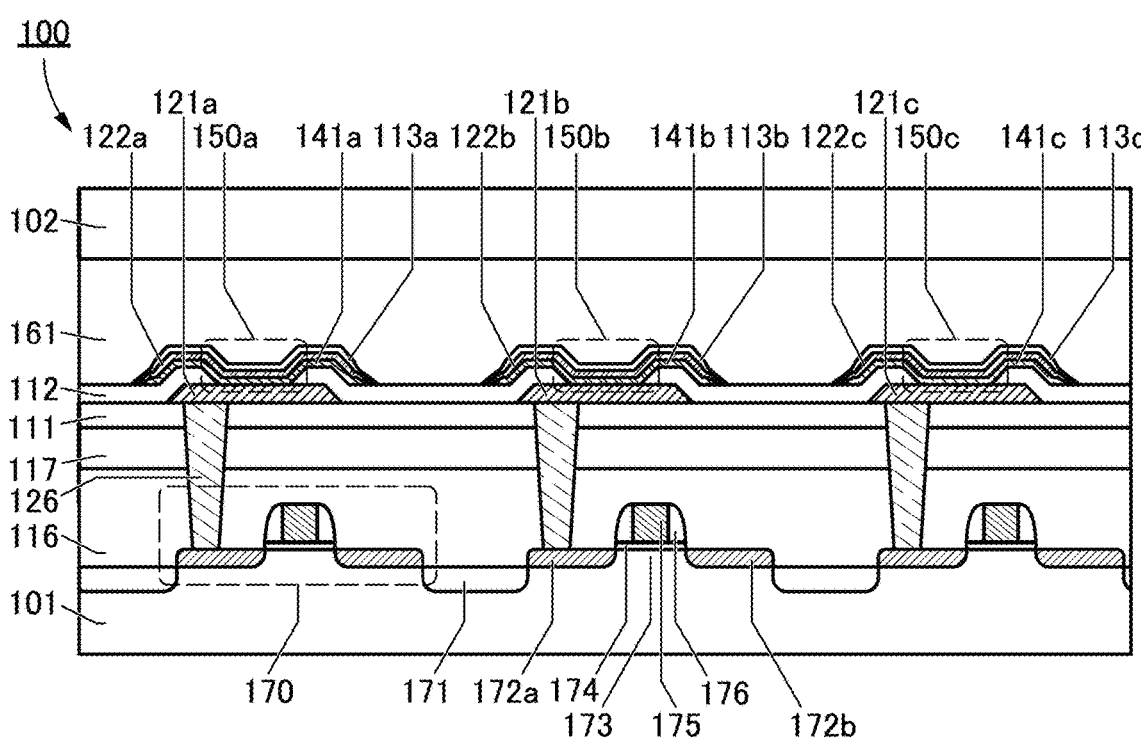
FIG. 1 is a cross-sectional view illustrating a structure example of a display apparatus.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described using a variety of diagrams or a content described with text disclosed in the specification. Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed. Embodiments described in this specification are described with reference to the drawings.

Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings. In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a display apparatus of one embodiment of the present invention and a manufacturing method of the display apparatus is described.

<Structure Example of Display Apparatus>

FIG. 1 is a cross-sectional view illustrating an example of a display apparatus of one embodiment of the present invention. A display apparatus 100 illustrated in FIG. 1 has a structure in which a pixel circuit, a driver circuit, and the like are provided over a substrate 101 as an example.

As the substrate 101, a semiconductor substrate (e.g., a single crystal substrate) containing silicon or germanium as a material can be used, for example. Besides the semiconductor substrate, for example, an SOI (Silicon On Insulator) substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper containing a fibrous material, a base material film, or the like can be used as the substrate 101. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper. Note that in the case where the manufacturing process of the display apparatus 100 involves heat treatment, a highly heat-resistant material is preferably selected for the substrate 101.

Note that the substrate 101 is described as a semiconductor substrate containing silicon and the like as a material in this embodiment.

The display apparatus 100 includes a transistor 170 and a light-emitting device 150a to a light-emitting device 150c over the substrate 101.

The transistor 170 is provided over the substrate 101 and includes an element isolation layer 171, an insulator 174, a conductor 175, an insulator 176, a semiconductor region 173 composed of part of the substrate 101, and a low-resistance region 172a and a low-resistance region 172b each functioning as a source region or a drain region. Therefore, the transistor 170 is a transistor containing silicon in its channel formation region (hereinafter referred to as a Si transistor). Although FIG. 1 illustrates a structure in which one of a source region and a drain region of the transistor 170 is electrically connected to a pixel electrode of a light-emitting device 150 (a conductor 121 described later) through a conductor 126 described later, the electrical connection structure of the semiconductor device of one embodiment of the present invention is not limited thereto. The semiconductor device of one embodiment of the present invention may have a structure in which the other of the source and the drain of the transistor 170 is electrically connected to the pixel electrode of the light-emitting device 150 (the conductor 121) through the conductor 126 or may have a structure in which a gate of the transistor 170 is electrically connected to the pixel electrode of the light-emitting device 150 (the conductor 121 described later) through the conductor 126.

Such a Fin-type transistor 170 can have an increased effective channel width, for example, and thus the transistor 170 can have improved on-state characteristics. In addition, since contribution of an electric field of a gate electrode can be increased, the off-state characteristics of the transistor 170 can be improved.

Note that the transistor 170 may be either a p-channel transistor or an n-channel transistor.

A region of the semiconductor region 173 where a channel is formed, a region in the vicinity thereof, the low-resistance region 172a and the low-resistance region 172b functioning as a source region and a drain region, and the like preferably contain a semiconductor such as a silicon-based semiconductor, and preferably contain single crystal silicon. Alternatively, a material including germanium (Ge), silicon germanium (SiGe), gallium arsenide (GaAs), gallium aluminum arsenide (GaAlAs), gallium nitride (GaN), or the like may be used. A structure using silicon whose effective mass is controlled by applying stress to the crystal lattice and changing the lattice spacing may be employed. Alternatively, the transistor 170 may be an HEMT (High Electron Mobility Transistor) with gallium arsenide, gallium aluminum arsenide, and the like.

For the conductor 175 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 171 is provided to separate a plurality of transistors on the substrate 101 from each other. The element isolation layer can be formed by, for example, a LOCOS (Local Oxidation of Silicon) method, an STI (Shallow Trench Isolation) method, a mesa isolation method, or the like.

Note that the transistor 170 illustrated in FIG. 1 is an example and the structure is not limited thereto; an appropriate transistor is used in accordance with a circuit configuration, a driving method, or the like. For example, the transistor 170 may have a planar structure instead of a Fin-type structure.

In the transistor 170 illustrated in FIG. 1, an insulator 116, an insulator 117, and an insulator 111 are stacked in this order.

For the insulator 116 and the insulator 117, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content in its composition. Moreover, in this specification, aluminum oxynitride refers to a material that has a higher oxygen content than a nitrogen content, and aluminum nitride oxide refers to a material that has a higher nitrogen content than an oxygen content in its composition.

The insulator 117 may have a function of a planarization film for eliminating a level difference caused by the transistor 170 or the like covered with the insulator 116 and the insulator 117. For example, the top surface of the insulator 117 may be planarized by planarization treatment using a chemical mechanical polishing (CMP) method or the like to improve planarity.

As the insulator 111, it is preferable to use a barrier insulating film that prevents diffusion of water, hydrogen, impurities, and the like from the substrate 101, the transistor 170, or the like into a region above the insulator 111. Accordingly, for the insulator 111, it is preferable to use an insulating material that has a function of inhibiting diffusion of impurities such as a hydrogen atom, a hydrogen molecule, and a water molecule (through which the above impurities are unlikely to pass). For the insulator 111, it is preferable to use an insulating material having a function of inhibiting diffusion of impurities such as a nitrogen atom, a nitrogen molecule, a nitrogen oxide molecule ($N_2O$, $NO$, $NO_2$, or the like), and a copper atom (through which the above oxygen is unlikely to pass) depending on the circumstances. In addition, it is preferable that the insulator 111 have a function of inhibiting diffusion of oxygen (e.g., at least one of an oxygen atom, an oxygen molecule, and the like).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

For the insulator 111, an insulator that has a function of inhibiting diffusion of oxygen and impurities such as water and hydrogen is preferably used; for example, at least one of aluminum oxide, magnesium oxide, hafnium oxide, gallium oxide, indium gallium zinc oxide, silicon nitride, silicon nitride oxide, or the like can be used. For example, silicon nitride, which has a high hydrogen barrier property, is preferably used for the insulator 111. For example, aluminum oxide or magnesium oxide, which has a high-performance function of trapping and fixing hydrogen, is preferably used for the insulator 111. The insulator 111 may be a stack including two or more materials selected from the above materials.

The amount of released hydrogen can be analyzed by thermal desorption spectroscopy (TDS), for example. The amount of hydrogen released from the insulator 111 that is converted into hydrogen atoms per area of the insulator 111 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

The insulator 111 is preferably a film with high planarity. In this case, an organic material such as an acrylic resin or polyimide can be used for the insulator 111, for example. Note that the permittivity of the insulator 111 is preferably lower than that of the insulator 117. For example, the dielectric constant of the insulator 111 is preferably lower than 4, further preferably lower than 3. The dielectric constant of the insulator 111 is, for example, preferably 0.7 times or less, further preferably 0.6 times or less the dielectric constant of the insulator 117. When a material with a low permittivity is used for an interlayer film, the parasitic capacitance generated between wirings can be reduced.

The conductor 126 and the like that are connected to the light-emitting device and the like provided above the insulator 111 are embedded in the insulator 116, the insulator 117, and the insulator 111. Note that the conductor 126 has a function of a plug or a wiring. A plurality of conductors functioning as a plug or a wiring are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases. As a material of each of plugs and wirings (e.g., the conductor 126 and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

For example, a wiring layer may be provided above the insulator 117 and below the insulator 111 (not illustrated).

The light-emitting device 150a to the light-emitting device 150c are provided above the insulator 111 in FIG. 1. A structure example of the light-emitting device 150a to the light-emitting device 150c which are provided above the insulator 111 illustrated in FIG. 1 will be described below.

Note that in this specification and the like, in the case where each of the light-emitting device 150a to the light-emitting device 150c is not distinguished from each other, the light-emitting device 150a to the light-emitting device 150c are collectively described as "light-emitting device 150" in some cases. Similarly, a conductor 121a to a conductor 121c may be collectively described as "conductor 121" in some cases, an EL layer 141a to an EL layer 141c may be collectively described as "EL layer 141" in some cases, a conductor 122a to a conductor 122c may be collectively described as "conductor 122" in some cases, and an insulator 113a to an insulator 113c may be collectively described as "insulator 113" in some cases. Over the insulator 111, the conductor 121a to the conductor 121c functioning as each of the pixel electrode of the light-emitting device 150a to the light-emitting device 150c are provided. Note that in FIG. 1, none of the conductor 121a to the conductor 121c is provided over part of the insulator 111.

An insulator 112 is provided over the insulator 111 and over the conductor 121a. In FIG. 1, a region where the insulator 112 is not provided exists over part of the conductor 121a, over part of the conductor 121b, and over part of the conductor 121c.

The EL layer 141a is provided over the insulator 112 and over the conductor 121a. The EL layer 141b is provided over the insulator 112 and over the conductor 121b. The EL layer 141c is provided over the insulator 112 and over the conductor 121c. In FIG. 1, a region where the EL layer 141a to the EL layer 141c are not provided exists over part of the insulator 112. The EL layer 141a to the EL layer 141c preferably include light-emitting layers exhibiting light of different colors. For example, the EL layer 141a can include a light-emitting layer exhibiting blue (B) light, the EL layer 141b can include a light-emitting layer exhibiting green (G) light, and the EL layer 141c can include a light-emitting layer exhibiting red (R) light. Thus, the display apparatus

100 may have a structure (an SBS structure) in which light-emitting layers for respective colors are provided over a plurality of pixel electrodes (the conductor 121a to the conductor 121c).

Note that the combination of colors of light emitted by the light-emitting layers included in the EL layer 141a to the EL layer 141c is not limited to the above, and a color such as cyan, magenta, or yellow may also be used, for example. The number of colors of light emitted by the light-emitting devices 150 of the display apparatus 100, which is three in the above example, may be two or four or more.

The EL layer 141a, the EL layer 141b, and the EL layer 141c may each include one or more of an electron-injection layer, an electron-transport layer, a hole-injection layer, and a hole-transport layer in addition to the layer containing a light-emitting organic compound (the light-emitting layer).

Figures 2A, 2B, 2C, 2D:
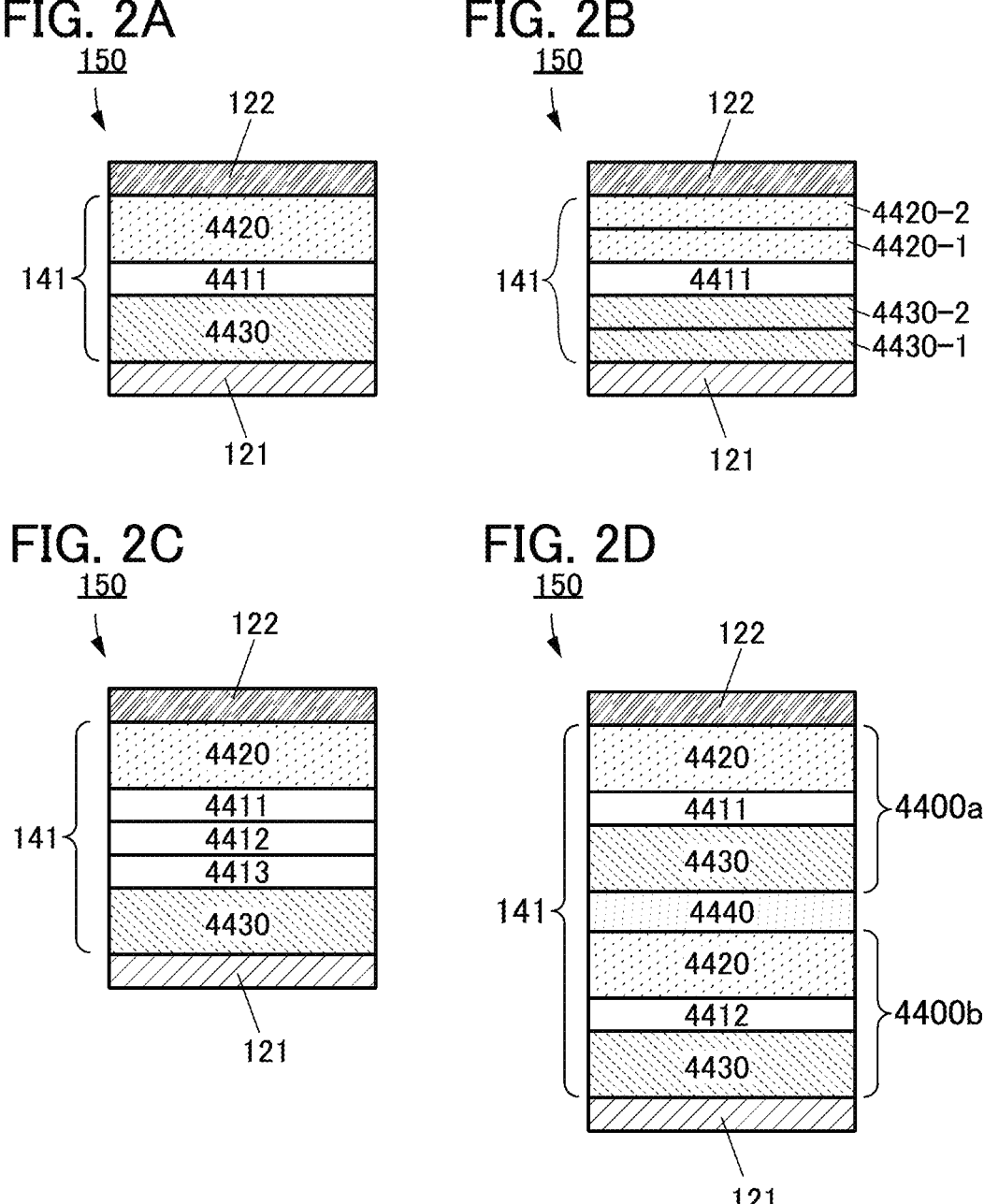
FIG. 2A to FIG. 2D are schematic diagrams illustrating structure examples of a light-emitting device.

Like the light-emitting device 150 illustrated in FIG. 2A, the light-emitting device 150a to the light-emitting device 150c in FIG. 1 can be formed of a plurality of layers such as a layer 4420, a light-emitting layer 4411, and a layer 4430. In FIG. 1, each of the EL layer 141a, the EL layer 141b, and the EL layer 141c can have a structure in which the layer 4420, the light-emitting layer 4411, and the layer 4430 are included.

The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes (the conductor 121 and the conductor 122 described later), can function as a single light-emitting unit, and the structure in FIG. 2A is referred to as a single structure in this specification and the like.

FIG. 2B is a modification example of the EL layer 141 included in the light-emitting device 150 illustrated in FIG. 2A. Specifically, the light-emitting device 150 illustrated in FIG. 2B includes a layer 4430-1 over the conductor 121, a layer 4430-2 over the layer 4430-1, the light-emitting layer 4411 over the layer 4430-2, a layer 4420-1 over the light-emitting layer 4411, a layer 4420-2 over the layer 4420-1, and the conductor 122 over the layer 4420-2. For example, when the conductor 121 functions as an anode and the conductor 122 functions as a cathode, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, when the conductor 121 functions as a cathode and the conductor 122 functions as an anode, the layer 4430-1 functions as an electron-injection layer, the layer 4430-2 functions as an electron-transport layer, the layer 4420-1 functions as a hole-transport layer, and the layer 4420-2 functions as the hole-injection layer. With such a layer structure, carriers can be efficiently injected to the light-emitting layer 4411, and the efficiency of the recombination of carriers in the light-emitting layer 4411 can be enhanced.

Note that the structure in which a plurality of light-emitting layers (the light-emitting layer 4411, a light-emitting layer 4412, and a light-emitting layer 4413) are provided between the layer 4420 and the layer 4430 as illustrated in FIG. 2C is a variation of the single structure.

A stack including a plurality of layers such as the layer 4420, the light-emitting layer 4411, and the layer 4430 is sometimes referred to as a light-emitting unit. A plurality of light-emitting units can be connected in series with an intermediate layer (a charge-generation layer) therebetween. Specifically, a light-emitting unit 4400*a* and a light-emitting unit 4400*b*, which are a plurality of light-emitting units, can be connected in series with an intermediate layer (a charge-generation layer) 4440 therebetween as illustrated in FIG. 2D. Note that such a structure is referred to as a tandem structure in this specification. A tandem structure may be rephrased as, for example, a stack structure in this specification and the like. Note that a light-emitting device capable of high-luminance light emission can be obtained when the light-emitting device has a tandem structure. In the case where the light-emitting device 150 of the display apparatus 100 in FIG. 1 has a tandem structure, the EL layer 141 can include, for example, the layer 4420, the light-emitting layer 4412, and the layer 4430 that are included in the light-emitting unit 4400*a*, the intermediate layer 4440, and the layer 4420, the light-emitting layer 4411, and the layer 4430 that are included in the light-emitting unit 4400*b*.

The emission color of the light-emitting device 150 can be red, green, blue, cyan, magenta, yellow, white, or the like depending on the material that constitutes the EL layer 141. Furthermore, the color purity can be further increased when the light-emitting device 150 has a microcavity structure.

The light-emitting device that emits white light preferably contains two or more kinds of light-emitting substances in the light-emitting layer. To obtain white light emission, two or more kinds of light-emitting substances are selected such that their emission colors are complementary.

The light-emitting layer preferably contains two or more light-emitting substances that emit light of R (red), G (green), B (blue), Y (yellow), 0 (orange), or the like. Alternatively, the light-emitting layer preferably contains two or more light-emitting substances that emit light containing two or more of spectral components of R, G, and B.

As illustrated in FIG. 1, there is a gap between two EL layers of light-emitting devices of different colors. In this manner, the EL layer 141*a*, the EL layer 141*b*, and the EL layer 141*c* are preferably provided so as not to be in contact with each other. This can suitably prevent unintentional light emission (also referred to as crosstalk) from being caused by a current flowing through two adjacent EL layers. As a result, the contrast can be increased to achieve a display apparatus with high display quality.

The conductor 122*a* and the insulator 113*a* are sequentially provided over the EL layer 141*a*. The conductor 122*b* and the insulator 113*b* are sequentially provided over the EL layer 141*b*. The conductor 122*c* and the insulator 113*c* are sequentially provided over the EL layer 141*c*.

Each of the conductor 122*a* to the conductor 122*c* functions as, for example, an upper electrode of the light-emitting device 150*a* to the light-emitting device 150*c*. The conductor 122*a* to the conductor 122*c* preferably contain a conductive material having a light-transmitting property so that light emission from the light-emitting device 150 can be extracted to above the display apparatus 100. The insulator 113*a* to the insulator 113*c* function as, for example, a passivation film protecting the light-emitting device 150*a*, the light-emitting device 150*b*, and the light-emitting device 150*c*. Thus, the insulator 113*a* to the insulator 113*c* are preferably formed using a material preventing entry of water and the like. A resin layer 161 is provided over the insulator 113*a* to the insulator 113*c*. A substrate 102 is provided over the resin layer 161.

As the substrate 102, a substrate having a light-transmitting property is preferably used, for example. Using a substrate having a light-transmitting property as the substrate 102 enables extraction of light emitted from the light-emitting device 150*a*, the light-emitting device 150*b*, and the light-emitting device 150*c* to above the substrate 102.

One embodiment of the present invention is not limited to the above-described structures, and the above-described structures can be modified as appropriate in accordance with circumstances.

Although a structure where the Si transistors are provided over the substrate 101 and the light-emitting devices 150 are provided over the Si transistors is illustrated in FIG. 1, the Si transistors may be replaced by another type of transistors, for example. The display apparatus 100 illustrated in FIG. 3 has a structure where the Si transistors in the display apparatus 100 illustrated in FIG. 1 are replaced by OS transistors. In the display apparatus in FIG. 3, transistors 500, which are the OS transistors, are provided over an insulator 512, an insulator 581 is provided over the transistors 500, and the light-emitting devices 150 are provided over the insulator 581. The OS transistors are described in detail in Embodiment 2.

Figure 4:
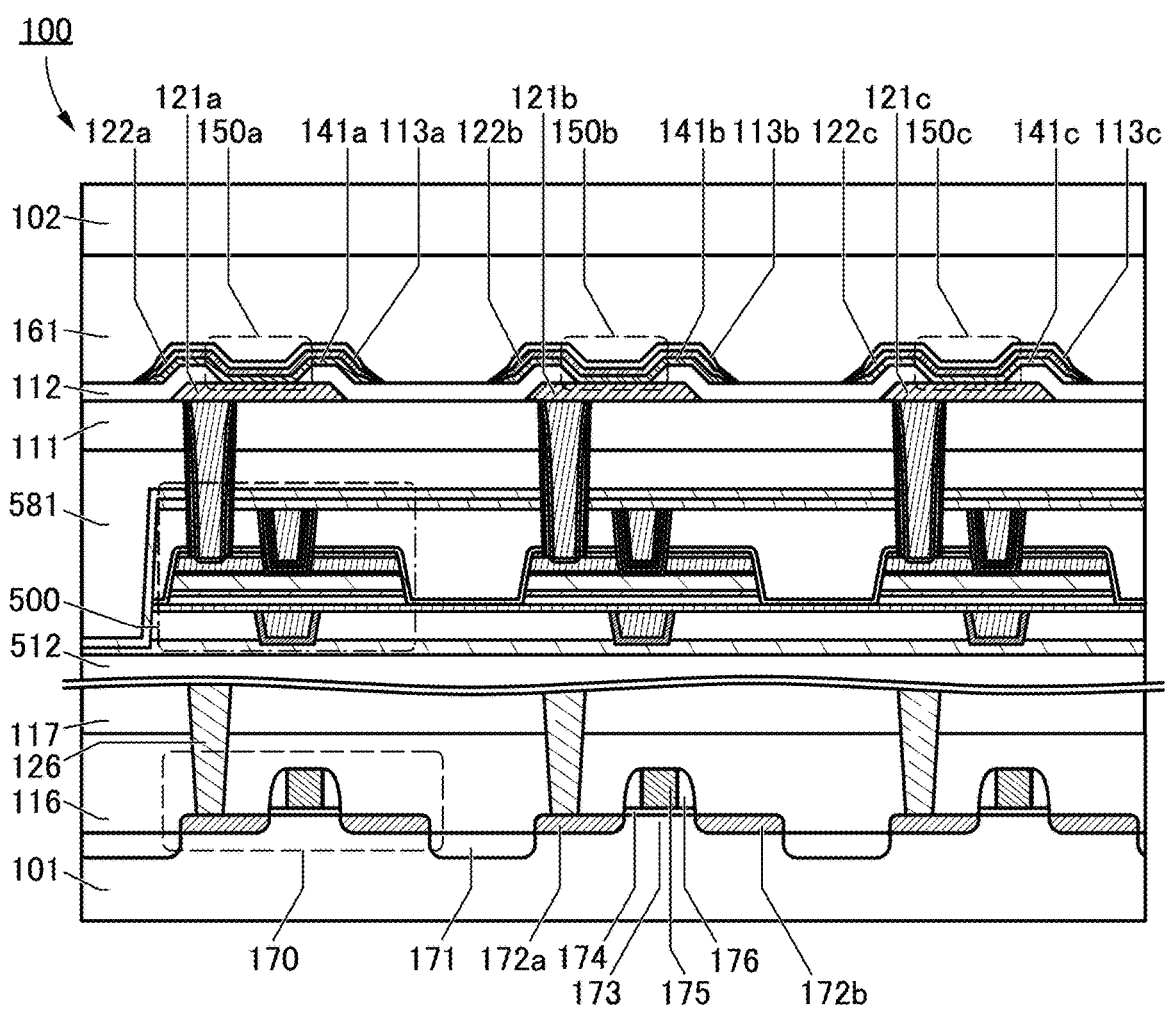
FIG. 4 is a cross-sectional view illustrating a structure example of a display apparatus.

Alternatively, as in the display apparatus 100 illustrated in FIG. 4, a structure where the transistors 170, which are the Si transistors, are provided over the substrate 101, the transistors 500, which are the OS transistors, are provided over the transistors 170, and the light-emitting devices 150 are provided over the transistors 500 may be employed, for example. In the display apparatus 100 illustrated in FIG. 4, the transistors 500 can be driving transistors for the light-emitting devices 150 and the transistors 170 can be transistors included in a driver circuit for driving the display apparatus 100, for example.

For example, the light-emitting device 150*a*, the light-emitting device 150*b*, and the light-emitting device 150*c* described above can be arranged in a matrix as an example. A matrix arrangement is sometimes referred to as a stripe arrangement. The arrangement method of the light-emitting devices is not limited thereto; another arrangement method such as a delta arrangement, a zigzag arrangement, or a PenTile arrangement may also be used. As each of the light-emitting device 150*a*, the light-emitting device 150*b*, and the light-emitting device 150*c*, an EL element such as an OLED (Organic Light Emitting Diode) or a QLED (Quantum-dot Light Emitting Diode) is preferably used. As examples of a light-emitting substance contained in the EL element, a substance that emits fluorescent light (a fluorescent material), a substance that emits phosphorescent light (a phosphorescent material), an inorganic compound (e.g., a quantum dot material), a substance exhibiting thermally activated delayed fluorescence (a thermally activated delayed fluorescence (TADF) material), and the like can be given.

<Sealing Structure Example of Display Apparatus>

Figure 3:
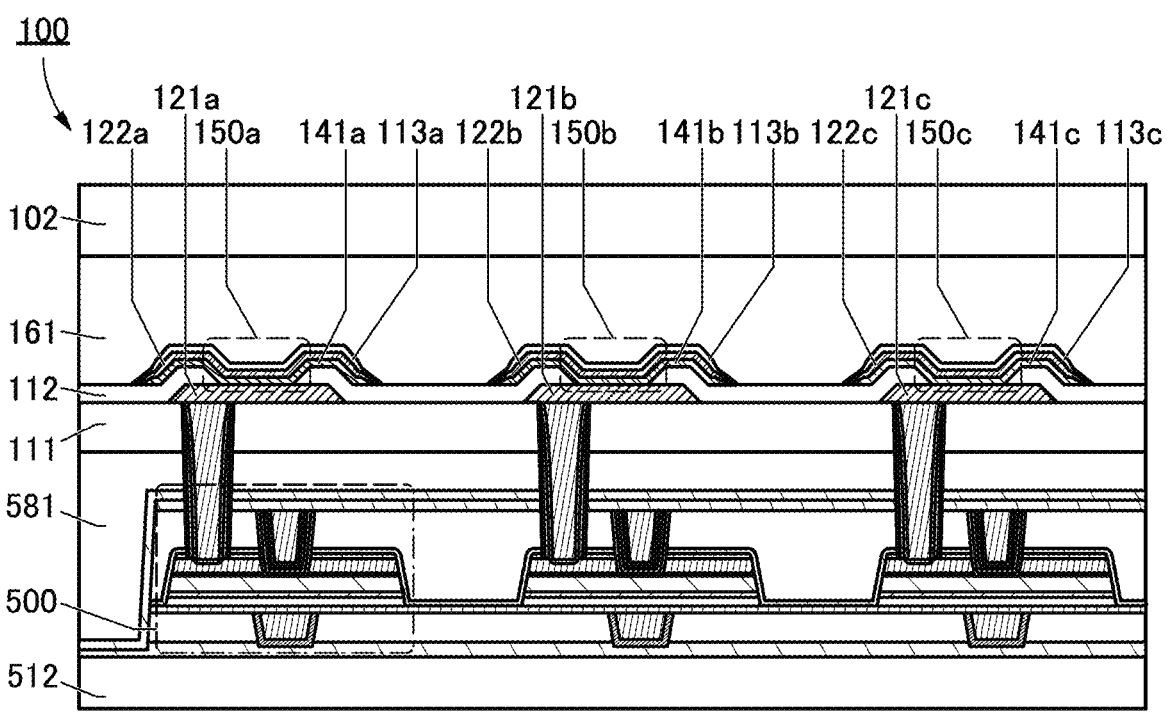
FIG. 3 is a cross-sectional view illustrating a structure example of a display apparatus.

Next, a sealing structure for the light-emitting device 150*a* to the light-emitting device 150*c* applicable to the display apparatus 100 in FIG. 1, FIG. 3, and FIG. 4 is described.

Figure 5A:
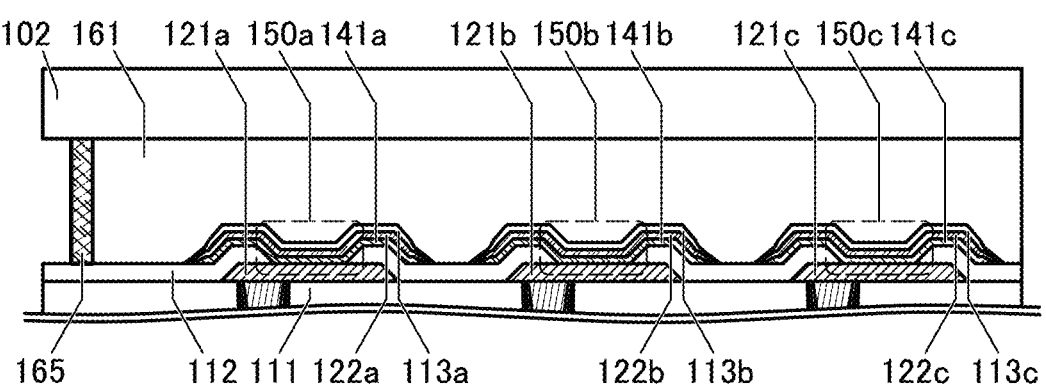
FIG. 5A and FIG. 5B are cross-sectional views illustrating structure examples of a display apparatus.

FIG. 5A is a cross-sectional view illustrating an example of a sealing structure applicable to the display apparatus 100 in FIG. 1, FIG. 3, and FIG. 4. Specifically, FIG. 5A illustrates an end portion of the substrate 102 included in the display apparatus 100 in FIG. 1, FIG. 3, and FIG. 4 and a material provided in the vicinity of the end portion. FIG. 5A selectively illustrates only some of the circuit elements of the display apparatus 100. Specifically, FIG. 5A illustrates the insulator 111, a plug connected to the transistor 500, and insulators, conductors, the light-emitting device 150a to the light-emitting device 150c, and the like that are positioned above the insulator 111.

In the display apparatus 100 in FIG. 5A, an adhesive layer 165 is provided at or around the end portion of the substrate 102. Specifically, the display apparatus 100 is formed such that the adhesive layer 165 is placed between the insulator 112 and the substrate 102.

The adhesive layer 165 is preferably formed using, for example, a material inhibiting transmission of an impurity such as moisture. Using the material for the adhesive layer 165 can increase the reliability of the display apparatus 100. A structure in which the insulator 112 and the substrate 102 are bonded with the resin layer 161 using the adhesive layer 165 is sometimes referred to as a solid sealing structure. In the case where the resin layer 161 in the solid sealing structure has a function of bonding the insulator 112 and the substrate 102 like the adhesive layer 165, the adhesive layer 165 is not necessarily provided.

In contrast, a structure in which the insulator 112 and the substrate 102 are bonded with each other being filled with an inert gas instead of the resin layer 161 by using the adhesive layer 165 is sometimes referred to as a hollow sealing structure (not illustrated). Examples of an inert gas include a nitrogen, an argon, or the like.

Figure 5B:
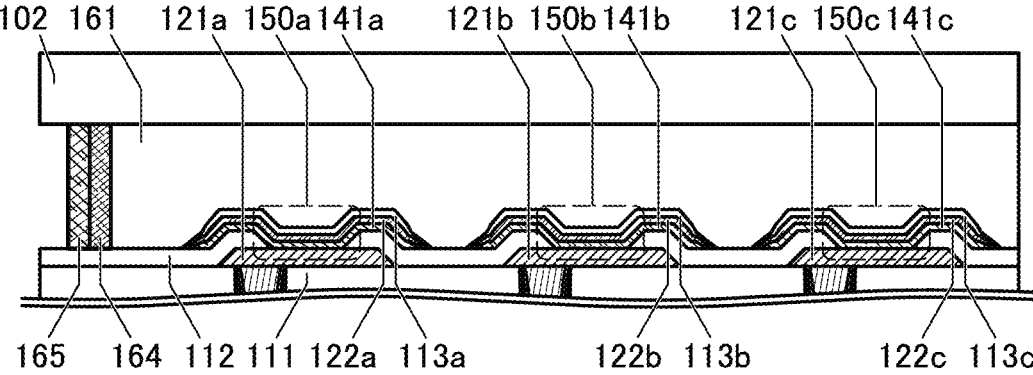

In the sealing structure of the display apparatus 100 illustrated in FIG. 5A, two or more overlapping adhesive layers may be used. For example, an adhesive layer 164 may be further provided inward from the adhesive layer 165 (between the adhesive layer 165 and the resin layer 161) as illustrated in FIG. 5B. Two or more overlapping adhesive layers can inhibit transmission of an impurity such as moisture more, further increasing the reliability of the display apparatus 100.

A desiccant may be mixed into the adhesive layer 164. In this case, the desiccant adsorbs moisture contained in the resin layer 161, insulators, conductors, EL layers, and the like that are provided inward from the adhesive layer 165 and the adhesive layer 164, increasing the reliability of the display apparatus 100.

Although the solid sealing structure is illustrated in the display apparatus 100 in FIG. 5B, a hollow sealing structure may be employed.

Furthermore, an inert liquid may be used instead of the resin layer 161 to fill the space in each of the sealing structures of the display apparatus 100 in FIG. 5A and FIG. 5B. Examples of an inert liquid include a fluorine-based inert liquid or the like.

<Manufacturing Method 1 of Display Apparatus>

Next, a method for manufacturing the display apparatus 100 illustrated in FIG. 1 will be described.

FIG. 6A to FIG. 8D are cross-sectional views each illustrating an example of the method for manufacturing the display apparatus of one embodiment of the present invention. Note that FIG. 6A to FIG. 8D each illustrates an example of the method for manufacturing the display apparatus 100 in FIG. 1. In this embodiment, the method for manufacturing the display apparatus 100 is described as including Step A1 to Step A13, for example.

[Step A1]

Figure 6A:
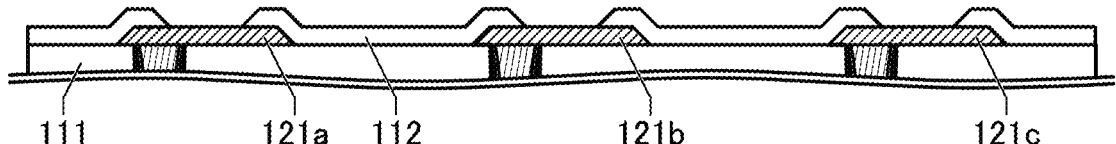
FIG. 6A to FIG. 6E are cross-sectional views illustrating an example of a method for manufacturing a display apparatus.

In Step A1, a stack in which the insulator 111, the conductor 121a to the conductor 121c provided over the insulator 111, and the insulator 112 provided over the insulator 111 and over the conductor 121a to the conductor 121c are formed is prepared as illustrated in FIG. 6A. Note that only some of the circuit elements of the display apparatus 100 are selectively illustrated in FIG. 6A to FIG. 8D. Specifically, each of FIG. 6A to FIG. 8D illustrates the insulator 111, the plug connected to the transistor 500, and insulators, conductors, the light-emitting device 150a to the light-emitting device 150c, and the like that are positioned above the insulator 111.

FIG. 6A illustrates a cross-sectional view of the stack in which the insulator 111, the conductor 121a to the conductor 121c, and the insulator 112 are formed in the display apparatus 100.

The conductor 121a to the conductor 121c can be formed in such a manner that, for example, a conductive film is formed over the insulator 111 and the conductive film is subjected to a patterning step, an etching step, or the like.

The insulator 112 can be formed in such a manner that an insulating film is formed over the insulator 111 and over the conductor 121a to the conductor 121c and an opening portion is provided in a region of the insulating film overlapping with the conductor 121a to the conductor 121c, for example. Note that in this embodiment, the opening portion formed in Step A1 is referred to as a first opening portion.

The conductor 121a to the conductor 121c function respectively as anodes of the light-emitting device 150a, the light-emitting device 150b, and the light-emitting device 150c included in the display apparatus 100, for example.

Indium tin oxide (sometimes referred to as ITO) or the like can be used for the conductor 121a to the conductor 121c, for example.

Each of the conductor 121a to the conductor 121c may have a stacked-layer structure of two or more layers instead of a single-layer structure. For example, a conductor having a high visible-light reflectance can be used for the first-layer conductor and a conductor having a high light-transmitting property can be used for the uppermost-layer conductor. Examples of a conductor having a high visible-light reflectance include silver, aluminum, and an alloy film of silver (Ag), palladium (Pd), and copper (Cu) (Ag—Pd—Cu (APC) film). Examples of a conductor having a high light-transmitting property include indium tin oxide described above. The conductor 121a to the conductor 121c can each be a stacked-layer film in which a pair of titanium films sandwich aluminum (a film in which Ti, Al, and Ti are stacked in this order), a stacked-layer film in which a pair of indium tin oxide films sandwich silver (a film in which ITO, Ag, and ITO are stacked in this order), or the like.

The insulator 112 is preferably formed with a material that is not dissolved in a resin layer 132_1 that is applied in a later step, for example. As the material that is not dissolved in the resin layer 132_1, an inorganic film having an insulating property can be given, for example. As the inorganic film having an insulating property, at least one selected from silicon oxide, silicon oxynitride, silicon nitride oxide, silicon nitride, aluminum oxide, aluminum oxynitride, aluminum nitride oxide, aluminum nitride, or the like can be used. The insulator 112 may be a stack using two or more materials selected from the above materials.

Furthermore, as the insulator 112, an organic film may be used as long as the film is formed of a material that is not dissolved in the resin layer 132_1 that is applied in the later step. Examples of the organic film that can be used for the insulator 112 include polyimide.

The insulator 112 may have a multilayer structure in which the first layer is the aforementioned organic film and the second layer is the aforementioned inorganic film. In that case, the first-layer organic film can be protected by the second-layer inorganic film; thus, a material dissolved in the resin layer 132_1 that is applied in the later step can be used as the first-layer organic film.

[Step A2]

In Step A2, the resin layer 132_1 is applied on a top of the stack illustrated in FIG. 6A, that is, over the insulator 112 and over the conductor 121a to the conductor 121c. The resin layer 132_1 is preferably a photoresist, for example. Note that either a negative photoresist or a positive photoresist may be used as the photoresist. Note that the resin layer 132_1 is described as a positive photoresist in this manufacturing method. After the resin layer 132_1 is applied, the resin layer 132_1 may be cured in accordance with cure conditions of the resin layer 132_1 (see FIG. 6B). For example, after the resin layer 132_1 is applied, a solvent contained in the resin layer 132_1 may be removed by performing baking treatment.

Note that the thickness of the resin layer 132_1 is preferably greater than or equal to 0.5 μm, further preferably greater than or equal to 1 μm, still further preferably greater than or equal to 2 μm, for example.

[Step A3]

Figure 6B:
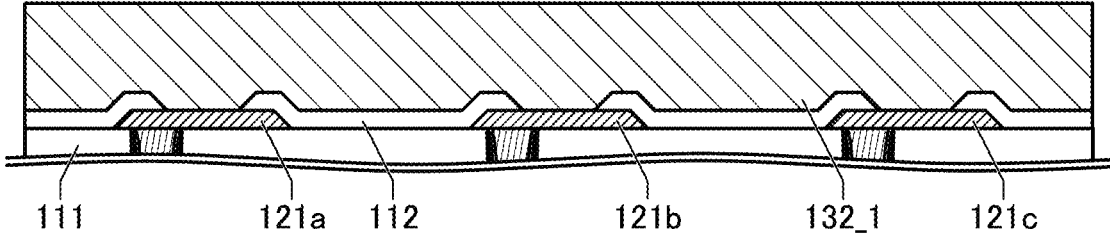
Figure 6C:
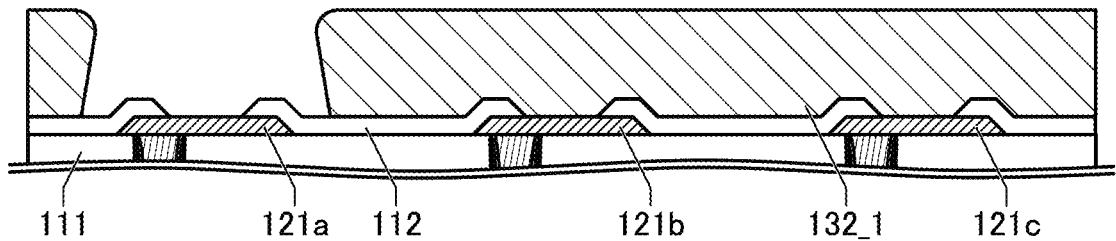

In Step A3, a light-exposure step and a development step are performed on the resin layer 132_1 illustrated in FIG. 6B. As described above, the resin layer 132_1 is a positive photoresist. In the light-exposure step, a range of the resin layer 132_1 exposed to light is, for example, a range including a region of the resin layer 132_1 overlapping with the conductor 121a. Thus, an opening portion reaching the conductor 121a and the insulator 112 can be formed in a region of the resin layer 132_1 overlapping with the conductor 121a by a subsequent development step (see FIG. 6C). Note that the opening portion formed in Step A3 is referred to as a second opening portion in this embodiment. Moreover, a side surface of an opening portion of the resin layer 132_1 can have an inversely tapered shape as illustrated in FIG. 6C by appropriately performing a light-exposure step and a development step.

Similarly, in the case where the resin layer 132_1 is a negative photoresist, the side surface of the opening portion of the resin layer 132_1 can also have an inversely tapered shape by appropriately setting conditions of a light-exposure step and a development step.

In this specification and the like, a taper angle refers to an angle formed by a side surface and a bottom surface of a layer having a tapered shape when the layer is observed from the direction of its cross section (a plane perpendicular to the surface of the substrate). A taper angle smaller than 90° is referred to as forward tapered angle and a taper angle of larger than or equal to 90° is referred to as inversely tapered angle.

Note that depending on a material of the resin layer 132_1, the insulator 112 and the conductor 121a are sometimes dissolved in a chemical solution such as a developing solution used in the development step in Step A3. To prevent this, a step of forming protective layers over the conductor 121a to the conductor 121c and over the insulator 112 may be included between Step A1 and Step A2 (not illustrated). The protective layer preferably has resistance against a chemical solution used in the development step in Step A3. After the second opening portion is formed in the resin layer 132_1 in the development step in Step A3, the insulator 112 and the conductor 121a can be exposed at a bottom surface of the second opening portion by removing the protective layers provided on the bottom surface of the second opening portion. Note that ashing treatment performed using an oxygen gas that is introduced and made into plasma can be given as a method for removing the protective layers. In this case, the protective layer is preferably formed with a material which is easily removed by ashing treatment.

In order to cure the resin layer 132_1 after the development step, the stack illustrated in FIG. 6C may be subjected to baking treatment.

[Step A4]

Figure 6D:
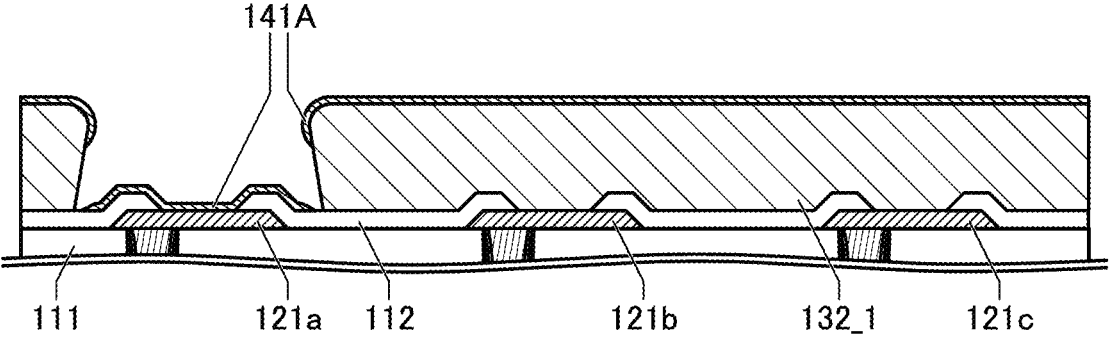

In Step A4, an EL layer 141A is formed over the top of the stack illustrated in FIG. 6C, that is, over the conductor 121a, over the insulator 112, and over the resin layer 132_1 (see FIG. 6D).

At this time, a side surface of the second opening portion of the resin layer 132_1 has an inversely tapered shape; thus, the EL layer 141A is not formed on the entire end portion of the second opening portion of the resin layer 132_1. That is, the formed EL layer 141A has a structure divided into a region over the conductor 121a and the insulator 112 and a region over the resin layer 132_1 by the second opening portion of the resin layer 132_1.

At the time of forming the EL layer 141A, the taper angle of an end portion of the resin layer 132_1 to separate the EL layer 141A into the region over the conductor 121a and the insulator 112 and the region over the resin layer 132_1 is, for example, preferably greater than or equal to 95°, further preferably greater than or equal to 100°, still further preferably greater than or equal to 110°, yet still further preferably greater than or equal to 120°. Note that the EL layer 141A contains an organic compound. As the organic compound, a hole-injection layer, a hole-transport layer, a light-emitting layer, an electron-transport layer, an electron-injection layer, and the like can be provided as illustrated in FIG. 2A, for example.

Depending on circumstances, the EL layer 141A may include at least one of a hole-injection layer, a hole-transport layer, a light-emitting layer, an electron-transport layer, an electron-injection layer, and the like.

Note that before the EL layer 141A is formed, heat treatment may be performed on the stack in FIG. 6C in a vacuum. Note that the vacuum described in this specification and the like is, for example, preferably lower than or equal to $1.0 \times 10^{-3}$ Pa, further preferably lower than or equal to $1.0 \times 10^{-5}$ Pa, still further preferably lower than or equal to $1.0 \times 10^{-7}$ Pa.

[Step A5]

Figure 6E:
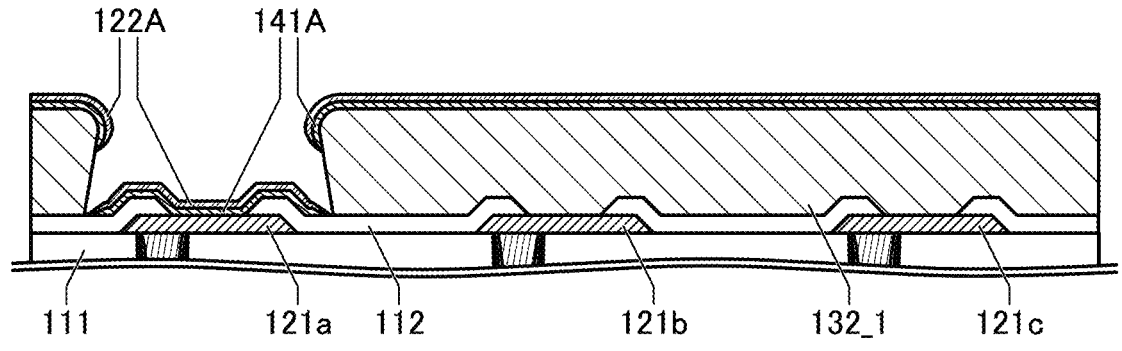

In Step A5, a conductor 122A is formed over the top of the stack illustrated in FIG. 6D, that is, over the EL layer 141A (see FIG. 6E).

At this time, the side surface of the second opening portion of the resin layer 132_1 has an inversely tapered shape; thus, the conductor 122A is not formed on the entire end portion of the second opening portion of the resin layer 132_1 as in Step A4. Thus, the conductor 122A has a structure divided into a portion over the EL layer 141A including a region overlapping with the conductor 121a and the insulator 112 (the bottom surface of the second opening portion) and a portion over the EL layer 141A including a region overlapping with the resin layer 132_1.

The conductor 122A functions as a cathode (the conductor 122a) of the light-emitting device 150a included in the display apparatus 100, for example.

The conductor 122A is preferably formed using a light-transmitting and light-reflective material with high conductivity (sometimes referred to as a transflective electrode).

The conductor 122A can be formed using, for example, an alloy of silver and magnesium, or indium tin oxide.

Note that in the case of using an alloy of silver and magnesium for the conductor 122A, the thickness of the conductor 122A is preferably 20 nm, further preferably 15 nm when the volume ratio of silver to magnesium is 1:0.1.

To increase the electric conductivity and prevent entry of impurities from the outside, a conductor, an insulator, or the like may be provided over a top of the conductor 122A. For example, in the case where the above-described alloy of silver and magnesium is used for the conductor 122A, indium tin oxide, indium-gallium-zinc oxide, or the like can be used for a conductor provided over the top of the conductor 122A.

Figure 7A:
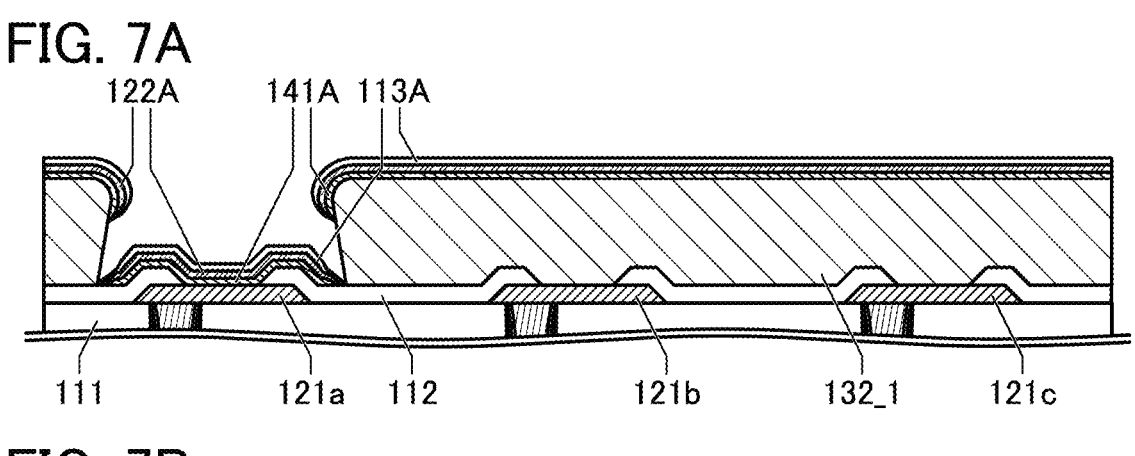
FIG. 7A to FIG. 7D are cross-sectional views illustrating an example of a method for manufacturing a display apparatus.

[Step A6] In Step A6, an insulator 113A is formed over the top of the stack illustrated in FIG. 6E, that is, over the conductor 122A (see FIG. 7A).

At this time, the side surface of the second opening portion of the resin layer 132_1 has an inversely tapered shape; thus, the insulator 113A is not formed on the entire end portion of the second opening portion of the resin layer 132_1 as in Step A4 and Step A5. Thus, the insulator 113A has a structure divided into a portion over the conductor 122A including the region overlapping with the conductor 121a and the insulator 112 (the bottom surface of the second opening portion) and a portion over the conductor 122 including the region overlapping with the resin layer 132_1.

The insulator 113A functions as a passivation film (referred to as a protective layer in some cases) protecting the light-emitting device 150a, the light-emitting device 150b, and the light-emitting device 150c of the display apparatus 100. Thus, the insulator 113A is preferably formed using a material preventing entry of water and the like. Any of the materials usable for the insulator 111 can be used for the insulator 113A, for example. Specifically, aluminum oxide, silicon nitride, silicon nitride oxide, or the like can be used.

The insulator 113A functioning as a protective layer can have, for example, a single-layer structure or a stacked-layer structure at least including an inorganic insulating film.

Examples of the inorganic insulating film include oxide films and nitride films of silicon oxide, silicon oxynitride, aluminum oxynitride, hafnium oxide, and the like in addition to aluminum oxide, silicon nitride, and silicon nitride oxide, which are described above. A semiconductor material such as indium gallium oxide or indium gallium zinc oxide may be used for the insulator 113A. Note that the insulator 113A may be formed by an ALD (Atomic Layer Deposition) method, a CVD (Chemical Vapor Deposition) method, and a sputtering method. Note that although a structure in which the insulator 113A contains an inorganic insulating film is described as an example, one embodiment of the present invention is not limited thereto. For example, the insulator 113 may have a stacked-layer structure of an inorganic insulating film and an organic insulating film.

[Step A7]

Figure 7B:
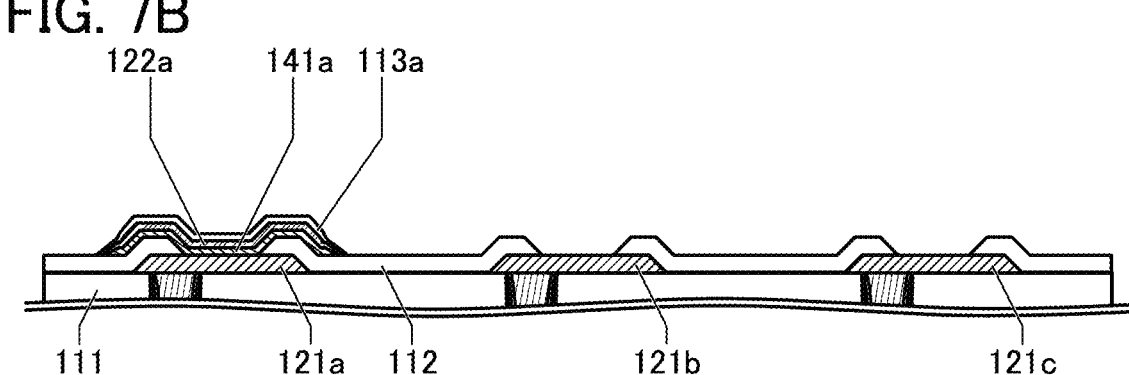

In Step A7, the resin layer 132_1 is removed from the stack illustrated in FIG. 7A (see FIG. 7B).

As a method for removing the resin layer 132_1, a method of using a stripping solution can be given as an example. At this time, to prevent erosion to the EL layer 141A by a stripping solution, the conductor 122A and/or the insulator 113A preferably function(s) as a protective film against the stripping solution. In the case where the conductor 122A and/or the insulator 113A function(s) as a protective film, a method such as increasing the thickness of the conductor 122A and/or the insulator 113A, using a material with high resistance against the stripping solution for the conductor 122A and/or the insulator 113A, and the like can be given.

Another method for removing the resin layer 132_1 different from the above, a method of using a developing solution can be given as an example. Specifically, the entire top surface of the stack in FIG. 7A are exposed to light, and then, a developing solution is used in a development step to remove the resin layer 132_1. The stack may be cleaned with carbonated water to remove a residue of the resin layer 132_1 after the development step. The EL layer 141A has relatively high resistance against a developing solution and carbonated water; thus, this removing method sometimes eliminates the need for making the conductor 122A and/or the insulator 113A function(s) as a protecting layer. Furthermore, damage to the EL layer 141A can be reduced; thus, the lifetime of the light-emitting device 150 can be increased in some cases.

By removing the resin layer 132_1, the EL layer 141A, the conductor 122A, and the insulator 113A formed over a top of the resin layer 132_1 can be removed as described above. Accordingly, the EL layer 141a, the conductor 122a, and the insulator 113a can be formed on a bottom surface of the first opening portion of the insulator 112 (over the conductor 121a) and over part of the insulator 112.

[Step A8]

In Step A8, a resin layer 132_2 is applied on the top of the stack illustrated in FIG. 7B, that is, over the insulator 112, over the conductor 121b, over the conductor 121c, and over the insulator 113a. The resin layer 132_2 is preferably a photoresist, for example. Note that either a negative photoresist or a positive photoresist may be used as the photoresist. As the resin layer 132_2, either the same resin as the resin layer 132_1 or a resin different from the resin layer 132_1 may be used. Note that the resin layer 132_2 is described as a positive photoresist in this manufacturing method. After the resin layer 132_2 is applied, the resin layer 132_2 may be cured in accordance with cure conditions of the resin layer 132_2 (see FIG. 7C). For example, after the resin layer 132_2 is applied, a solvent contained in the resin layer 132_2 may be removed by performing baking treatment. Note that in the case of performing baking treatment, the temperature of the baking treatment is preferably a temperature at which the EL layer 141A, which is formed before, is not thermally damaged.

Note that like the resin layer 132_1, the resin layer 132_2 has a thickness of, for example, preferably greater than or equal to 0.5 lam, further preferably greater than or equal to 1 μm, still further preferably greater than or equal to 2 μm.

[Step A9]

Figure 7C:
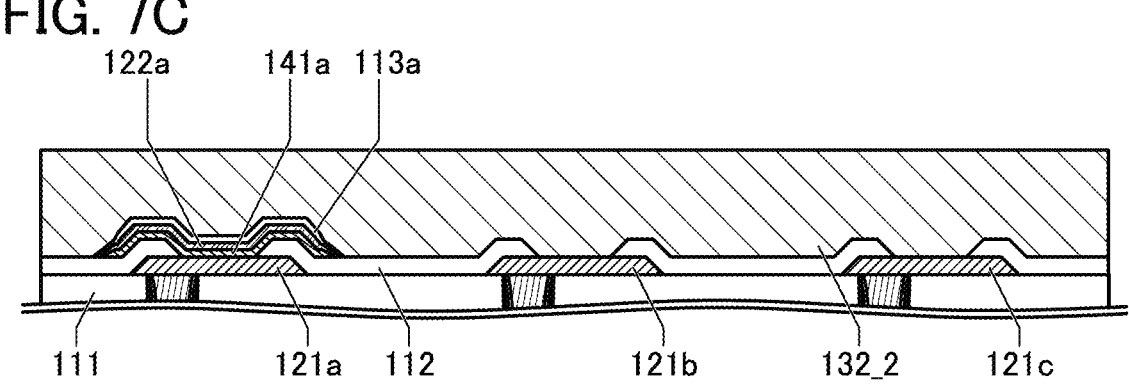

In Step A9, a light-exposure step and a development step are performed on the resin layer 132_2 illustrated in FIG. 7C as in Step A3. Therefore, the description of Step A3 is referred to for the description of Step A9.

Figure 7D:
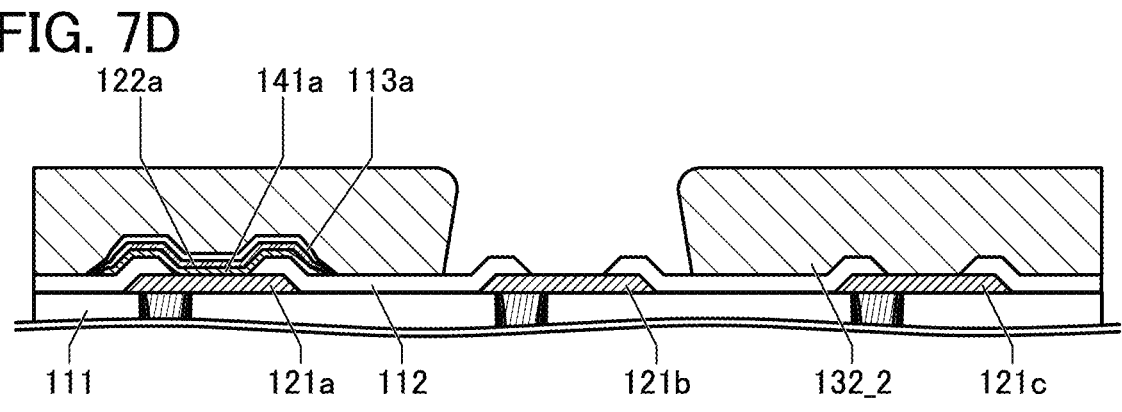

Accordingly, a side surface of an opening portion of the resin layer 132_2 can have an inversely tapered shape as in the resin layer 132_1 in FIG. 6C as illustrated in FIG. 7D.

In order to cure the resin layer 132_2 after the development step, the stack illustrated in FIG. 7D may be subjected to baking treatment. Note that in the case of performing baking treatment, the temperature of the baking treatment is preferably a temperature at which the EL layer 141a, which is formed before, is not thermally damaged.

[Step A10]

Figures 8A, 8B, 8C, 8D:
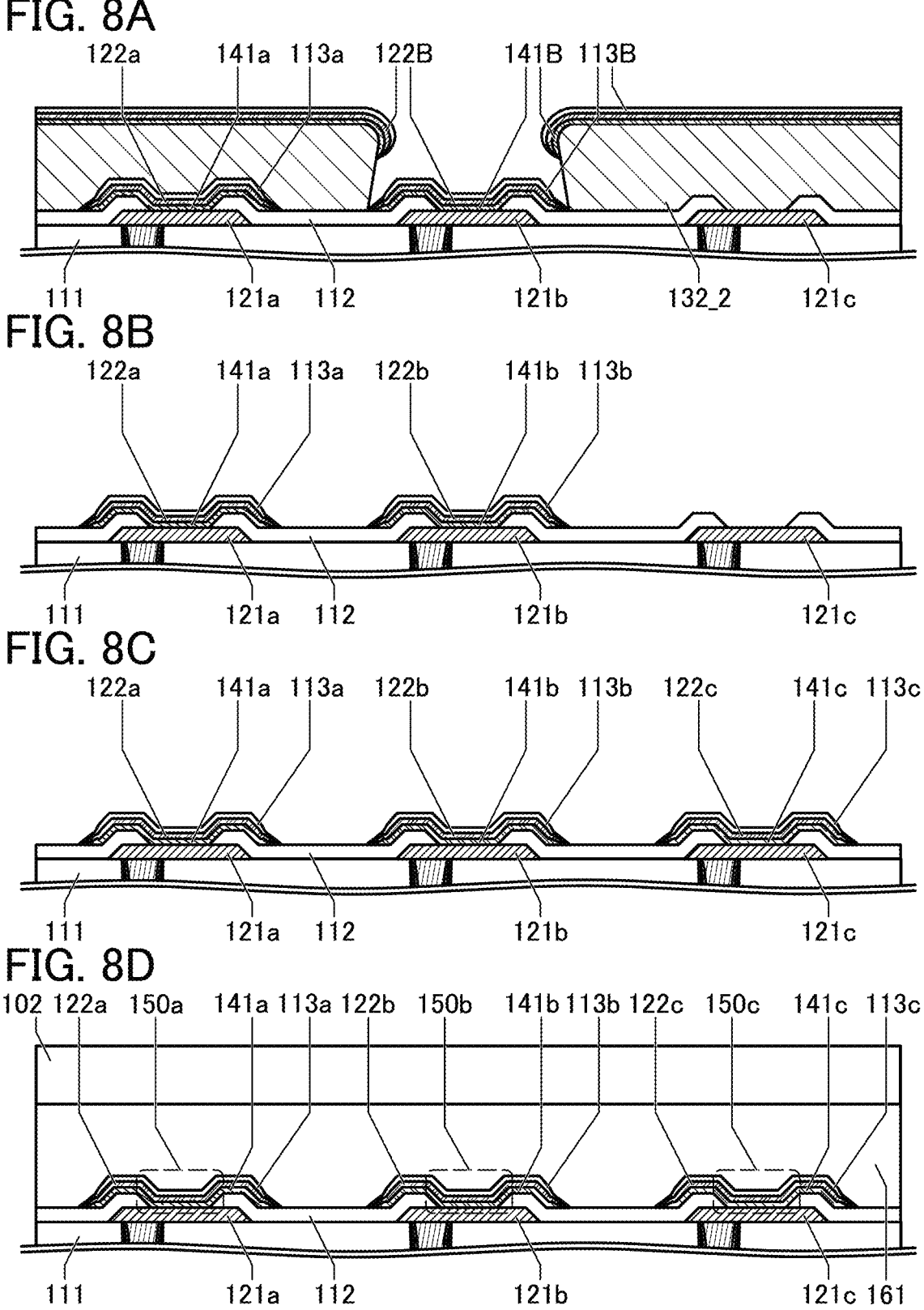
FIG. 8A to FIG. 8D are cross-sectional views illustrating an example of a method for manufacturing a display apparatus.

In Step A10, an EL layer 141B, a conductor 122B, and an insulator 113B are sequentially formed over the top of the stack illustrated in FIG. 7D, that is, over the conductor 121*b*, over the insulator 112, and over the resin layer 132_2 (see FIG. 8A).

At this time, the side surface of the opening portion of the resin layer 132_2 has an inversely tapered shape; thus, the EL layer 141B, the conductor 122B, and the insulator 113B are formed to be divided into a region over the conductor 121*b* and the insulator 112 and a region over the resin layer 132_2 as in Step A4 to Step A6.

Note that the EL layer 141B contains an organic compound. As the organic compound, a hole-injection layer, a hole-transport layer, a light-emitting layer, an electron-transport layer, an electron-injection layer, and the like can be provided as illustrated in FIG. 2A, for example.

Depending on circumstances, the EL layer 141B may include at least one of a hole-injection layer, a hole-transport layer, a light-emitting layer, an electron-transport layer, an electron-injection layer, and the like. A color exhibited by the light-emitting layer included in the EL layer 141B is preferably a color different from a color exhibited by the light-emitting layer included in the EL layer 141A.

Note that before the EL layer 141B is formed, heat treatment may be performed on the stack in FIG. 7D in a vacuum. Note that the condition of the heat treatment can be the same as that of the heat treatment described in Step A4.

For the conductor 122B, any of the materials usable for the conductor 122A can be used, for example. Thus, the conductor 122A and the conductor 122B provided in the display apparatus 100 may be formed using the same material or different materials.

For the insulator 113B, any of the materials usable for insulator 113A can be used, for example. Thus, the insulator 113A and the insulator 113B provided in the display apparatus 100 may be formed using the same material or different materials.

[Step A11]

In Step A11, the resin layer 132_2 is removed from the stack illustrated in FIG. 8A as in Step A7 (see FIG. 8B). Therefore, the description of Step A7 is referred to for the description of Step A11. Thus, by removing the resin layer 132_2, the EL layer 141B, the conductor 122B, and the insulator 113A formed over a top of the resin layer 132_2 can be removed. Accordingly, the EL layer 141*b*, the conductor 122*b*, and the insulator 113*b* can be formed over the conductor 121*b* and over part of the insulator 112.

[Step A12]

In Step A12, the EL layer 141*c*, the conductor 122*c*, and the insulator 113*c* are formed over the conductor 121*c* and over part of the insulator 112 by performing a manufacturing process similar to Step A2 to Step A7 or Step A8 to Step A11 (see FIG. 8C). Note that the EL layer 141*c* contains an organic compound, for example. As the organic compound, a hole-injection layer, a hole-transport layer, a light-emitting layer, an electron-transport layer, an electron-injection layer, and the like can be provided as illustrated in FIG. 2A, for example. Depending on circumstances, the EL layer 141*c* may include at least one of a hole-injection layer, a hole-transport layer, a light-emitting layer, an electron-transport layer, an electron-injection layer, and the like.

A color exhibited by the light-emitting layer included in the EL layer 141*c* is preferably a color different from colors exhibited by the light-emitting layers included in the EL layer 141A and the EL layer 141B.

Note that after formation of the EL layer 141*c*, heat treatment may be performed on the stack in FIG. 8C in a vacuum. Note that the condition of the heat treatment can be the same as that of the heat treatment described in Step A4.

For the conductor 122*c*, any of the materials usable for the conductor 122A or the conductor 122B can be used, for example. Thus, the conductor 122A, the conductor 122B, and the conductor 122*c* provided in the display apparatus 100 may be formed using the same material or different materials; alternatively, two of the above-described conductors may be formed using the same material.

For the insulator 113*c*, any of the materials usable for the insulator 113A or the insulator 113B can be used, for example. Thus, the insulator 113A, the insulator 113B, and the insulator 113*c* provided in the display apparatus 100 may be formed using the same material or different materials; alternatively, two of the above-described insulators may be formed using the same material.

[Step A13]

In Step A13, the resin layer 161 is applied on the top of the stack illustrated in FIG. 8C. Then, the substrate 102 is attached onto the resin layer 161 of the stack (see FIG. 8D).

For the resin layer 161, a resin having a light-transmitting property is preferably used, for example. In addition to the above light-transmitting property, an organic material such as a reactive curable adhesive, a photocurable adhesive, a thermosetting adhesive, or/and an anaerobic adhesive is/are preferable as the resin layer 161. Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the resin layer 161, for example.

As the substrate 102, a substrate having a light-transmitting property that can be used for the substrate 101 is used, for example. Using a substrate having a light-transmitting property as the substrate 102 enables extraction of light emitted from the light-emitting device 150*a*, the light-emitting device 150*b*, and the light-emitting device 150*c* to above the substrate 102.

The display apparatus and the method for manufacturing the display apparatus of one embodiment of the present invention are not limited to the display apparatus and the method described above. The structures of the display apparatus and the method for manufacturing the display apparatus of one embodiment of the present invention may be changed depending on circumstances.

Figure 9A:
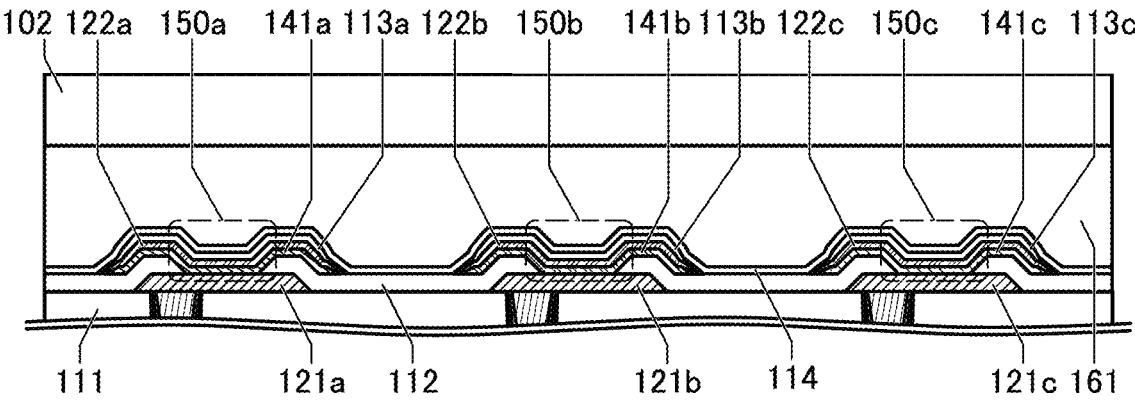
FIG. 9A to FIG. 9C are cross-sectional views illustrating an example of a method for manufacturing a display apparatus.

In the structure of the display apparatus 100, for example, a common insulator may be provided in each of the light-emitting device 150*a* to the light-emitting device 150*c* over the top of the stack illustrated in FIG. 8C from Step A12 up to Step A13. FIG. 9A illustrates a cross-sectional view of part of the display apparatus 100 in which an insulator 114, that is common to the light-emitting device 150*a* to the light-emitting device 150*c*, is provided between the insulator 112 and the insulator 113*a* to the insulator 113*c* and the resin layer 161, for example.

For the insulator 114, any of the materials usable for the insulator 113*a*, the insulator 113*b*, or the insulator 113*c* can be used, for example.

Figure 9B:
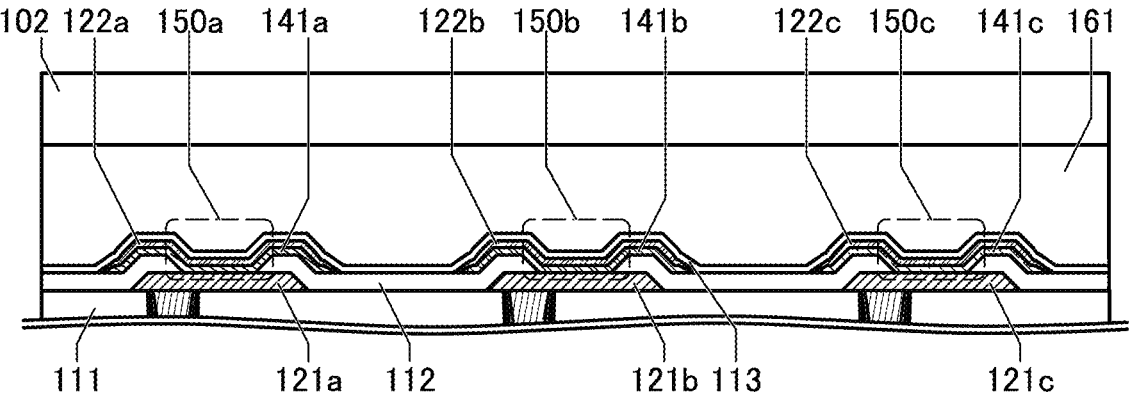

In the structure of the display apparatus 100, for example, a common insulator may be provided in each of the light-emitting device 150*a* to the light-emitting device 150*c* over the top of the stack illustrated in FIG. 8C from Step A12 up to Step A13. FIG. 9B illustrates a cross-sectional view of part of the display apparatus 100 in which the insulator 113, that is common to the light-emitting device 150*a* to the light-emitting device 150*c*, is provided over the conductor 122*a* to the conductor 122*c* and over the insulator 112, for example.

For the insulator 113, any of the materials usable for the insulator 113a, the insulator 113b, or the insulator 113c can be used, for example.

Figure 9C:
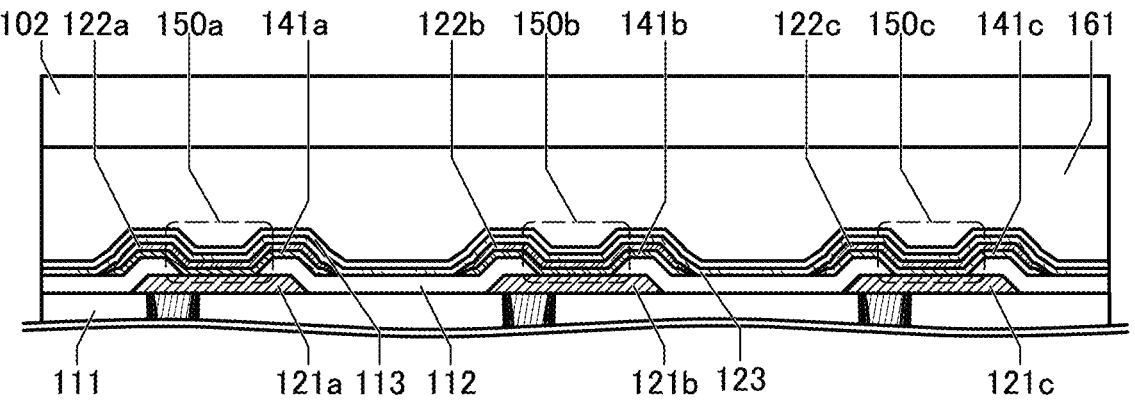

In the structure of the display apparatus 100, for example, a conductor functioning as an auxiliary electrode of the conductor 122a to the conductor 122c may be provided in FIG. 9B. Specifically, in the structure of the display apparatus 100, each of the insulator 113a to the insulator 113c is not formed in Step A1 to Step A12 and a conductor 123 functioning as an auxiliary electrode of the conductor 122a to the conductor 122c may be formed before forming the resin layer 161 in Step A13. Note that the insulator 113 may be formed over the conductor 123. FIG. 9C illustrates a cross-sectional view of part of the display apparatus 100 in which the conductor 123 is provided over the conductor 122a to the conductor 122c and over the insulator 112 and the insulator 113 is provided over the conductor 123, for example. Note that the conductor 123 can also be referred to as a common electrode of the light-emitting device 150a to the light-emitting device 150c.

Figure 10A:
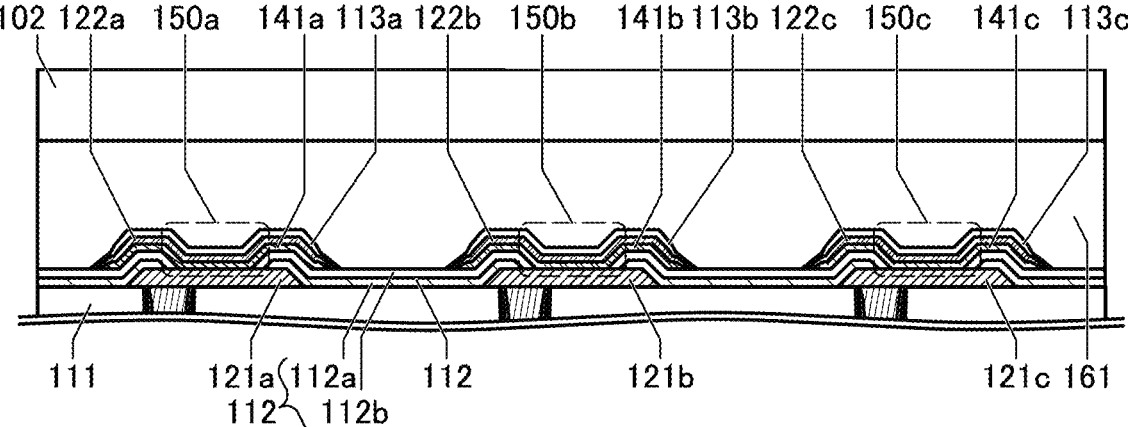
FIG. 10A to FIG. 10C are cross-sectional views illustrating a structure example of a display apparatus.

The conductor 123 is preferably formed with a light-transmitting and light-reflective material with high conductivity. For the conductor 123, any of the materials usable for the conductor 122a, the conductor 122b, or the conductor 122c can be used, for example. In the case of using an alloy of silver and magnesium for the conductor 122a to the conductor 122c, indium tin oxide may be used for the conductor 123. In the structure of the display apparatus 100, for example, the insulator 112 may have a multilayer structure that includes an insulator made of an organic material as the first layer and an insulator made of an inorganic material as the second layer, as described in Step A1. For example, FIG. 10A illustrates a cross-sectional view of part of the display apparatus 100 in which the insulator 112 has a multilayer structure including an insulator 112a that is an insulator made of an organic material and an insulator 112b that is an insulator made of an inorganic material.

Note that polyimide or the like can be used as the organic material, for example, and any of the materials usable for the insulator 112 included in the display apparatus 100 in FIG. 1, the insulator 112 illustrated in FIG. 8D, and the like can be used as the inorganic material.

Figure 10B:
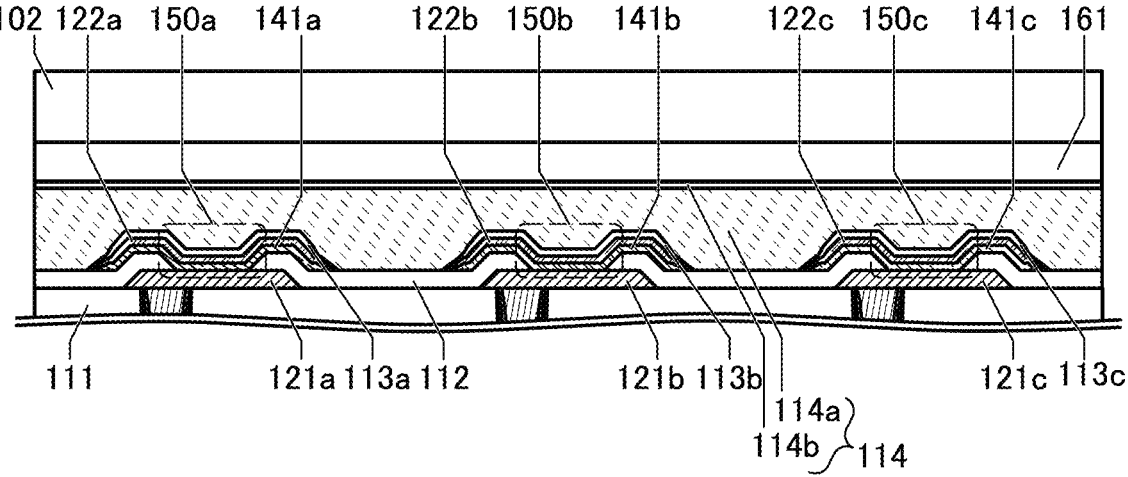

In the structure of display apparatus 100, for example, the insulator 114 may have a stacked-layer structure including two or more layers, instead of a single-layer structure in the display apparatus 100 in FIG. 9A. The insulator 114 may have a stacked-layer structure of two layers that includes an insulator made of an organic material as the first layer and an insulator made of an inorganic material as the second layer. FIG. 10B illustrates a cross-sectional view of part of the display apparatus 100 in which the insulator 114 has a multilayer structure including an insulator 114a that is an insulator made of an organic material and an insulator 114b that is an insulator made of an inorganic material. In the case where each of the insulator 113a to the insulator 113c is an insulator of an inorganic film, an insulating layer with three-layer structure including the insulator 113a to the insulator 113c each of which is an insulator made of an inorganic film, the insulator 114a which is an insulator made of an organic film, and the insulator 114b which is an insulator made of an inorganic film is formed over the light-emitting device 150a, over the light-emitting device 150b, and over the light-emitting device 150c in the display apparatus 100 illustrated in FIG. 10B.

Figure 10C:
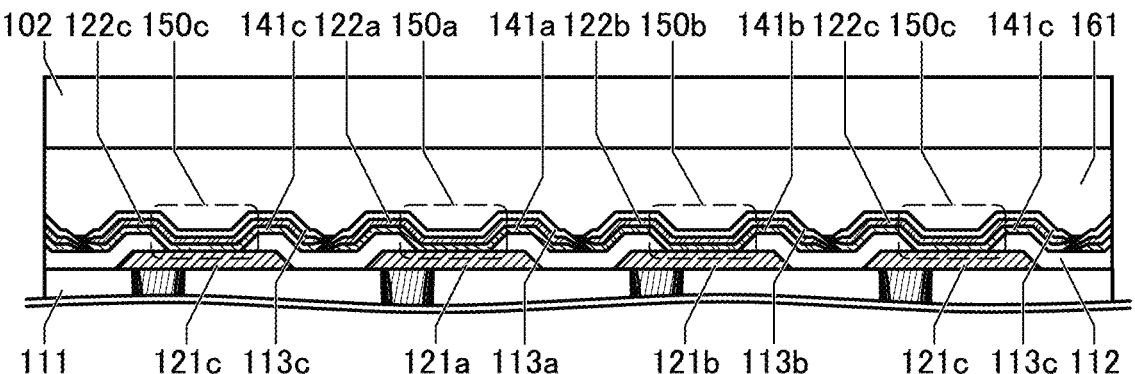

In the structure of display apparatus 100, for example, the end portion of the stack of the EL layer 141a, the conductor 122a, and the insulator 113a formed in Step A2 to Step A7 and the stack of EL layer 141b, the conductor 122b, and the insulator 113b formed in Step A8 to Step A11 may overlap with each other. Similarly, the end portion of the stack of the EL layer 141b, the conductor 122b, and the insulator 113b formed in Step A8 to Step A11 and the end portion of the stack of the EL layer 141c, the conductor 122c, and the insulator 113c formed in Step A12 may overlap with each other. Similarly, the end portion of the stack of the EL layer 141c, the conductor 122c, and the insulator 113c formed in Step A12, the end portion of the stack of the EL layer 141a, the conductor 122a, and the insulator 113a formed in Step A2 to Step A7, and the stack of the EL layer 141b, the conductor 122b, and the insulator 113b formed in Step A8 to Step A11 may overlap with one another. That is, the display apparatus 100 may have a structure in which the end portions of the stack included in the adjacent light-emitting devices 150 are provided to overlap with one another. FIG. 10C illustrates a cross-sectional view of part of the display apparatus 100 in which one of the end portions of the stack included in the light-emitting device 150b is provided above one of the end portions of the stack included in the light-emitting device 150a, one of the end portions of the stack included in the light-emitting device 150c is provided above the other of the end portions of the stack included in the light-emitting device 150a, and the other of the end portions of the stack included in the light-emitting device 150c is provided above the other of the end portions of the stack included in the light-emitting device 150b.

In the structure of display apparatus 100, for example, the EL layer 141a to the EL layer 141c may each have a microcavity structure. In the microcavity structure, for example, each of the conductor 122a to the conductor 122c as an upper electrode is formed using a light-transmitting and light-reflective conductive material, each of the conductor 121a to the conductor 121c as a lower electrode (a pixel electrode) is formed using a light-reflective conductive material, and the distance between a bottom surface of the light-emitting layer and a top surface of the lower electrode, i.e., the thickness of the layer 4430 in FIG. 2A, is set to the thickness corresponding to the wavelength of the color of light emitted by the light-emitting layer included in the EL layer 141.

For example, light that is reflected back by the lower electrode (reflected light) considerably interferes with light that directly enters the upper electrode from the light-emitting layer (incident light); therefore, the optical path length between the lower electrode and the light-emitting layer is preferably adjusted to $(2n-1)\lambda/4$ (n is a natural number of 1 or larger and $\lambda$ is a wavelength of light emission to be amplified). By adjusting the optical path length, the phases of each of the reflected light and the incident light of the wavelength $\lambda$ can be aligned with each other and the light emitted from the light-emitting layer can be further amplified. In the case where the reflected light and the incident light have a wavelength other than the wavelength $\lambda$, their phases are not aligned with each other, resulting in attenuation without resonation.

In the above structure, the EL layer may include a plurality of light-emitting layers or a single light-emitting layer. Furthermore, for example, the combination with the above-described tandem light-emitting device structure is possible; specifically, the above-described structure may be applied to a structure in which one light-emitting device includes a plurality of EL layers sandwiching a charge-generation layer and each EL layer includes one or more light-emitting layers.

With the microcavity structure, emission intensity with a specific wavelength in the front direction can be increased, whereby power consumption can be reduced. Particularly in the case of a device for XR such as VR and AR, light emitted from the light-emitting device in the front direction often enters the eyes of the user wearing the device; thus, a display apparatus of a device for XR suitably includes a microcavity structure. Note that in the case of a display apparatus which displays images with subpixels of four colors, red, yellow, green, and blue, the display apparatus can have favorable characteristics because a microcavity structure suitable for wavelengths of the corresponding color is employed in each subpixel, in addition to the effect of an improvement in luminance owing to yellow light emission.

Figure 11A:
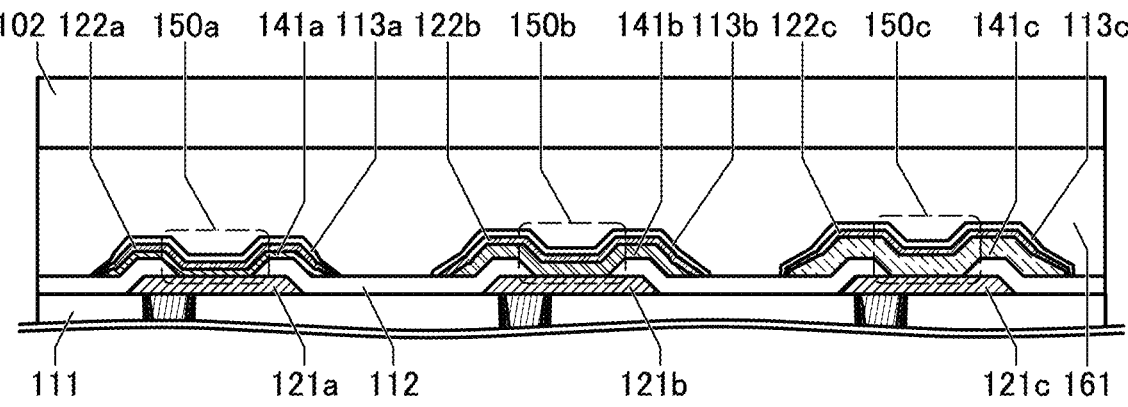
FIG. 11A to FIG. 11C are cross-sectional views illustrating a structure example of a display apparatus.
Figure 11B:
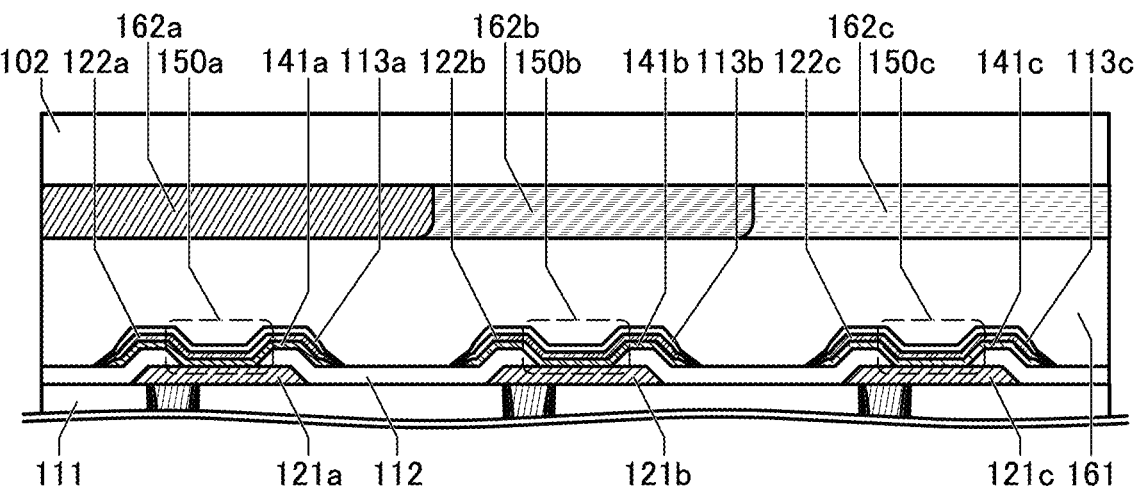

For example, FIG. 11A illustrates a cross-sectional view of part of the display apparatus 100 including a microcavity structure. In the case where the light-emitting device 150a includes a light-emitting layer exhibiting blue (B) light, the light-emitting device 150b includes a light-emitting layer exhibiting green (G) light, and the light-emitting device 150c includes a light-emitting layer exhibiting red (R) light, it is preferable that the order of the thickness from the smallest to the largest be the EL layer 141a, the EL layer 141b, and the EL layer 141c as illustrated in FIG. 11A. Specifically, the thicknesses of the layers 4430 included in the EL layer 141a, the EL layer 141b, and the EL layer 141c may be determined depending on the color of the light emitted by the corresponding light-emitting layer. In this case, the layer 4430 included in the EL layer 141a has the smallest thickness and the layer 4430 included in the EL layer 141c has the largest thickness. In the structure of display apparatus 100, for example, a coloring layer (color filter) or the like may be provided. For example, FIG. 11B illustrates a structure in which a coloring layer 162a, a coloring layer 162b, and a coloring layer 162c are provided between the resin layer 161 and the substrate 102. Note that the coloring layer 162a to the coloring layer 162c can be formed on the substrate 102, for example. In the case where the light-emitting device 150a includes a light-emitting layer exhibiting blue (B) light, the light-emitting device 150b includes a light-emitting layer exhibiting green (G) light, and the light-emitting device 150c includes a light-emitting layer exhibiting red (R) light, the coloring layer 162a is a blue coloring layer, the coloring layer 162b is a green coloring layer, and the coloring layer 162c is a red coloring layer. The display apparatus 100 illustrated in FIG. 11B can be formed in such a manner that the substrate 102 provided with the coloring layer 162a to the coloring layer 162c and the substrate 101 over which components up to the light-emitting device 150a to the light-emitting device 150c are formed are bonded to each other with the resin layer 161 therebetween. At this time, the bonding is preferably performed such that the light-emitting device 150a and the coloring layer 162a overlap with each other, the light-emitting device 150b and the coloring layer 162b overlap with each other, and the light-emitting device 150c and the coloring layer 162c overlap with each other. In the display apparatus 100 provided with the coloring layer 162a to the coloring layer 162c, for example, the light emitted by the light-emitting device 150b is extracted to above the substrate 102 not through the coloring layer 162a or the coloring layer 162c but through the coloring layer 162b. That is, light emitted from the light-emitting device 150 in an oblique direction (a direction at an elevation angle with a top surface of the substrate 102 used as a horizontal plane) can be blocked in the display apparatus 100; thus, the viewing angle dependence of the display apparatus 100 can be reduced, inhibiting the display quality of an image displayed by the display apparatus 100 from decreasing when the image is viewed from an oblique direction.

The coloring layer 162a to the coloring layer 162c formed on the substrate 102 may be covered with, for example, a resin which is also referred to as an overcoat layer. Specifically, the resin layer 161, the overcoat layer, the coloring layer 162a to the coloring layer 162c, and the substrate 102 may be stacked in this order in the display apparatus 100 (not illustrated). Note that examples of the resin usable for the overcoat layer include a thermosetting material having a light-transmitting property and based on an acrylic resin or epoxy resin.

Figure 11C:
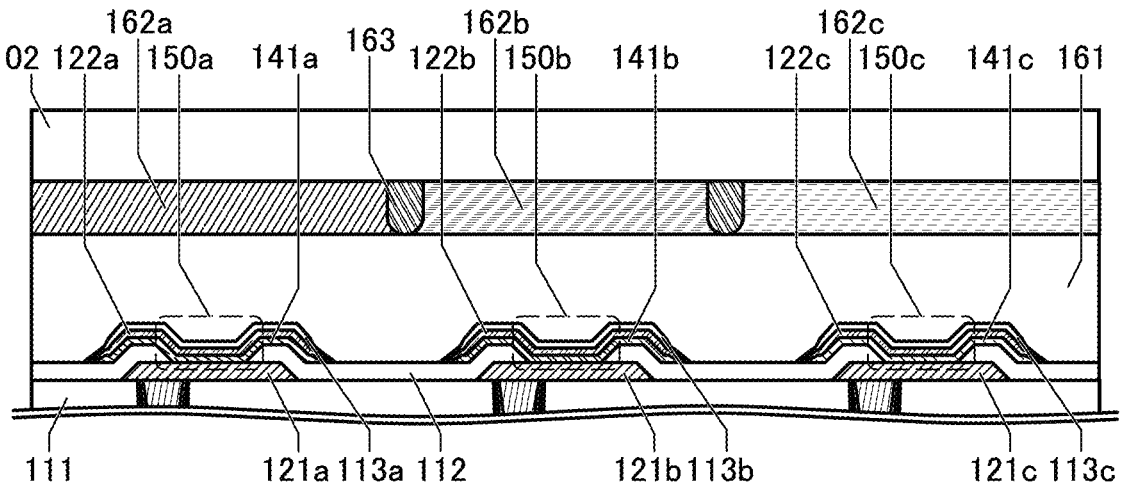

In the structure of display apparatus 100, for example, a black matrix may also be provided in addition to the coloring layers. FIG. 11C illustrates a structure example in which a black matrix 163 is provided in the display apparatus 100 in FIG. 11B. Providing the black matrix 163 can enhance blockage of the light emitted from the light-emitting device 150 of the display apparatus 100 in an oblique direction (a direction at an elevation angle with the top surface of the substrate 102 used as a horizontal plane), further inhibiting the display quality of an image displayed by the display apparatus 100 from decreasing when the image is viewed from an oblique direction.

In the case where the display apparatus includes coloring layers as illustrated in FIG. 11B and FIG. 11C, the light-emitting device 150a to the light-emitting device 150c of the display apparatus may each be a light-emitting device exhibiting white light (not illustrated). The structure of the light-emitting device can be a single structure or a tandem structure, for example.

Figure 12A:
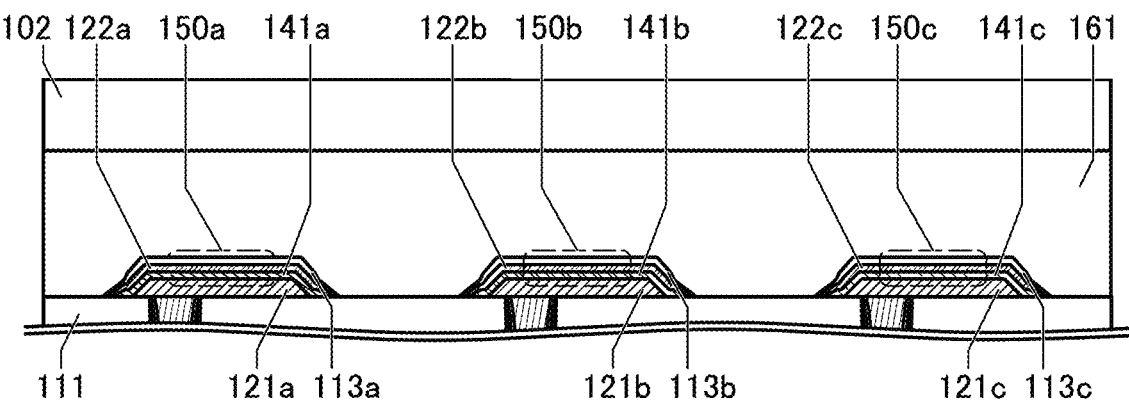
FIG. 12A and FIG. 12B are cross-sectional views illustrating a structure example of a display apparatus.
Figure 12B:
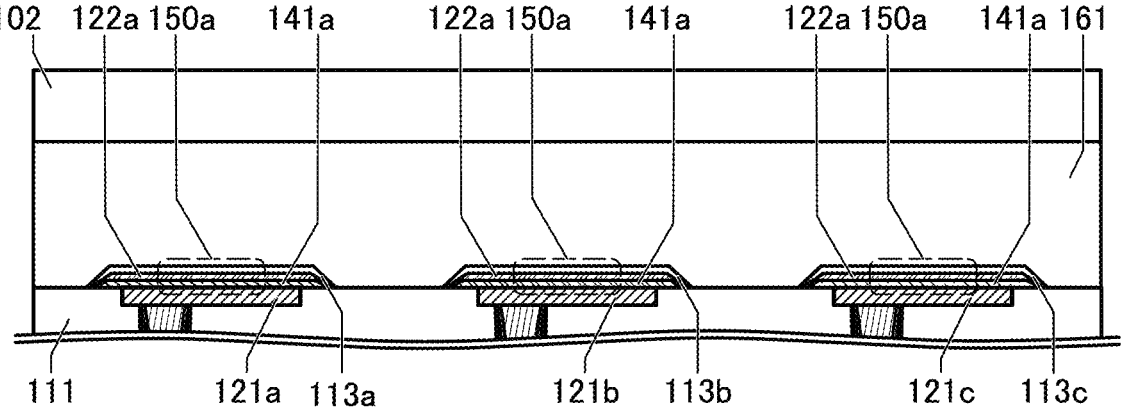

The display apparatus 100 may have a structure in which the insulator 112 formed over the conductor 121a to the conductor 121c is not provided, for example. FIG. 12A illustrates a structure example in which the display apparatus in FIG. 1, FIG. 8D, or the like does not include the insulator 112. Furthermore, the display apparatus 100 may have a structure in which the conductor 121a to the conductor 121c are embedded in the insulator 111, for example. FIG. 12B illustrates a structure example of the display apparatus in which the conductor 121a to the conductor 121c are embedded in the insulator 111. Note that this structure can be formed in such a manner that, for example, opening portions in which the conductor 121a to the conductor 121c are to be embedded are formed in the insulator 111, a conductive film to be the conductor 121a to the conductor 121c is formed, and then, chemical mechanical polishing (CMP) method is performed until the insulator 111 is exposed.

In the above-described structure of the display apparatus 100, the conductor 121a to the conductor 121c serve as the anodes and the conductor 122 serves as a cathode; however, the display apparatus 100 may have a structure in which the conductor 121a to the conductor 121c serve as cathodes and the conductor 122 serves as an anode. In other words, in the above-described manufacturing process, the stacking order of the hole-injection layer, hole-transport layer, light-emitting layer, electron-transport layer, and electron-injection layer that are included in the EL layer 141a to the EL layer 141c can be reversed.

Note that the insulators, the conductors, the semiconductors, and the like disclosed in this specification and the like can be formed by a PVD (Physical Vapor Deposition) method or a CVD method. Examples of a PVD method include a sputtering method, a resistance heating evaporation method, an electron beam evaporation method, and a PLD (Pulsed Laser Deposition) method. The formation by a plasma CVD method or a thermal CVD method can be given as a CVD method. In particular, examples of a thermal CVD method include a MOCVD (Metal Organic Chemical Vapor Deposition) method and an ALD method.

A thermal CVD method, which is a deposition method not using plasma, has an advantage that no defect due to plasma damage is generated.

Deposition by a thermal CVD method may be performed in such a manner that a source gas and an oxidizer are supplied into a chamber at a time, the pressure in the chamber is set to an atmospheric pressure or a reduced pressure, and they are made to react with each other in the vicinity of the substrate or over the substrate to be deposited over the substrate.

Deposition by an ALD method may be performed in such a manner that pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves); in order to avoid mixing of the plurality of kinds of source gases, an inert gas (argon, nitrogen, or the like) or the like is introduced at the same time as or after introduction of a first source gas and then a second source gas is introduced. Note that in the case where the first source gas and the inert gas are introduced at a time, the inert gas serves as a carrier gas, and the inert gas may also be introduced at the same time as the introduction of the second source gas. Alternatively, the second source gas may be introduced after the first source gas is exhausted by vacuum evacuation instead of the introduction of the inert gas. The first source gas is adsorbed on the surface of the substrate to deposit a first thin layer; then the second source gas is introduced to react with the first thin layer; as a result, a second thin layer is stacked over the first thin layer, so that a thin film is formed. The sequence of the gas introduction is controlled and repeated a plurality of times until a desired thickness is obtained, so that a thin film with excellent step coverage can be formed. The thickness of the thin film can be adjusted by the number of repetition times of the sequence of the gas introduction; therefore, an ALD method makes it possible to accurately adjust the thickness and is thus suitable for manufacturing a minute FET.

A variety of films such as the metal film, the semiconductor film, and the inorganic insulating film disclosed in the above-described embodiments can be formed by a thermal CVD method such as an MOCVD method and an ALD method; for example, in the case of forming an In—Ga—Zn—O film, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can also be used instead of trimethylgallium, and diethylzinc ($Zn(C_2H_5)_2$) can also be used instead of dimethylzinc.

For example, in the case where a hafnium oxide film is formed with a deposition apparatus using ALD method, two kinds of gases, ozone ($O_3$) as an oxidizer and a source gas which is obtained by vaporizing liquid containing a solvent and a hafnium precursor compound (hafnium alkoxide and hafnium amide such as tetrakis(dimethylamide)hafnium (TDMAH, $Hf[N(CH_3)_2]_4$)), are used. Examples of another material include tetrakis(ethylmethylamide)hafnium.

For example, in the case where an aluminum oxide film is formed with a deposition apparatus using an ALD method, two kinds of gases, $H_2O$ as an oxidizer and a source gas which is obtained by vaporizing liquid containing a solvent and an aluminum precursor compound (trimethylaluminum (TMA, $Al(CH_3)_3$) or the like) are used. Examples of another material include tris(dimethylamide)aluminum, triisobutyl-aluminum, and aluminum tris(2,2,6,6-tetramethyl-3,5-hep-tanedionate). For example, in the case where a silicon oxide film is formed with a deposition apparatus using an ALD method, hexachlorodisilane is adsorbed on a surface on which a film is to be formed, and radicals of an oxidizing gas ($O_2$ or dinitrogen monoxide) are supplied to react with the adsorbate. For example, in the case where a tungsten film is formed with a deposition apparatus using an ALD method, a $WF_6$ gas and a $B_2H_6$ gas are sequentially and repeatedly introduced to form an initial tungsten film, and then a $WF_6$ gas and an $H_2$ gas are sequentially and repeatedly introduced to form a tungsten film. Note that an $SiH_4$ gas may be used instead of a $B_2H_6$ gas. In the case where an In—Ga—Zn—O film is formed as an oxide semiconductor film with a deposition apparatus using an ALD method, a precursor (sometimes referred to as a metal precursor or the like) and an oxidizer (sometimes referred to as a reactant, a non-metal precursor, or the like) are sequentially and repetitively introduced. Specifically, for example, an $In(CH_3)_3$ gas as a precursor and an $O_3$ gas) as an oxidizer are introduced to form an In-0 layer; a $Ga(CH_3)_3$ gas as a precursor and an $O_3$ gas) as an oxidizer are introduced to form a GaO layer; and then, a $Zn(CH_3)_2$ gas as a precursor and an $O_3$ gas) as an oxidizer are introduced to form a ZnO layer. Note that the order of these layers is not limited to this example. A mixed oxide layer such as an In—Ga—O layer, an In—Zn—O layer, or a Ga—Zn—O layer may be formed with the use of these gases. Note that although an $H_2O$ gas which is obtained by bubbling water with an inert gas such as Ar may be used instead of an $O_3$ gas), it is preferable to use an $O_3$ gas) which does not contain H. Furthermore, instead of an $In(CH_3)_3$ gas, an $In(C_2H_5)_3$ gas may be used. Furthermore, instead of a $Ga(CH_3)_3$ gas, a $Ga(C_2H_5)_3$ gas may be used. Furthermore, a $Zn(CH_3)_2$ gas may be used.

<Manufacturing Method 2 of Display Apparatus>

Next, a method for manufacturing the display apparatus of one embodiment of the present invention, which is different from the method for manufacturing the display apparatus 100 illustrated in FIG. 6A to FIG. 8D, is described. Note that the display apparatus manufactured by this manufacturing method is also one embodiment of the present invention. FIG. 13A to FIG. 15E are cross-sectional views each illustrating an example of a method for manufacturing a display apparatus of one embodiment of the present invention. Note that in this embodiment, the manufacturing method is described as including Step B1 to Step B14, for example. In this manufacturing method, descriptions of the portions where the content overlaps with that of the above-described manufacturing method of display apparatus 100 illustrated in FIG. 6A to FIG. 8D are omitted.

[Step B1]

Figures 13A, 13B, 13C, 13D, 13E:
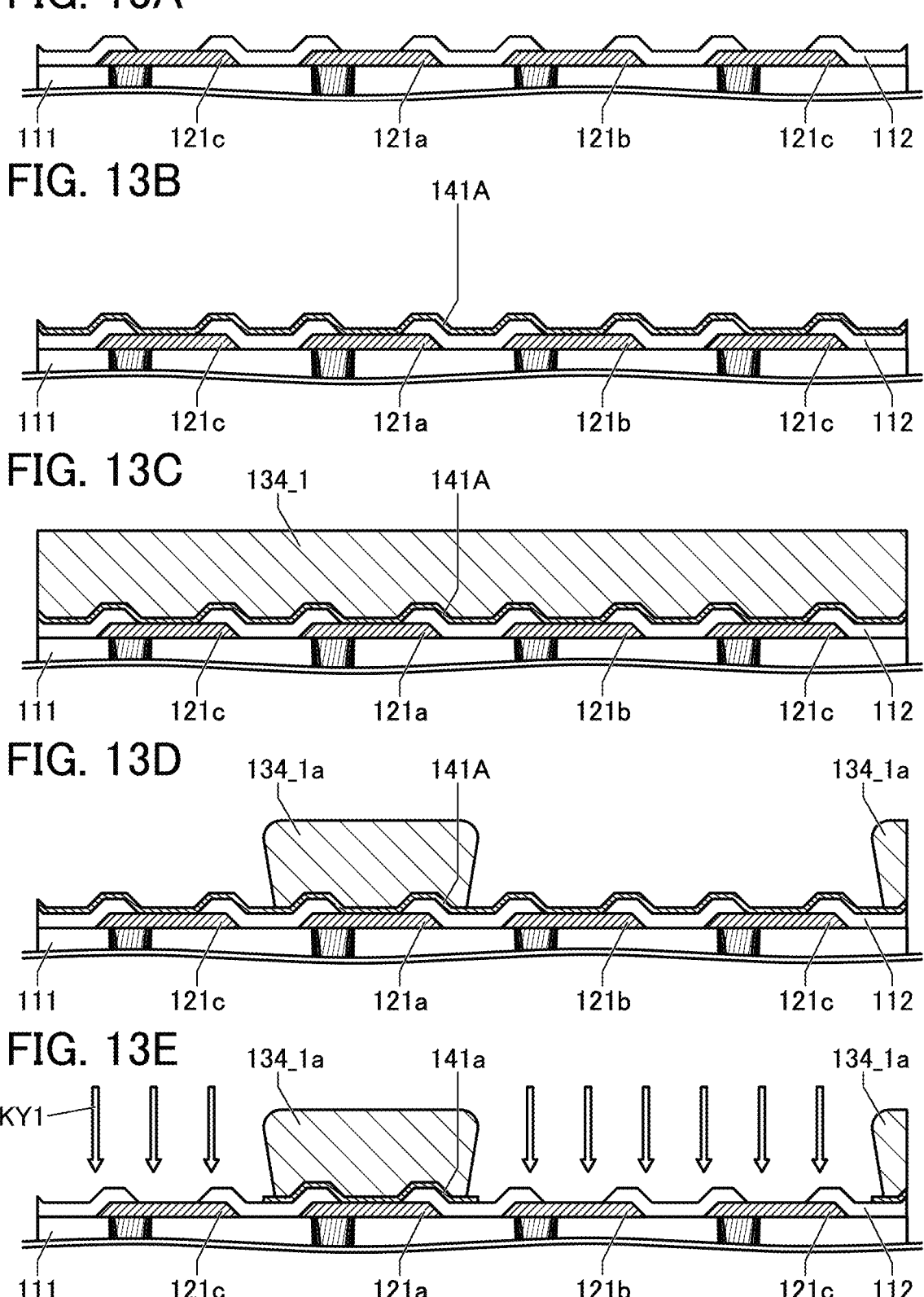
FIG. 13A to FIG. 13E are cross-sectional views illustrating an example of a method for manufacturing a display apparatus.

In Step B1, a stack in which the insulator 111, the conductor 121$a$ to the conductor 121$c$ provided over the insulator 111, and the insulator 112 provided over the insulator 111 and over the conductor 121$a$ to the conductor 121$c$ are formed is prepared as illustrated in FIG. 13A. In the insulator 112, third opening portions are provided in parts of regions overlapping with the conductor 121$a$ to the conductor 121$c$ to expose the conductor 121$a$ to the conductor 121$c$. Note that only some of the circuit elements of the display apparatus 100 are selectively illustrated in FIG. 13A to FIG. 15E. Specifically, each of FIG. 13A to FIG. 15E illustrates the insulator 111, the plug connected to the transistor 500, and insulators, conductors, the light-emitting device 150a to the light-emitting device 150c, and the like that are positioned above the insulator 111.

[Step B2]

In Step B2, an EL layer 141A is formed over a top of the stack illustrated in FIG. 13A, that is, over the insulator 112 and over the conductor 121a to the conductor 121c (see FIG. 13B).

[Step B3]

In Step B3, a resin 134_1 is applied on the top of the stack illustrated in FIG. 13B, that is, over the EL layer 141A. The resin 134_1 is preferably a photoresist, for example. Note that either a negative photoresist or a positive photoresist may be used as the photoresist. Note that the resin 134_1 is described as a positive photoresist in this manufacturing method. After the resin 134_1 is applied, the resin 134_1 may be cured in accordance with cure conditions of the resin 134_1 (see FIG. 13C). For example, after the resin 134_1 is applied, a solvent contained in the resin 134_1 may be removed by performing baking treatment. The temperature of the baking treatment is preferably a temperature at which the EL layer 141A, which is formed before, is not thermally damaged.

Note that the thickness of the resin 134_1 is preferably greater than or equal to 0.5 lam, further preferably greater than or equal to 1 µm, still further preferably greater than or equal to 2 lam, for example.

[Step B4]

In Step B4, a light-exposure step and a development step are performed on the resin 134_1 illustrated in FIG. 13C.

As described above, the resin 134_1 is a positive photoresist. In the light-exposure step, a range of the resin 134_1 exposed to light is, for example, a range not including a region of the resin 134_1 overlapping with the conductor 121a. In other words, a range of the resin 134_1 exposed to light is, for example, a range including a region of the resin 134_1 overlapping with the conductor 121b and the conductor 121c. Thus, an opening portion reaching the EL layer 141A can be formed in the region of the resin 134_1 overlapping with the conductor 121b and the conductor 121c in a later development step (see FIG. 13D). Note that the opening portion formed in Step B4 is referred to as a fourth opening portion in this embodiment. Furthermore, a resin 134_1a is formed in a region overlapping with the conductor 121a as illustrated in FIG. 13D by appropriately performing a light-exposure step and a development step, so that a side surface of an opening portion of the resin 134_1a can have an inversely tapered shape.

In order to cure the resin 134_1a after the development step, the stack illustrated in FIG. 13D may be subjected to baking treatment. Note that the temperature of the baking treatment is preferably a temperature at which the EL layer 141a, which is formed before, is not thermally damaged.

[Step B5]

In Step B5, a removal step JKY1 of the EL layer 141A positioned on a bottom surface of the fourth opening portion is performed on the stack illustrated in FIG. 13D (see FIG. 13E). By this step, the EL layer 141A overlapping with the conductor 121a selectively remains owing to the resin 134_1a serving as a mask. Thus, the EL layer 141a is formed in a region overlapping with the conductor 121a, the insulator 112, and the resin 134_1a.

As a method for removing the EL layer 141A, etching treatment can be given as an example. The EL layer 141A positioned on the bottom surface of the fourth opening portion can be effectively removed, in particular, by performing dry etching treatment included in types of etching treatment. Depending on circumstances, ashing treatment performed using an oxygen gas that is introduced and made into plasma may be performed.

[Step B6]

Figures 14A, 14B, 14C, 14D, 14E:
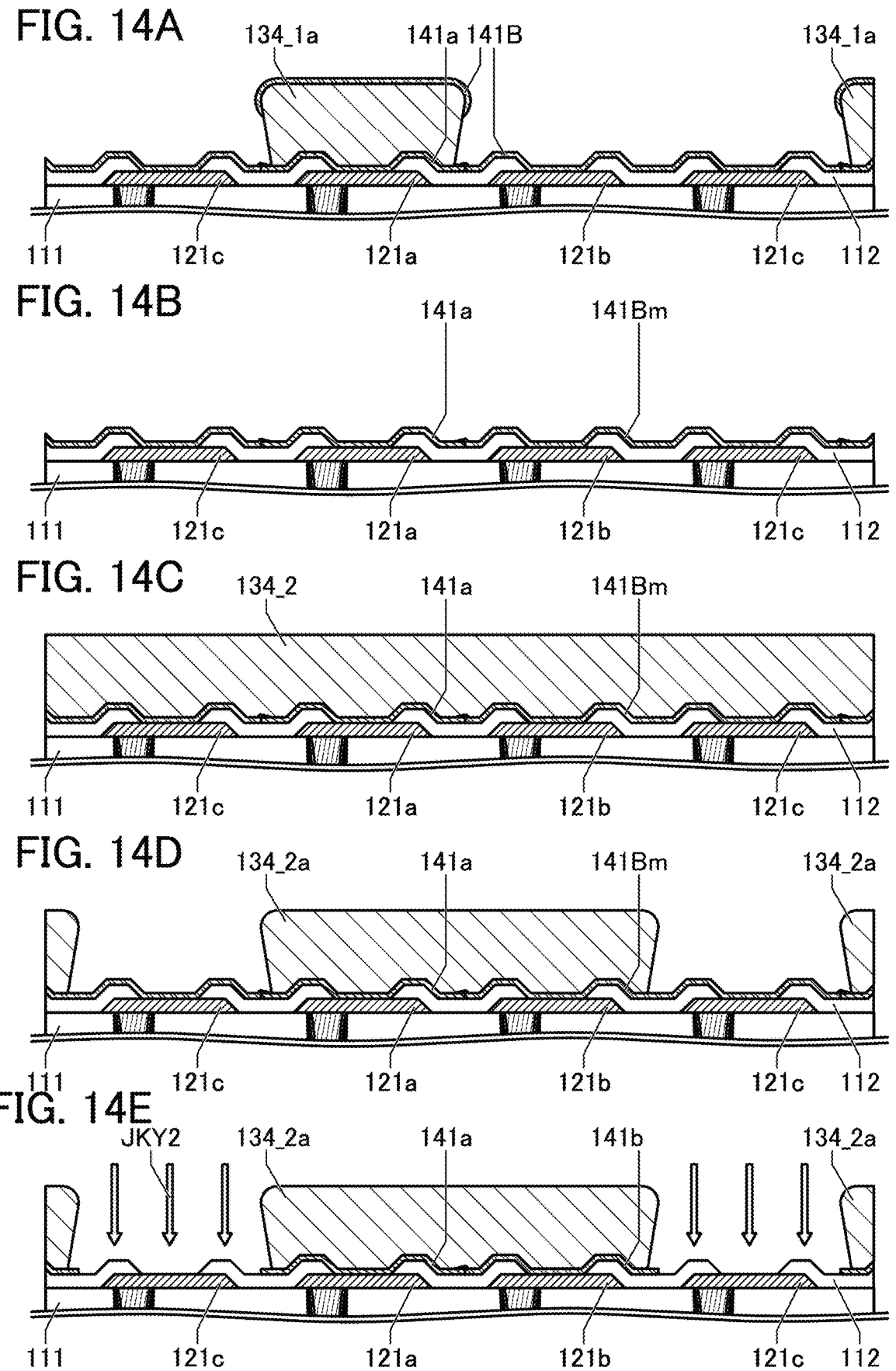
FIG. 14A to FIG. 14E are cross-sectional views illustrating an example of a method for manufacturing a display apparatus.

In Step B6, an EL layer 141B is formed over the top of the stack illustrated in FIG. 13E, that is, over the insulator 112, over the conductor 121b, over the conductor 121c, and over the resin 134_1a (see FIG. 14A). Note that the EL layer 141B may be formed in a region of a top of the EL layer 141A which is not in contact with the resin 134_1a at this time.

[Step B7] In Step B7, the resin 134_1a is removed from the stack illustrated in FIG. 14A (see FIG. 14B). By this step, the resin 134_1a and the EL layer 141B formed over a top of the resin 134_1a are removed, and the EL layer 141B formed on the bottom surface of the fourth opening portion selectively remains. Thus, an EL layer 141Bm is formed in part of a region of the insulator 112 and the region overlapping with the conductor 121b and the conductor 121c.

As a method for removing the resin 134_1a, a method of using a stripping solution can be given as an example. As the stripping solution, a material in which the EL layer 141a and the EL layer 141b are not dissolved is preferably used at this time. In this case, a material with high resistance against the stripping solution may be used for the EL layer 141a and the EL layer 141b.

Another method for removing the resin 134_1a that is different from the above, a method of using a developing solution can be given as an example. Specifically, the entire top surface of the stack in FIG. 14A are exposed to light, and then, a developing solution is used to remove the resin 134_1a in a development step. The stack may be cleaned with carbonated water to remove a residue of the resin 134_1a after the development step. Since the EL layer 141a and the EL layer 141b have relatively high resistance against a developing solution and carbonated water, damage to the EL layer 141a and the EL layer 141b can be reduced by this removing method, so that lifetime of the light-emitting device 150 can be increased in some cases.

[Step B8]

In Step B8, a resin 134_2 is applied on the top of the stack illustrated in FIG. 14B, that is, over the EL layer 141a and over the EL layer 141Bm. For the resin 134_2, any of the materials usable for the resin 134_1 used in Step B3 can be used, for example. For example, the same material as the resin 134_1 may be used for the resin 134_2. Note that the resin 134_2 is described as a positive photoresist in this manufacturing method. After the resin layer 132_2 is applied, the resin layer 132_2 may be cured in accordance with cure conditions of the resin layer 132_2 (see FIG. 14C). For example, after the resin 134_2 is applied, a solvent contained in the resin 134_2 may be removed by performing baking treatment. Note that in the case of performing baking treatment, the temperature of the baking treatment is preferably a temperature at which the EL layer 141a and the EL layer 141Bm, which are formed before, are not thermally damaged.

Note that the thickness of the resin 134_2 is preferably greater than or equal to 0.5 lam, further preferably greater than or equal to 1 µm, still further preferably greater than or equal to 2 µm, for example.

[Step B9]

In Step B9, a light-exposure step and a development step are performed on the resin 1342 illustrated in FIG. 14C.

As described above, the resin 134_2 is a positive photoresist. In the light-exposure step, a range of the resin 134_2 exposed to light is, for example, a range not including a region of the resin 134_2 overlapping with the conductor 121a and the conductor 121b. In other words, a range of the resin 134_2 exposed to light is, for example, a range including a region of the resin 134_2 overlapping with the conductor 121c. Thus, an opening portion reaching the EL layer 141Bm can be formed in the region of the resin 134_2 overlapping with the conductor 121c in a later development step (see FIG. 14D). Note that the opening portion formed in Step B9 is referred to as a fifth opening portion in this embodiment. Furthermore, a resin 134_2a is formed in a region overlapping with the conductor 121c as illustrated in FIG. 14D by appropriately performing a light-exposure step and a development step, so that a side surface of an opening portion of the resin 134_2a can have an inversely tapered shape.

In order to cure the resin 134_2a after the development step, the stack illustrated in FIG. 14D may be subjected to baking treatment. Note that the temperature of the baking treatment is preferably a temperature at which the EL layer 141a and the EL layer 141Bm, which are formed before, are not thermally damaged.

[Step B10] In Step B10, a removal step JKY2 of the EL layer 141Bm positioned on a bottom surface of the fifth opening portion is performed on the stack illustrated in FIG. 14D (see FIG. 14E). By this step, the EL layer 141Bm overlapping with the conductor 121b selectively remains owing to the resin 134_1a serving as a mask. Thus, the EL layer 141b is formed in a region overlapping with the conductor 121b, the insulator 112, and the resin 1342a.

As a method for removing the EL layer 141Bm, for example, a method usable for the removal step JKY1 can be used. For example, the removal step JKY2 may use the same method as the removal step JKY1.

[Step B11]

Figures 15A, 15B, 15C, 15D, 15E:
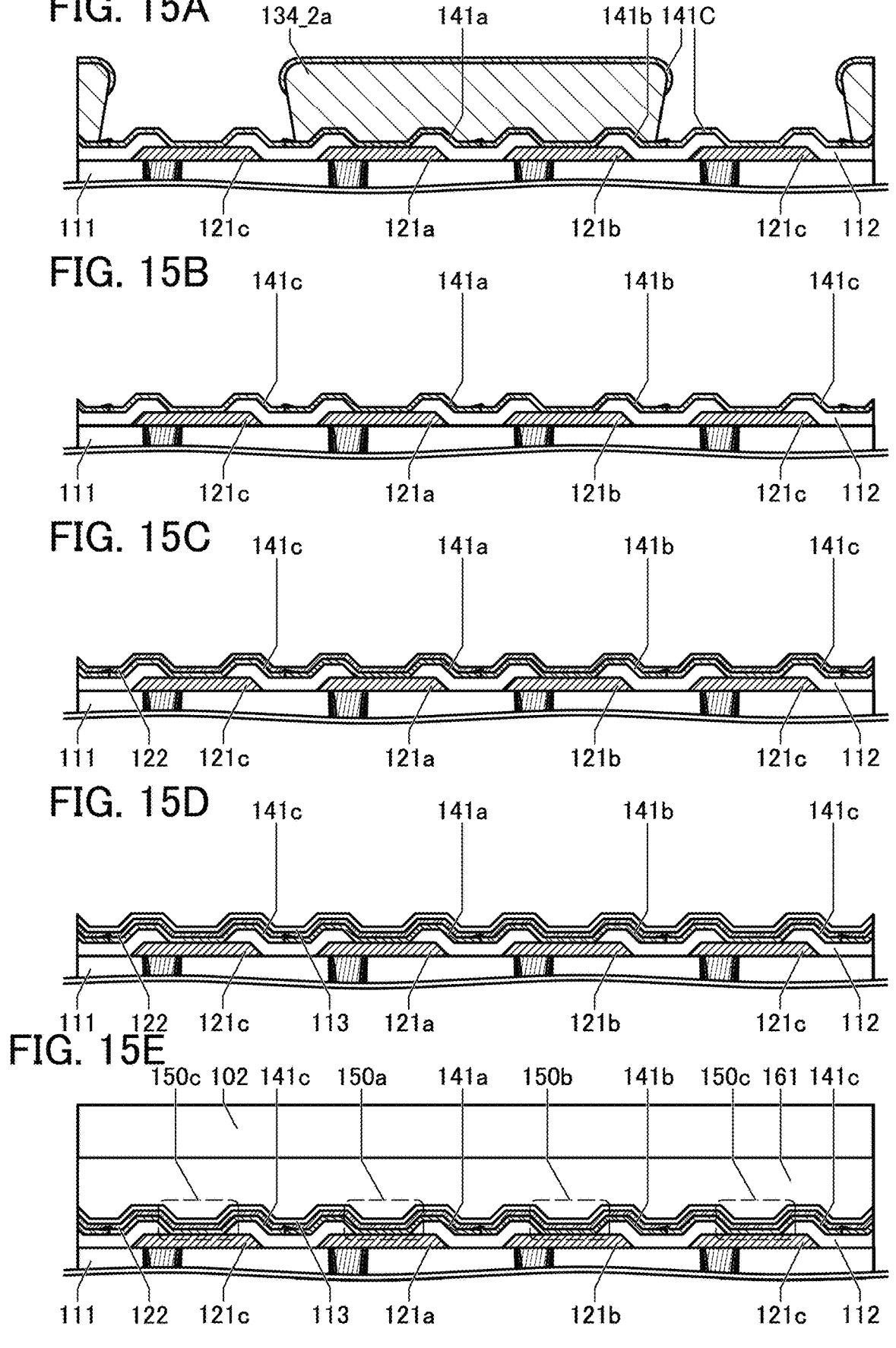
FIG. 15A to FIG. 15E are cross-sectional views illustrating an example of a method for manufacturing a display apparatus.

In Step B11, an EL layer 141C is formed over the top of the stack illustrated in FIG. 14E, that is, over the insulator 112, over the conductor 121c, and over the resin 134_2a (see FIG. 15A). Note that the EL layer 141C is formed in a region of a top of the EL layer 141a which is not in contact with the resin 134_2a in some cases. Similarly, the EL layer 141C is formed in a region of a top of the EL layer 141b which is not in contact with the resin 134_2a in some cases.

[Step B12]

In Step B12, the resin 134_2a is removed from the stack illustrated in FIG. 15A (see FIG. 15B). By this step, the resin 134_2a and the EL layer 141C formed over a top of the resin 134_2a are removed, and the EL layer 141C formed on the bottom surface of the fifth opening portion selectively remains. Thus, the EL layer 141c is formed in part of the region of the insulator 112 and the region overlapping with the conductor 121c.

As a method for removing the resin 134_2a, the description of the method for removing the resin 134_1a described in Step B7 can be referred to.

[Step B13]

In Step B13, the conductor 122 is formed over the top of the stack illustrated in FIG. 15B, that is, over the EL layer 141a, over the EL layer 141b, and over the EL layer 141c (see FIG. 15C).

The conductor 122 functions as, for example, an upper electrode of the light-emitting device 150a, the light-emitting device 150b, and the light-emitting device 150c, which are described later, included in the display apparatus 100. The conductor 122 preferably contains a conductive material having a light-transmitting property so that light from the light-emitting device 150a, the light-emitting device 150b, and the light-emitting device 150c can be extracted to above the display apparatus 100. For the conductor 122, any of the above materials usable for the conductor 122a to the conductor 122c can be used, for example.

[Step B14]

In Step B14, the insulator 113 is formed over the top of the stack illustrated in FIG. 15C, that is, over the conductor 122 (see FIG. 15D). The insulator 113 functions as, for example, a passivation film (referred to as a protective layer in some cases) protecting the light-emitting device 150a, the light-emitting device 150b, and the light-emitting device 150c, which are described later, included in the display apparatus 100. For the insulator 113, any of the above materials usable for the insulator 113a to the insulator 113c can be used, for example.

[Step B15]

In Step B15, the resin layer 161 is applied on the top of the stack illustrated in FIG. 15D as in Step A13. Then, the substrate 102 is attached onto the resin layer 161 of the stack (see FIG. 15E).

For the resin layer 161, any of the materials usable for resin layer 161 used in Step A13 can be used, for example.

As the substrate 102, a substrate usable for the substrate 102 used in Step A13 can be used, for example.

As described above, the display apparatus of one embodiment of the present invention including the light-emitting device 150a to the light-emitting device 150c can be manufactured by performing a manufacturing method of Step B1 to Step B15.

Note that the display apparatus of one embodiment of the present invention and the method for manufacturing the display apparatus are not limited to the above-described structure. For example, the display apparatus of one embodiment of the present invention may have a structure in which the display apparatus manufactured in Step B1 to Step B15 and the structure of the display apparatus illustrated in FIG. 9A to FIG. 12B and the like are combined. For example, the method for manufacturing the display apparatus of one embodiment of the present invention may be a manufacturing method in which the manufacturing method of Step B1 to Step B15 and the step for constituting the display apparatus in FIG. 9A to FIG. 12B and the like are combined. In the manufacturing method described in this embodiment, an organic EL material contained in the display apparatus can be formed by patterning using a photolithography method. Therefore, a pitch width between pixels (subpixels) in the display apparatus can be narrowed. Accordingly, many pixels can be provided within a fixed size in the display apparatus, and the definition of the display apparatus can be increased. Specifically, the display apparatus having a resolution preferably higher than or equal to 1000 ppi, further preferably higher than or equal to 3000 ppi, still further preferably higher than or equal to 5000 ppi can be obtained by the above-described manufacturing method, for example. By narrowing a pitch width, a display apparatus with a higher aperture ratio than the case of using a shadow mask such as a metal mask can be obtained, for example.

Since the display apparatus manufactured by the above-described manufacturing method has a structure in which the light-emitting layers of the adjacent light-emitting devices are not in contact with each other, unintentional light emission (also referred to as crosstalk) can be suitably prevented from being caused by a current flowing through the two adjacent EL layers 141. As a result, the contrast can be increased to achieve a display apparatus with high display quality.

Since the display apparatus manufactured by the above-described manufacturing method has an SBS structure, power consumed by the operation of the display apparatus can be made low.

In the display apparatus of one embodiment of the present invention and the method for manufacturing the display apparatus, the aspect ratio of a display portion of the display apparatus is not particularly limited. For example, the display apparatus is compatible with a variety of screen ratios such as 1:1 (a square), 4:3, 16:9, and 16:10.

The shape of the display apparatus of one embodiment of the present invention is not particularly limited. The display apparatus can have any of various shapes such as a rectangular shape, a polygonal shape (e.g., octagon), a circular shape, and an elliptical shape.

Note that this embodiment can be combined with any of the other embodiments described in this specification as appropriate.

Embodiment 2

In this embodiment, an OS transistor that can be provided in the display apparatus described in the above embodiment is described.

Figures 16A, 16B:
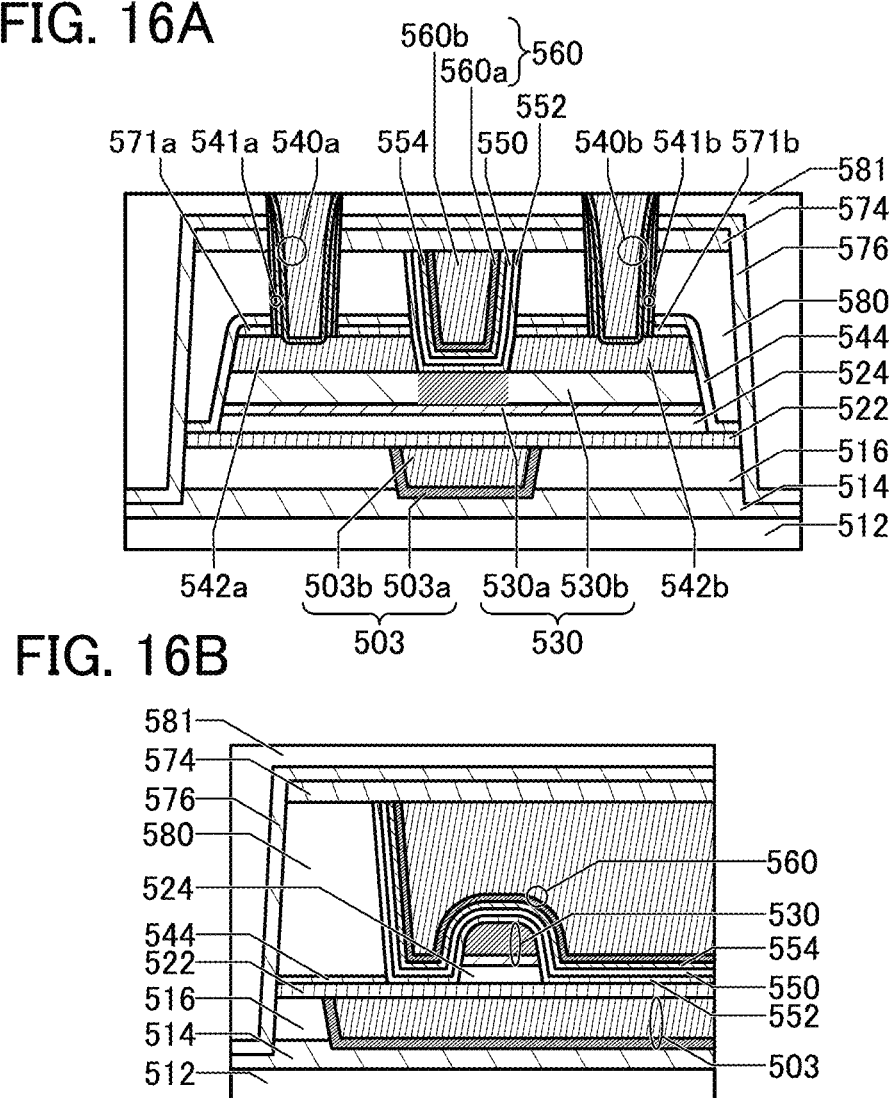
FIG. 16A and FIG. 16B are schematic cross-sectional views illustrating a structure example of a transistor.

FIG. 16A and FIG. 16B illustrate a structure example of the OS transistor that can be provided in the display apparatus of the above embodiment. Note that FIG. 16A is a cross-sectional view of the OS transistor in the channel length direction, and FIG. 16B is a cross-sectional view of the OS transistor in the channel width direction.

The transistor 500 that is an OS transistor is provided over the insulator 512, for example. A substance having a barrier property against oxygen or hydrogen is preferably used for the insulator 512.

The insulator 512 is formed using, for example, silicon oxide, silicon oxynitride, silicon nitride oxide, silicon nitride, aluminum oxide, aluminum oxynitride, aluminum nitride oxide, or aluminum nitride.

The insulator 512 may have a function of a planarization film which eliminates a level difference caused by a circuit element, a wiring, or the like provided below the insulator 512. For example, the top surface of the insulator 512 may be planarized by planarization treatment using a chemical mechanical polishing (CMP) method or the like to improve planarity.

As illustrated in FIG. 16A and FIG. 16B, an insulator 514 and an insulator 516 are formed over the insulator 512.

As the insulator 514, it is preferable to use a film having a barrier property that prevents diffusion of hydrogen or impurities from the substrate 101, a region where the circuit element or the like below the insulator 512 is provided, or the like into a region where the transistor 500 is provided. Thus, silicon nitride deposited by a CVD method can be used for the insulator 514, for example.

For the film having a barrier property against hydrogen, silicon nitride deposited by a CVD method can be used, for example. Diffusion of hydrogen into a circuit element provided above the insulator 514, that is, into the transistor 500, which is the OS transistor, degrades the characteristics of the OS transistor in some cases. Thus, a film that inhibits hydrogen diffusion is preferably used between the OS transistor and the substrate 101 or the circuit element formed above the substrate 101. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 514 that is converted into hydrogen atoms per area of the insulator 514 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

For the insulator 516, a material similar to that for the insulator 512 can be used, for example.

As illustrated in FIG. 16A and FIG. 16B, the transistor 500 includes the insulator 516 over the insulator 514, a conductor 503 (a conductor 503a and a conductor 503b) provided to be embedded in the insulator 514 or the insulator 516, an insulator 522 over the insulator 516 and the conductor 503, an insulator 524 over the insulator 522, an oxide 530a over the insulator 524, an oxide 530b over the oxide 530a, a conductor 542a over the oxide 530b, an insulator 571a over the conductor 542a, a conductor 542b over the oxide 530b, an insulator 571b over the conductor 542b, an insulator 552 over the oxide 530b, an insulator 550 over the insulator 552, an insulator 554 over the insulator 550, a conductor 560 (a conductor 560a and a conductor 560b) that is over the insulator 554 and overlaps with part of the oxide 530b, and an insulator 544 provided over the insulator 522, the insulator 524, the oxide 530a, the oxide 530b, the conductor 542a, the conductor 542b, the insulator 571a, and the insulator 571b. Here, as illustrated in FIG. 16A and FIG. 16B, the insulator 552 is in contact with the top surface of the insulator 522, the side surface of the insulator 524, the side surface of the oxide 530a, the side surface and the top surface of the oxide 530b, the side surface of the conductor 542 (the conductor 542a and the conductor 542b), the side surface of the insulator 571 (the insulator 571a and the insulator 571b), the side surface of the insulator 544, the side surface of an insulator 580, and the bottom surface of the insulator 550. The top surface of the conductor 560 is placed to be substantially level with the upper portion of the insulator 554, the upper portion of the insulator 550, the upper portion of the insulator 552, and the top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening reaching the oxide 530b is provided in the insulator 580 and the insulator 544. The insulator 552, the insulator 550, the insulator 554, and the conductor 560 are provided in the opening. The conductor 560, the insulator 552, the insulator 550, and the insulator 554 are provided between the conductor 542a and the conductor 542b and between the insulator 571a and the insulator 571b in the channel length direction of the transistor 500. The insulator 554 includes a region in contact with the side surface of the conductor 560 and a region in contact with the bottom surface of the conductor 560.

The oxide 530 preferably includes the oxide 530a provided over the insulator 524 and the oxide 530b provided over the oxide 530a. Including the oxide 530a under the oxide 530b makes it possible to inhibit diffusion of impurities into the oxide 530b from components formed below the oxide 530a.

Although a structure in which two layers, the oxide 530a and the oxide 530b, are stacked as the oxide 530 in the transistor 500 is described, the present invention is not limited thereto. For example, the transistor 500 can include a single-layer structure of the oxide 530b or a stacked-layer structure of three or more layers. Alternatively, the oxide 530a and the oxide 530b can each have a stacked-layer structure.

The conductor 560 functions as a first gate (also referred to as a top gate) electrode, and the conductor 503 functions as a second gate (also referred to as a back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542a functions as one of a source and a drain, and the conductor 542b functions as the other of the source and the drain. At least part of a region of the oxide 530 that overlaps with the conductor 560 functions as a channel formation region.

Figure 17A:
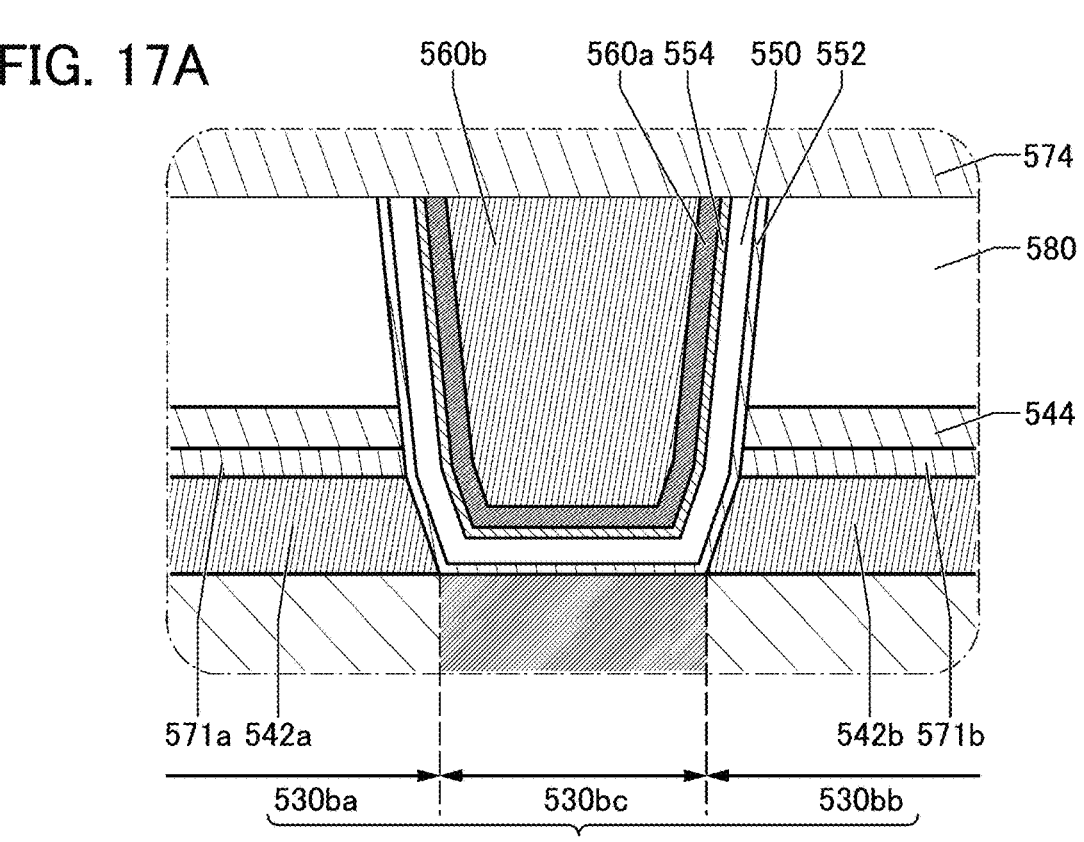
FIG. 17A and FIG. 17B are schematic cross-sectional views illustrating structure examples of a transistor.

Here, FIG. 17A is an enlarged view of the vicinity of the channel formation region in FIG. 16A. Supply of oxygen to the oxide 530b forms the channel formation region in a region between the conductor 542a and the conductor 542b. As illustrated in FIG. 17A, the oxide 530b includes a region 530bc functioning as the channel formation region of the transistor 500 and a region 530ba and a region 530bb that are provided to sandwich the region 530bc and function as a source region and a drain region. At least part of the region 530bc overlaps with the conductor 560. In other words, the region 530bc is provided between the conductor 542a and the conductor 542b. The region 530ba is provided to overlap with the conductor 542a, and the region 530bb is provided to overlap with the conductor 542b.

The region 530bc functioning as the channel formation region has a smaller amount of oxygen vacancies (an oxygen vacancy in a metal oxide is sometimes referred to as $V_O$ in this specification and the like) or a lower impurity concentration than the region 530ba and the region 530bb to be a high-resistance region having a low carrier concentration. Thus, the region 530bc can be regarded as being i-type (intrinsic) or substantially i-type.

A transistor using a metal oxide is likely to change its electrical characteristics when impurities or oxygen vacancies ($V_O$) exist in a region of the metal oxide where a channel is formed, which might degrade the reliability. In some cases, hydrogen in the vicinity of an oxygen vacancy ($V_O$) forms a defect that is an oxygen vacancy ($V_O$) into which hydrogen enters (hereinafter, sometimes referred to as $V_O H$), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and $V_O H$ are preferably reduced as much as possible in the region of the oxide semiconductor where a channel is formed.

The region 530ba and the region 530bb functioning as the source region and the drain region are each a low-resistance region with an increased carrier concentration because they include a large amount of oxygen vacancies ($V_O$) or have a high concentration of an impurity such as hydrogen, nitrogen, or a metal element. In other words, the region 530ba and the region 530bb are each an n-type region having a higher carrier concentration and a lower resistance than the region 530bc.

The carrier concentration in the region 530bc functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 530bc functioning as the channel formation region is not particularly limited and can be, for example, $1 \times 10^{-9}$ cm$^{-3}$.

Between the region 530bc and the region 530ba or the region 530bb, a region having a carrier concentration that is lower than or substantially equal to the carrier concentrations in the region 530ba and the region 530bb and higher than or substantially equal to the carrier concentration in the region 530bc may be formed. That is, the region functions as a junction region between the region 530bc and the region 530ba or the region 530bb. The hydrogen concentration in the junction region is lower than or substantially equal to the hydrogen concentrations in the region 530ba and the region 530bb and higher than or substantially equal to the hydrogen concentration in the region 530bc in some cases. The amount of oxygen vacancies in the junction region is smaller than or substantially equal to the amounts of oxygen vacancies in the region 530ba and the region 530bb and larger than or substantially equal to the amount of oxygen vacancies in the region 530bc in some cases.

Although FIG. 17A illustrates an example in which the region 530ba, the region 530bb, and the region 530bc are formed in the oxide 530b, the present invention is not limited thereto. For example, the above regions may be formed not only in the oxide 530b but also in the oxide 530a.

In the oxide 530, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 500, a metal oxide functioning as a semiconductor (such a metal oxide is hereinafter also referred to as an oxide semiconductor) is preferably used for the oxide 530 (the oxide 530a and the oxide 530b) including the channel formation region. The metal oxide functioning as a semiconductor preferably has a band gap of 2 eV or more, further preferably 2.5 eV or more. With the use of a metal oxide having such a wide band gap, the off-state current of the transistor can be reduced.

As the oxide 530, it is preferable to use, for example, a metal oxide such as an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

Here, the atomic ratio of In to the element M in the metal oxide used as the oxide 530b is preferably greater than the atomic ratio of In to the element M in the metal oxide used as the oxide 530a. The oxide 530a is provided under the oxide 530b in the above manner, whereby impurities and oxygen can be inhibited from diffusing into the oxide 530b from components formed below the oxide 530a.

When the oxide 530a and the oxide 530b contain a common element (as the main component) besides oxygen, the density of defect states at an interface between the oxide 530a and the oxide 530b can be made low. Since the density of defect states at the interface between the oxide 530a and the oxide 530b can be made low, the influence of interface scattering on carrier conduction is small, and a high on-state current can be obtained. The oxide 530b preferably has crystallinity. It is particularly preferable to use a CAAC-OS (c-axis aligned crystalline oxide semiconductor) as the oxide 530b.

The CAAC-OS is a metal oxide having a dense structure with high crystallinity and small amounts of impurities and defects (e.g., oxygen vacancies ($V_O$). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter, sometimes referred to as $V_OH$), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and $V_OH$ are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and $V_OH$. However, supply of an excess amount of oxygen to the source region or the drain region might cause a decrease in the on-state current or field-effect mobility of the transistor 500. Furthermore, a variation of the amount of oxygen supplied to the source region or the drain region in the substrate plane leads to a variation in characteristics of the semiconductor device including the transistor.

Therefore, the region 530bc functioning as the channel formation region in the oxide semiconductor is preferably an i-type or substantially i-type region with a reduced carrier concentration, whereas the region 530ba and the region 530bb functioning as the source region and the drain region are preferably n-type regions with high carrier concentrations. That is, it is preferable that oxygen vacancies and $V_OH$ in the region 530bc of the oxide semiconductor be reduced and the region 530ba and the region 530bb not be supplied with an excess amount of oxygen.

Thus, in this embodiment, microwave treatment is performed in an oxygen-containing atmosphere in a state where the conductor 542a and the conductor 542b are provided over the oxide 530b so that oxygen vacancies and $V_OH$ in the region 530bc can be reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530bc can be irradiated with the high-frequency wave such as a microwave or RF. By the effect of the plasma, a microwave, or the like, $V_OH$ in the region 530bc can be cut; thus, hydrogen H can be removed from the region 530bc and oxygen can compensate for an oxygen vacancy $V_O$. That is, the reaction "$V_OH \rightarrow H + V_O$" occurs in the region 530bc, so that the hydrogen concentration in the region 530bc can be reduced. As a result, oxygen vacancies and $V_OH$ in the region 530bc can be reduced to lower the carrier concentration.

In the microwave treatment in an oxygen-containing atmosphere, the high-frequency wave such as the microwave or RF, the oxygen plasma, or the like is blocked by the conductor 542a and the conductor 542b and does not affect the region 530ba nor the region 530bb. In addition, the effect of the oxygen plasma can be reduced by the insulator 571 and the insulator 580 that are provided to cover the oxide 530b, the conductor 542a, and the conductor 542b. Hence, a reduction in $V_OH$ and supply of an excess amount of oxygen do not occur in the region 530ba and the region 530bb in the microwave treatment, preventing a decrease in carrier concentration.

Microwave treatment is preferably performed in an oxygen-containing atmosphere after formation of an insulating film to be the insulator 552 or after formation of an insulating film to be the insulator 550. By performing the microwave treatment in an oxygen-containing atmosphere through the insulator 552 or the insulator 550 in such a manner, oxygen can be efficiently supplied into the region 530bc. In addition, the insulator 552 is provided to be in contact with each of side surfaces of the conductor 542a and the conductor 542b and the surface of the region 530bc, thereby preventing oxygen more than necessary from being supplied to the region 530bc and preventing each of the side surfaces of the conductor 542a and the conductor 542b from being oxidized. Furthermore, each of the side surfaces of the conductor 542a and the conductor 542b can be inhibited from being oxidized when an insulating film to be the insulator 550 is formed.

The oxygen supplied into the region 530bc has any of a variety of forms such as an oxygen atom, an oxygen molecule, and an oxygen radical (also referred to as an O radical, an atom or a molecule having an unpaired electron, or an ion). Note that the oxygen supplied into the region 530bc preferably has any one or more of the above forms, and is particularly preferably an oxygen radical. Furthermore, the film quality of the insulator 552 and the insulator 550 can be improved, leading to higher reliability of the transistor 500.

In the above manner, oxygen vacancies and $V_OH$ can be selectively removed from the region 530bc in the oxide semiconductor, whereby the region 530bc can be an i-type or substantially i-type region. Furthermore, supply of an excess amount of oxygen to the region 530ba and the region 530bb functioning as the source region and the drain region can be inhibited and the state of the n-type region before the microwave treatment is performed can be maintained. As a result, a change in the electrical characteristics of the transistor 500 can be inhibited, and thus a variation in the electrical characteristics of the transistors 500 in the substrate plane can be reduced.

With the above structure, a semiconductor device with a small variation in transistor characteristics can be provided. A semiconductor device with favorable reliability can also be provided. A semiconductor device having favorable electrical characteristics can be provided.

As illustrated in FIG. 16B, a curved surface may be provided between the side surface of the oxide 530b and the top surface of the oxide 530b in a cross-sectional view of the transistor 500 in the channel width direction. In other words, an end portion of the side surface and an end portion of the top surface may be curved (hereinafter, also referred to as rounded).

The radius of curvature of the curved surface is preferably greater than 0 nm and less than the thickness of the oxide 530b in a region overlapping with the conductor 542a or the conductor 542b, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 530b with the insulator 552, the insulator 550, the insulator 554, and the conductor 560. The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element Min the metal oxide used as the oxide 530b is preferably greater than the atomic ratio of In to the element Min the metal oxide used as the oxide 530a. The oxide 530b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 530b by the source electrode or the drain electrode. This can reduce oxygen extraction from the oxide 530b even when heat treatment is performed; thus, the transistor 500 is stable with respect to high temperatures in a manufacturing process (what is called thermal budget).

Here, the conduction band minimum gradually changes at a junction portion of the oxide 530a and the oxide 530b. In other words, the conduction band minimum at the junction portion of the oxide 530a and the oxide 530b continuously changes or is continuously connected. To achieve this, the density of defect states in a mixed layer formed at the interface between the oxide 530a and the oxide 530b is preferably made low.

Specifically, when the oxide 530a and the oxide 530b contain a common element as a main component besides oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, an indium oxide, or the like may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 530b, a metal oxide with a composition of In:M:Zn=1: 1:1 [atomic ratio] or in the neighborhood thereof, or a composition of In:M:Zn=4:2:3 [atomic ratio] or in the neighborhood thereof is used. Note that a composition in the neighborhood includes the range of ±30% of an intended atomic ratio. Gallium is preferably used as the element M When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 16A or the like, the insulator 552 formed using aluminum oxide or the like is provided in contact with the top and side surfaces of the oxide 530, whereby indium contained in the oxide 530 is unevenly distributed, in some cases, at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of the surface of the oxide 530b, can increase the field-effect mobility of the transistor 500.

When the oxide 530a and the oxide 530b have the above structure, the density of defect states at the interface between the oxide 530a and the oxide 530b can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, an insulator 576, and the insulator 581 preferably functions as a barrier insulating film, which inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

An insulator having a function of inhibiting diffusion of oxygen and impurities such as water and hydrogen is preferably used as the insulator 512, the insulator 514, the insulator 544, the insulator 571, the insulator 574, the insulator 576, and the insulator 581; for example, aluminum oxide, magnesium oxide, hafnium oxide, gallium oxide, indium-gallium-zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen well, is preferably used for the insulator 514, the insulator 571, the insulator 574, and the insulator 581. In this case, impurities such as water and hydrogen can be inhibited from diffusing to the transistor 500 side from the substrate side through the insulator 512 and the insulator 514. Impurities such as water and hydrogen can be inhibited from diffusing to the transistor 500 side from an interlayer insulating film and the like which are provided outside the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device, which have favorable characteristics and high reliability, can be manufactured.

Although each of the insulator 512, the insulator 514, the insulator 544, the insulator 571, the insulator 574, the insulator 576, and the insulator 581 preferably has an amorphous structure, a region having a polycrystalline structure may be partly formed. Alternatively, each of the insulator 512, the insulator 514, the insulator 544, the insulator 571, the insulator 574, the insulator 576, and the insulator 581 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 can be deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 512, the insulator 544, and the insulator 576 are preferably low in some cases. For example, by setting the resistivities of the insulator 512, the insulator 544, and the insulator 576 to approximately $1 \times 10^{13}$ $\Omega$cm, the insulator 512, the insulator 544, and the insulator 576 can sometimes reduce charge up of the conductor 503, the conductor 542a, the conductor 542b, the conductor 560, or the like in treatment using plasma or the like in the manufacturing process of a semiconductor device. The resistivities of the insulator 512, the insulator 544, and the insulator 576 are preferably higher than or equal to $1 \times 10^{10}$ $\Omega$cm and lower than or equal to $1 \times 10^{15}$ $\Omega$cm.

The insulator 516, the insulator 574, the insulator 580, and the insulator 581 each preferably have a lower permittivity than the insulator 514. When a material with a low permittivity is used for an interlayer film, parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 is preferably an insulator functioning as an interlayer film, a planarization film, or the like, for example.

The conductor 503 is provided to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a sidewall of the opening. The conductor 503b is provided to be embedded in a recessed portion formed in the conductor 503a. Here, the upper portion of the conductor 503b is substantially level with the upper portion of the conductor 503a and the upper portion of the insulator 516.

Here, for the conductor 503a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 503a. For example, titanium nitride is used for the conductor 503a.

Moreover, the conductor 503b is preferably formed using a conductive material containing tungsten, copper, or aluminum as its main component. For example, tungsten is used for the conductor 503b. The conductor 503 sometimes functions as a second gate electrode. In that case, by changing a potential applied to the conductor 503 not in conjunction with but independently of a potential applied to the conductor 560, the threshold voltage (Vth) of the transistor 500 can be controlled. In particular, Vth of the transistor 500 can be higher in the case where a negative potential is applied to the conductor 503, and the off-state current can be reduced. Thus, drain current at the time when a potential applied to the conductor 560 is 0 V can be lower in the case where a negative potential is applied to the conductor 503 than in the case where the negative potential is not applied to the conductor 503.

In the case where the oxide 530 is a highly purified intrinsic oxide and as many impurities as possible are eliminated from the oxide 530, the transistor 500 can be expected to become normally-off (the threshold voltage of the transistor 500 can be expected to higher than 0 V) in some cases with no potential application to the conductor 503 and/or the conductor 560. In that case, it is suitable to connect the conductor 560 and the conductor 503 to each other such that the same potential is supplied.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

When seen from above, the conductor 503 is preferably provided to be larger than a region of the oxide 530 that does not overlap with the conductor 542_a_ or the conductor 542_b_. As illustrated in FIG. 16B, it is particularly preferable that the conductor 503 extend to a region outside end portions of the oxide 530_a_ and the oxide 530_b_ in the channel width direction. That is, the conductor 503 and the conductor 560 preferably overlap with each other with the insulators therebetween on the outer side of the side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

When the transistor 500 becomes normally-off and has the above-described S-Channel structure, the channel formation region can be electrically surrounded. Accordingly, the transistor 500 can be regarded as having a GAA (Gate All Around) structure or an LGAA (Lateral Gate All Around) structure. When the transistor 500 has the S-Channel structure, the GAA structure, or the LGAA structure, the channel formation region that is formed at the interface between the oxide 530 and the gate insulating film or in the vicinity of the interface can be formed in the entire bulk of the oxide 530. In other words, the transistor 500 having the S-Channel structure, the GAA structure, or the LGAA structure can be what is called a Bulk-Flow type, in which a carrier path is used as the entire bulk. A transistor structure with a Bulk- Flow type can improve the density of current flowing in the transistor and thus can be expected to improve the on-state current of the transistor or increase the field-effect mobility of the transistor. Furthermore, as illustrated in FIG. 16B, the conductor 503 is extended to function as a wiring as well. However, without limitation to this structure, a structure in which a conductor functioning as a wiring is provided below the conductor 503 may be employed. In addition, the conductor 503 is not necessarily provided in each transistor. For example, the conductor 503 may be shared by a plurality of transistors.

Although the transistor 500 having a structure in which the conductor 503 is a stack of the conductor 503_a_ and the conductor 503_b_ is illustrated, the present invention is not limited thereto. For example, the conductor 503 may be provided to have a single-layer structure or a stacked-layer structure of three or more layers.

The insulator 522 and the insulator 524 function as a gate insulator.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen more than the insulator 524. As the insulator 522, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Moreover, the conductor 503 can be inhibited from reacting with oxygen contained in the insulator 524 or the oxide 530.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 522.

For example, a single layer or stacked layers of an insulator containing what is called a high-k material such as aluminum oxide, hafnium oxide, tantalum oxide, or zirconium oxide may be used for the insulator 522. As scaling down and high integration of transistors progress, a problem such as leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 522.

Silicon oxide or silicon oxynitride, for example, can be used as appropriate for the insulator 524 that is in contact with the oxide 530.

In a manufacturing process of the transistor 500, heat treatment is preferably performed with a surface of the oxide 530 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 530 to reduce oxygen vacancies (V$_O$). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 530 can promote a reaction in which oxygen vacancies in the oxide 530 are repaired with supplied oxygen, i.e., a reaction of "V$_O$+O→null". Furthermore, hydrogen remaining in the oxide 530 reacts with supplied oxygen, so that the hydrogen can be removed as H$_2$O (dehydration). This can inhibit recombination of hydrogen remaining in the oxide 530 with oxygen vacancies and formation of V$_O$H.

Note that the insulator 522 and the insulator 524 may each have a stacked-layer structure of two or more layers. In that case, without limitation to a stacked-layer structure formed of the same material, a stacked-layer structure formed of different materials may be employed. The insulator 524 may be formed into an island shape so as to overlap with the oxide 530*a*. In this case, the insulator 544 is in contact with the side surface of the insulator 524 and the top surface of the insulator 522.

The conductor 542*a* and the conductor 542*b* are provided in contact with the top surface of the oxide 530*b*. The conductor 542*a* and the conductor 542*b* function as a source electrode and a drain electrode of the transistor 500.

For the conductor 542 (the conductor 542*a* and the conductor 542*b*), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. For another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530*b* or the like diffuses into the conductor 542*a* or the conductor 542*b* in some cases. In particular, when a nitride containing tantalum is used for the conductor 542*a* and the conductor 542*b*, hydrogen contained in the oxide 530*b* or the like is likely to diffuse into the conductor 542*a* or the conductor 542*b*, and the diffused hydrogen is bonded to nitrogen contained in the conductor 542*a* or the conductor 542*b* in some cases. That is, hydrogen contained in the oxide 530*b* or the like is absorbed by the conductor 542*a* or the conductor 542*b* in some cases.

No curved surface is preferably formed between the side surface of the conductor 542 and the top surface of the conductor 542. When no curved surface is formed in the conductor 542, the conductor 542 can have a large cross-sectional area in the channel width direction. Accordingly, the conductivity of the conductor 542 is increased, so that the on-state current of the transistor 500 can be increased.

The insulator 571*a* is provided in contact with the top surface of the conductor 542*a*, and the insulator 571*b* is provided in contact with the top surface of the conductor 542*b*. The insulator 571 preferably functions as at least a barrier insulating film against oxygen. Thus, the insulator 571 preferably has a function of inhibiting oxygen diffusion. For example, the insulator 571 preferably has a function of inhibiting diffusion of oxygen more than the insulator 580. For example, a nitride containing silicon such as silicon nitride may be used for the insulator 571. The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure or amorphous aluminum oxide for the insulator 571 because hydrogen can be captured or fixed more effectively in some cases. Accordingly, the transistor 500 and a semiconductor device, which have favorable characteristics and high reliability, can be manufactured.

The insulator 544 is provided to cover the insulator 524, the oxide 530*a*, the oxide 530*b*, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and the insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above may be used. An insulator containing an oxide of one or both of aluminum and hafnium is preferably used as the insulator 552. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 16B, the insulator 552 is provided in contact with the top surface and the side surface of the oxide 530*b*, the side surface of the oxide 530*a*, the side surface of the insulator 524, and the top surface of the insulator 522. That is, the regions of the oxide 530*a*, the oxide 530*b*, and the insulator 524 that overlap with the conductor 560 are covered with the insulator 552 in the cross section in the channel width direction. With this structure, the insulator 552 having a barrier property against oxygen can prevent release of oxygen from the oxide 530a and the oxide 530b at the time of heat treatment or the like. This can inhibit formation of oxygen vacancies ($V_O$) in the oxide 530a and the oxide 530b. Therefore, oxygen vacancies ($V_O$) and $V_OH$ formed in the region 530bc can be reduced. Thus, the transistor 500 can have favorable electrical characteristics and higher reliability.

Even when an excess amount of oxygen is contained in the insulator 580, the insulator 550, and the like, oxygen can be inhibited from being excessively supplied to the oxide 530a and the oxide 530b. Thus, the region 530ba and the region 530bb are prevented from being excessively oxidized by oxygen through the region 530bc; a reduction in on-state current or field-effect mobility of the transistor 500 can be inhibited.

As illustrated in FIG. 16A, the insulator 552 is provided in contact with the side surfaces of the conductor 542, the insulator 544, the insulator 571, and the insulator 580. This can inhibit formation of an oxide film on the side surface of the conductor 542 by oxidization of the side surface. Accordingly, a reduction in on-state current or field-effect mobility of the transistor 500 can be inhibited.

Furthermore, the insulator 552 needs to be provided in an opening formed in the insulator 580 and the like, together with the insulator 554, the insulator 550, and the conductor 560. The thickness of the insulator 552 is preferably small for scaling down the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that the above-described lower limits and upper limits can be combined with each other. In that case, at least part of the insulator 552 includes a region having the above-described thickness. The thickness of the insulator 552 is preferably smaller than that of the insulator 550. In that case, at least part of the insulator 552 includes a region having a thickness smaller than that of the insulator 550.

To form the insulator 552 having a small thickness as described above, an ALD method is preferably used for deposition. An ALD method is a method in which deposition is performed by introducing a first source gas (also referred to as a precursor or a metal precursor) and a second source gas (also referred to as a reactant, an oxidizer, or a nonmetallic precursor) for reaction alternately into a chamber, and repeating the introduction of these source gases. As an ALD method, a thermal ALD method, in which a precursor and a reactant react with each other only by a thermal energy, a PEALD (Plasma Enhanced ALD) method, in which a reactant excited by plasma is used, and the like can be used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition.

Therefore, the insulator 552 can be formed on the side surface of the opening formed in the insulator 580 and the like to have a small thickness as described above and to have favorable coverage. Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photoelectron spectroscopy (XP S)

The insulator 550 functions as part of the gate insulator. The insulator 550 is preferably provided in contact with the top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 550 in this case is an insulator containing at least oxygen and silicon.

As in the insulator 524, the concentration of an impurity such as water or hydrogen in the insulator 550 is preferably reduced. The lower limit of the thickness of the insulator 550 is preferably 1 nm or 0.5 nm, and the upper limit is preferably 15 nm or 20 nm. Note that the above-described lower limits and upper limits can be combined with each other. For example, the thickness of the insulator 550 is preferably greater than or equal to 0.5 nm and less than or equal to 20 nm, preferably greater than or equal to 1 nm and less than or equal to 15 nm. In that case, at least part of the insulator 550 includes a region having the above-described thickness.

Although FIG. 16A, FIG. 16B, and the like illustrate a single-layer structure of the insulator 550, the present invention is not limited to this structure, and a stacked-layer structure of two or more layers may be employed. For example, as illustrated in FIG. 17B, the insulator 550 may have a stacked-layer structure including two layers of an insulator 550a and an insulator 550b over the insulator 550a.

Figure 17B:
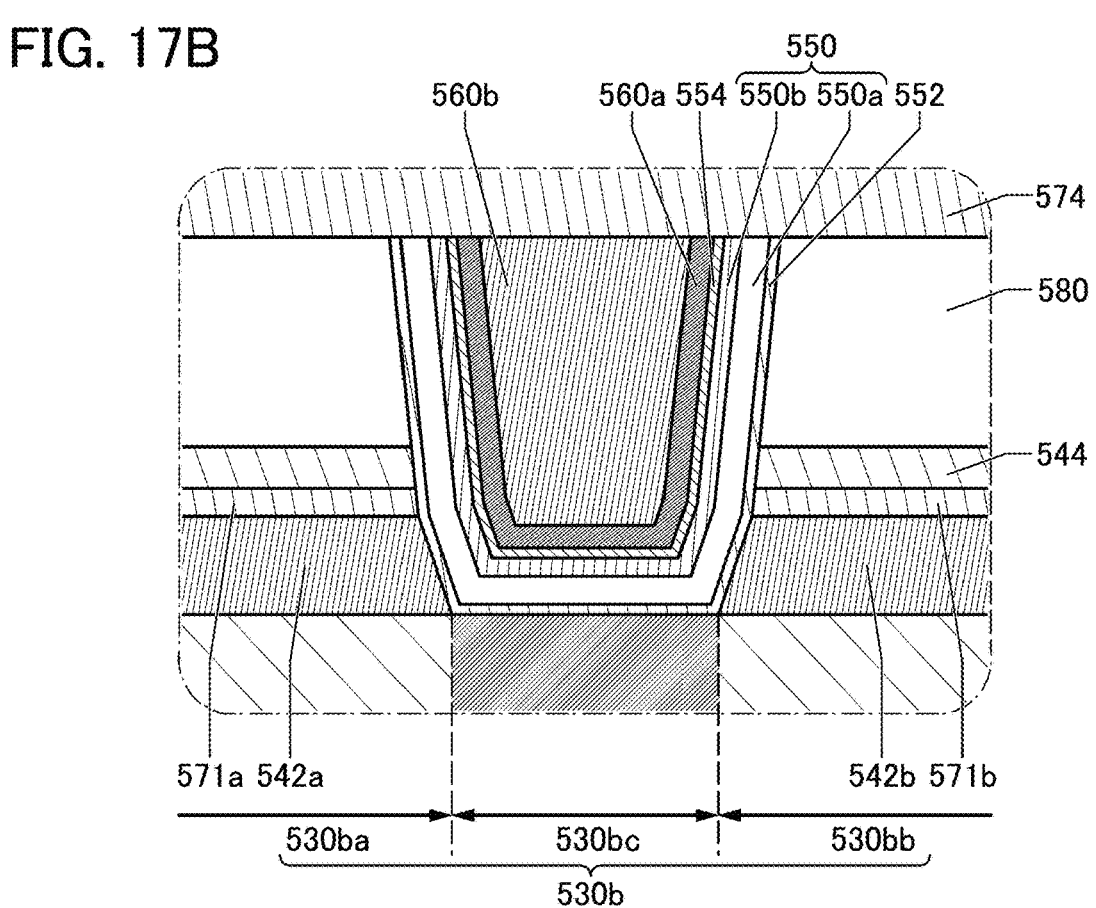

In the case where the insulator 550 has a stacked-layer structure of two layers as illustrated in FIG. 17B, it is preferable that the insulator 550a in a lower layer be formed using an insulator that is likely to transmit oxygen and the insulator 550b in an upper layer be formed using an insulator having a function of inhibiting oxygen diffusion. With such a structure, oxygen contained in the insulator 550a can be inhibited from diffusing into the conductor 560. That is, a reduction in the amount of oxygen supplied to the oxide 530 can be inhibited. In addition, oxidation of the conductor 560 due to oxygen contained in the insulator 550a can be inhibited. For example, it is preferable that the insulator 550a be provided using any of the above-described materials that can be used for the insulator 550 and the insulator 550b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used for the insulator 550b. In this case, the insulator 550b is an insulator containing at least oxygen and hafnium. The thickness of the insulator 550b is preferably greater than or equal to 0.5 nm or greater than or equal to 1.0 nm and preferably less than or equal to 3.0 nm or less than or equal to 5.0 nm. Note that the above-described lower limits and upper limits can be combined with each other. In that case, at least part of the insulator 550b includes a region having the above-described thickness.

In the case where silicon oxide, silicon oxynitride, or the like is used for the insulator 550a, the insulator 550b may be formed using an insulating material that is a high-k material having a high dielectric constant. The gate insulator having a stacked-layer structure of the insulator 550a and the insulator 550b can be thermally stable and can have a high dielectric constant. Thus, a gate potential that is applied during the operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of a gate insulator. As the insulator 554, a barrier insulating film against hydrogen is preferably used. This can prevent diffusion of impurities such as hydrogen contained in the conductor 560 into the insulator 550 and the oxide 530b. As the insulator 554, an insulator that can be used as the insulator 576 described above may be used. For example, silicon nitride deposited by a PEALD method may be used as the insulator 554. In this case, the insulator 554 is an insulator containing at least nitrogen and silicon.

Furthermore, the insulator 554 may have a barrier property against oxygen. Thus, diffusion of oxygen contained in the insulator 550 into the conductor 560 can be inhibited.

Furthermore, the insulator 554 needs to be provided in an opening formed in the insulator 580 and the like, together with the insulator 552, the insulator 550, and the conductor 560. The thickness of the insulator 554 is preferably small for scaling down the transistor 500. The thickness of the insulator 554 is preferably greater than or equal to 0.1 nm, greater than or equal to 0.5 nm, or greater than or equal to 1.0 nm, and preferably less than or equal to 3.0 nm or less than or equal to 5.0 nm. Note that the above-described lower limits and upper limits can be combined with each other. In that case, at least part of the insulator 554 includes a region having the above-described thickness. The thickness of the insulator 554 is preferably smaller than that of the insulator 550. In that case, at least part of the insulator 554 includes a region having a thickness smaller than that of the insulator 550.

The conductor 560 functions as the first gate electrode of the transistor 500. The conductor 560 preferably includes the conductor 560a and the conductor 560b provided over the conductor 560a. For example, the conductor 560a is preferably provided to cover the bottom surface and the side surface of the conductor 560b. As illustrated in FIG. 16A and FIG. 16B, the upper surface of the conductor 560 is substantially level with the upper portion of the insulator 550. Note that although the conductor 560 has a two-layer structure of the conductor 560a and the conductor 560b in FIG. 16A and FIG. 16B, the conductor 560 can have, besides the two-layer structure, a single-layer structure or a stacked-layer structure of three or more layers.

For the conductor 560a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 560a has a function of inhibiting diffusion of oxygen, the conductivity of the conductor 560b can be inhibited from being lowered because of oxidation due to oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus is preferably a conductor having high conductivity.

For example, a conductive material containing tungsten, copper, or aluminum as its main component can be used for the conductor 560b. The conductor 560b can have a stacked-layer structure. Specifically, for example, the conductor 560b can have a stacked-layer structure of titanium or titanium nitride and the above conductive material. In the transistor 500, the conductor 560 is formed in a self-aligned manner to fill the opening formed in the insulator 580 and the like. The formation of the conductor 560 in this manner allows the conductor 560 to be placed properly in a region between the conductor 542a and the conductor 542b without alignment.

As illustrated in FIG. 16B, in the channel width direction of the transistor 500, with reference to the bottom surface of the insulator 522, the level of the bottom surface of the conductor 560 in a region where the conductor 560 and the oxide 530b do not overlap with each other is preferably lower than the level of the bottom surface of the oxide 530b. When the conductor 560 functioning as the gate electrode covers the side surface and the top surface of the channel formation region of the oxide 530b with the insulator 550 and the like therebetween, the electric field of the conductor 560 can easily act on the entire channel formation region of the oxide 530b. Thus, the on-state current of the transistor 500 can be increased and the frequency characteristics can be improved. The difference between the level of the bottom surface of the conductor 560 in a region where the oxide 530a and the oxide 530b do not overlap with the conductor 560 and the level of the bottom surface of the oxide 530b, with reference to the bottom surface of the insulator 522, is preferably greater than or equal to 0 nm, greater than or equal to 3 nm, or greater than or equal to 5 nm, and preferably less than or equal to 20 nm, less than or equal to 50 nm, or less than or equal to 100 nm. Note that the above-described lower limits and upper limits can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 580 is preferably reduced. An oxide containing silicon, such as silicon oxide or silicon oxynitride, is used as appropriate for the insulator 580, for example.

The insulator 574 preferably functions as a barrier insulating film that inhibits impurities such as water and hydrogen from diffusing into the insulator 580 from above and preferably has a function of capturing impurities such as hydrogen. The insulator 574 preferably functions as a barrier insulating film that inhibits passage of oxygen. For the insulator 574, a metal oxide having an amorphous structure, for example, an insulator such as aluminum oxide, can be used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is particularly preferable to use aluminum oxide having an amorphous structure for the insulator 574, in which case hydrogen can sometimes be captured or fixed more effectively. Accordingly, the transistor 500 and a semiconductor device, which have favorable characteristics and high reliability, can be manufactured.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon such as silicon nitride or silicon nitride oxide. For example, silicon nitride deposited by a sputtering method may be used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540a functioning as a plug, and the other of the first terminal and the second terminal of the transistor 500 is electrically connected to a conductor 540b. Note that the conductor 540a, the conductor 540b, and the like may function as wirings for electrical connection to the light-emitting device 150 or the like provided thereabove. In the display apparatus 100 in FIG. 4, the conductor 540a, the conductor 540b, and the like may function as wirings for electrical connection to the transistor 170 and the like. Note that in this specification and the like, the conductor 540a and the conductor 540b are collectively referred to as the conductor 540.

The conductor 540a is provided in a region overlapping with the conductor 542a, for example. Specifically, an opening portion is formed in the insulator 571, the insulator 544, the insulator 580, the insulator 574, the insulator 576, and the insulator 581 illustrated in FIG. 16A in the region overlapping with the conductor 542a, and the conductor 540a is provided inside the opening portion. The conductor 540b is provided in a region overlapping with the conductor 542b, for example. Specifically, an opening portion is formed in the insulator 571, the insulator 544, the insulator 580, the insulator 574, the insulator 576, and the insulator 581 illustrated in FIG. 16A in the region overlapping with the conductor 542b, and the conductor 540b is provided inside the opening portion.

As illustrated in FIG. 16A, an insulator 541a as an insulator having an impurity barrier property may be provided between the conductor 540a and the side surface of the opening portion in the region overlapping with the conductor 542a. Similarly, an insulator 541b as an insulator having an impurity barrier property may be provided between the conductor 540b and the side surface of the opening portion in the region overlapping with the conductor 542b. Note that in this specification and the like, the insulator 541a and the insulator 541b are collectively referred to as an insulator 541.

For the conductor 540a and the conductor 540b, a conductive material containing tungsten, copper, or aluminum as its main component is preferably used. The conductor 540a and the conductor 540b may each have a stacked-layer structure.

In the case where the conductor 540 has a stacked-layer structure, a conductive material having a function of inhibiting passage of impurities such as water and hydrogen is preferably used for a first conductor provided in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540a and the conductor 540b.

For the insulator 541a and the insulator 541b, a barrier insulating film that can be used for the insulator 544 or the like may be used. For the insulator 541a and the insulator 541b, for example, an insulator such as silicon nitride, aluminum oxide, or silicon nitride oxide may be used. Since the insulator 541a and the insulator 541b are provided in contact with the insulator 574, the insulator 576, and the insulator 571, impurities such as water and hydrogen contained in the insulator 580 or the like can be inhibited from entering the oxide 530 through the conductor 540a and the conductor 540b. In particular, silicon nitride is suitable because of its high blocking property against hydrogen. Furthermore, oxygen contained in the insulator 580 can be prevented from being absorbed by the conductor 540a and the conductor 540b.

When the insulator 541a and the insulator 541b each have a stacked-layer structure as illustrated in FIG. 16A, a first insulator in contact with an inner wall of the opening in the insulator 580 and the like and a second insulator inside the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 540 can be inhibited, and hydrogen can be inhibited from entering the conductor 540.

Although the first insulator of the insulator 541 and the second conductor of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

The structure of the transistor included in the semiconductor device of one embodiment of the present invention is not limited to that of the transistor 500 illustrated in FIG. 16A and FIG. 16B. The structure of the transistor included in the semiconductor device of one embodiment of the present invention may be changed in accordance with circumstances.

Note that this embodiment can be combined with any of the other embodiments described in this specification as appropriate.

Embodiment 3

Described in this embodiment is a metal oxide (hereinafter, also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor will be described with reference to FIG. 18A. FIG. 18A is a diagram showing the classification of crystal structures of an oxide semiconductor, typically IGZO (a metal oxide containing In, Ga, and Zn).

As shown in FIG. 18A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 18A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 18B shows an XRD spectrum, which is obtained by GIXD (Grazing-Incidence XRD) measurement, of a CAAC-IGZO film classified into "Crystalline" (the vertical axis represents intensity in arbitrary unit (a.u.)). Note that a GIXD method is also referred to as a thin film method or a Seemann-Bohlin method. The XRD spectrum that is shown in FIG. 18B and obtained by GIXD measurement may be hereinafter simply referred to as an XRD spectrum. The CAAC-IGZO film in FIG. 18B has a composition in the neighborhood of In:Ga:Zn=4:2:3 [atomic ratio]. The CAAC-IGZO film in FIG. 18B has a thickness of 500 nm.

As shown in FIG. 18B, a clear peak indicating crystallinity is detected in the XRD spectrum of the CAAC-IGZO film. Specifically, a peak indicating c-axis alignment is detected at 219 of around 31° in the XRD spectrum of the CAAC-IGZO film. As shown in FIG. 18B, the peak at 219 of around 31° is asymmetric with respect to the axis of the angle at which the peak intensity (Intensity) is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 18C shows a diffraction pattern of the CAAC-IGZO film. FIG. 18C shows a diffraction pattern obtained by the NBED method in which an electron beam is incident in the direction parallel to the substrate. The composition of the CAAC-IGZO film in FIG. 18C is In:Ga:Zn=4:2:3 [atomic ratio] or the neighborhood thereof. In the nanobeam electron diffraction method, electron diffraction is performed with a probe diameter of 1 nm.

As shown in FIG. 18C, a plurality of spots indicating c-axis alignment are observed in the diffraction pattern of the CAAC-IGZO film.

<<Structure of Oxide Semiconductor>>

Oxide semiconductors might be classified in a manner different from one shown in FIG. 18A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction. Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using 19120 scanning, for example, a peak indicating c-axis alignment is detected at 219 of 31° or around 31°. Note that the position of the peak indicating c-axis alignment (the value of 20 may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities, defects (e.g., oxygen vacancies), and the like. Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS and an amorphous oxide semiconductor by some analysis methods. For example, when an nc-OS film is subjected to structural analysis by out-of-plane XRD measurement with an XRD apparatus using 0120 scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region. Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility ($\mu$), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved. An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases. Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases. Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities is used for the channel formation region of the transistor, stable electrical characteristics can be given.

Note that this embodiment can be combined with any of the other embodiments described in this specification as appropriate.

Embodiment 4

In this embodiment, a display module using a display apparatus of one embodiment of the present invention is described.

<Structure Example of Display Module>

Figure 19A:
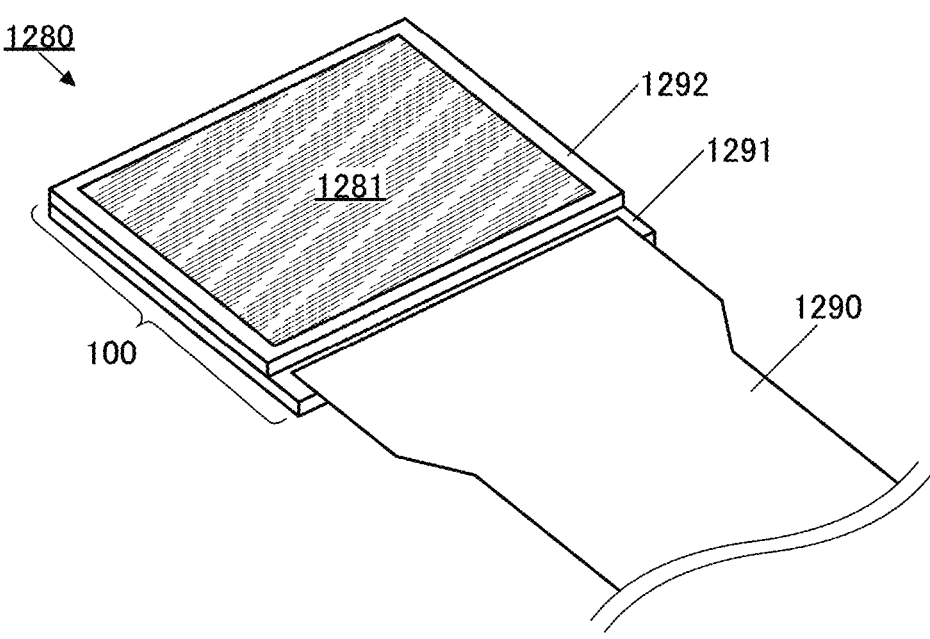
FIG. 19A and FIG. 19B are diagrams illustrating a structure example of a display module.

First, a display module including the display apparatus of one embodiment of the present invention is described. FIG. 19A illustrates a perspective view of a display module 1280. The display module 1280 includes the display apparatus 100 and an FPC 1290.

The display module 1280 includes a substrate 1291 and a substrate 1292. The display module 1280 includes a display portion 1281. The display portion 1281 is a region of the display module 1280 where an image is displayed, and is a region where light emitted from pixels provided in a pixel portion 1284 described later can be seen.

Figure 19B:
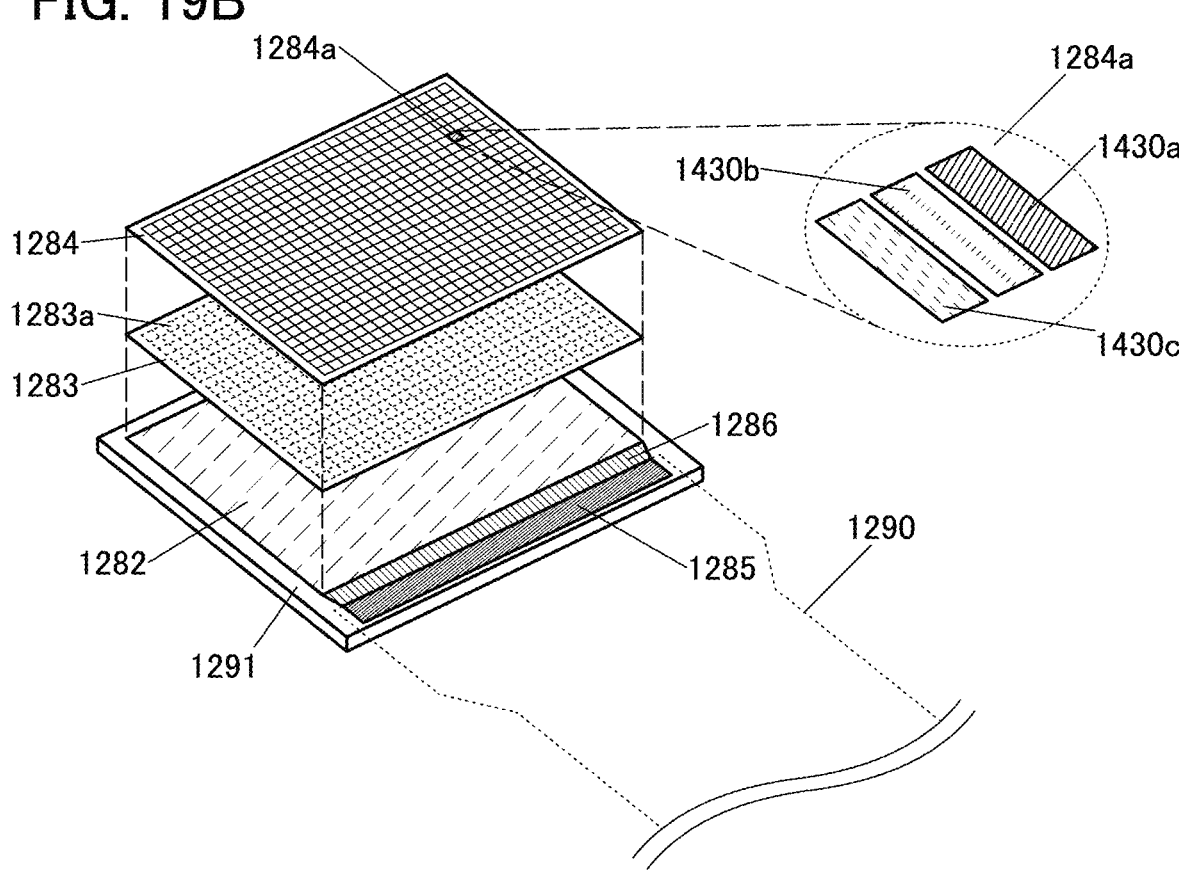

FIG. 19B illustrates a perspective view schematically illustrating a structure on the substrate 1291 side. A circuit portion 1282, a pixel circuit portion 1283 over the circuit portion 1282, and the pixel portion 1284 over the pixel circuit portion 1283 are stacked over the substrate 1291. In addition, a terminal portion 1285 for connection to the FPC 1290 is provided in a portion not overlapping with the pixel portion 1284 over the substrate 1291. The terminal portion 1285 and the circuit portion 1282 are electrically connected to each other through a wiring portion 1286 formed of a plurality of wirings.

Note that the pixel portion 1284 and the pixel portion 1283 correspond to a region of a circuit including the light-emitting device 150a to the light-emitting device 150c of the above-described display apparatus 100 and the driving transistor (the transistor 170 in FIG. 1 or the transistor 500 in FIG. 3 or FIG. 4), for example. The circuit portion 1282 corresponds to a region of a circuit including the transistor 170 in FIG. 4, for example.

The pixel portion 1284 includes a plurality of pixels 1284a arranged periodically. An enlarged view of one pixel 1284a is illustrated on the right side of FIG. 19B. The pixel 1284a includes a light-emitting device 1430a, a light-emitting device 1430b, and a light-emitting device 1430c that emit light of different colors from each other. In the light-emitting device 1430a, the light-emitting device 1430b, and the light-emitting device 1430c, the above-described plurality of the light-emitting devices corresponding to the above-described light-emitting device 150a, light-emitting device 150b, and light-emitting device 150c may be arranged in a stripe pattern as illustrated in FIG. 19B. Alternatively, a variety of arrangement methods, such as delta arrangement or PenTile arrangement, can be employed.

The pixel circuit portion 1283 includes a plurality of pixel circuits 1283a arranged periodically. One pixel circuit 1283a is a circuit that controls light emission of three light-emitting devices included in one pixel 1284a. One pixel circuit 283a may be provided with three circuits each of which controls light emission of one light-emitting device. For example, the pixel circuit 1283a can include at least one selection transistor, one current control transistor (driving transistor), and a capacitor for one light-emitting device. In this case, a gate signal is input to a gate of the selection transistor and a source signal is input to one of a source and a drain thereof. With such a structure, an active-matrix display apparatus is achieved.

The circuit portion 1282 includes a circuit for driving the pixel circuits 1283a in the pixel circuit portion 1283. For example, one or both of a gate line driver circuit and a source line driver circuit are preferably included. The circuit portion 1282 may also include at least one of an arithmetic circuit, a memory circuit, a power supply circuit, and the like.

The FPC 1290 functions as a wiring for supplying a video signal, a power supply potential, or the like to the circuit portion 1282 from the outside. In addition, an IC may be mounted on the FPC 1290.

The display module 1280 can have a structure in which one or both of the pixel circuit portion 1283 and the circuit portion 1282 are stacked below the pixel portion 1284; thus, the aperture ratio (the effective display area ratio) of the display portion 1281 can be significantly high. For example, the aperture ratio of the display portion 1281 can be greater than or equal to 40% and less than 100%, preferably greater than or equal to 50% and less than or equal to 95%, further preferably greater than or equal to 60% and less than or equal to 95%. Furthermore, the pixels 1284a can be arranged extremely densely and thus the display portion 1281 can have extremely high resolution. For example, the pixels 1284a are preferably arranged in the display portion 1281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 1280 has extremely high resolution, and thus can be suitably used for a VR device such as a head mounted display or a glasses-type AR device. For example, even with a structure in which the display portion of the display module 1280 is seen through a lens, pixels of the extremely-high-resolution display portion 1281 included in the display module 1280 are prevented from being perceived when the display portion is enlarged by the lens, so that display providing a high sense of immersion can be performed. Without being limited thereto, the display module 1280 can be suitably used for electronic devices including a relatively small display portion. For example, the display module 1280 can be favorably used in a display portion of a wearable electronic device, such as a wrist watch.

Note that this embodiment can be combined with any of the other embodiments described in this specification as appropriate.

Embodiment 5

In this embodiment, an example of a head-mounted display including a display apparatus is described as an example of an electronic device of one embodiment of the present invention.

Figure 20A:
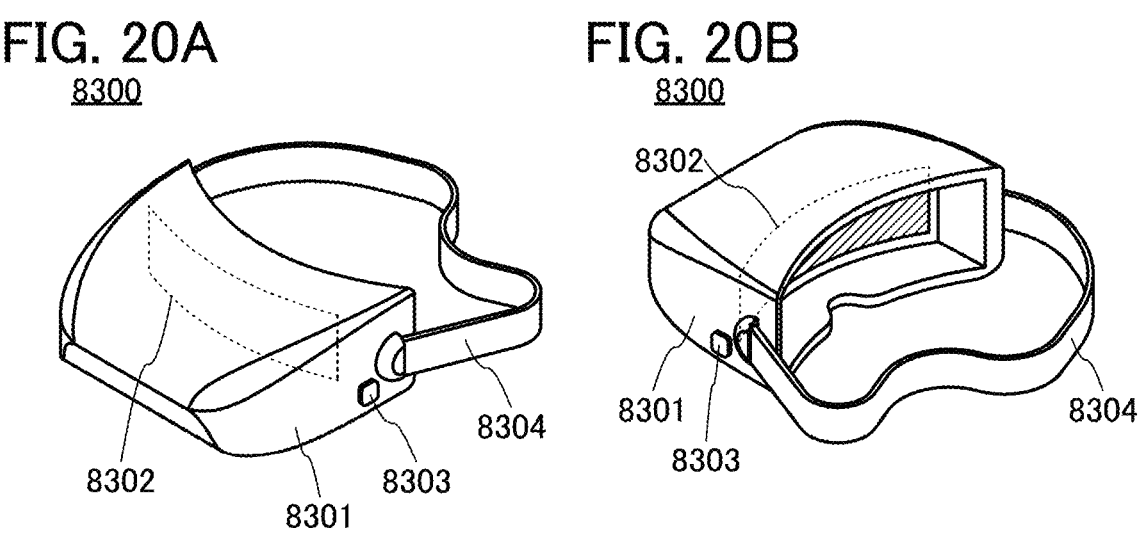
FIG. 20A to FIG. 20F are diagrams illustrating structure examples of electronic devices.
Figure 20B:
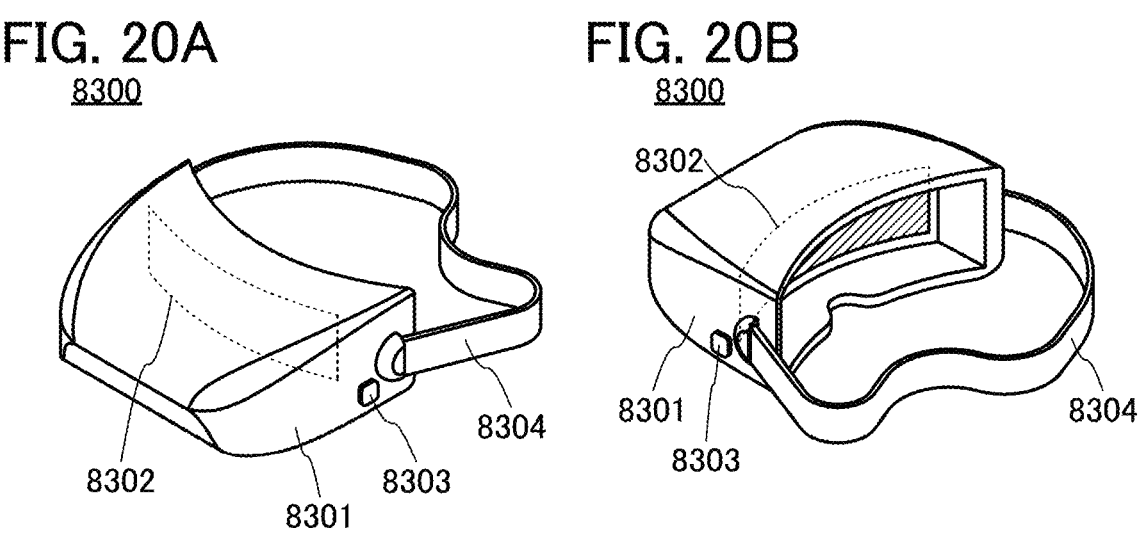

FIG. 20A and FIG. 20B illustrate external views of a head-mounted display 8300.

The head-mounted display 8300 includes a housing 8301, a display portion 8302, an operation button 8303, and a band-shaped fixing unit 8304.

The operation button 8303 has a function of a power button or the like. The head-mounted display 8300 may include a button other than the operation button 8303.

Figure 20C:
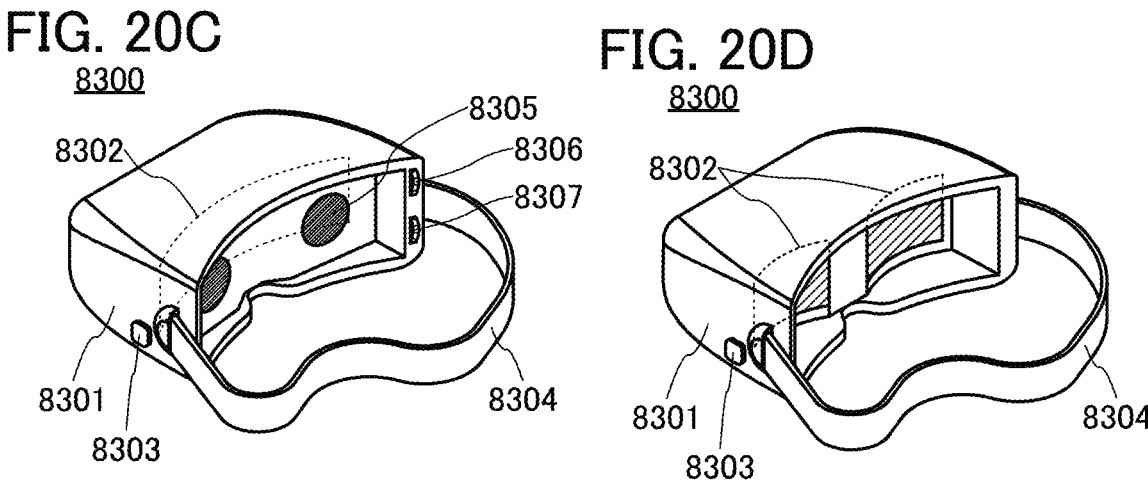

As illustrated in FIG. 20C, lenses 8305 may be provided between the display portion 8302 and the user's eyes. The user can see magnified images on the display portion 8302 through the lenses 8305, leading to a higher realistic sensation. In that case, as illustrated in FIG. 20C, a dial 8306 for changing the position of the lenses and adjusting visibility may be included.

The display portion 8302 can use the display apparatus of one embodiment of the present invention. The display apparatus of one embodiment of the present invention has an extremely high resolution; thus, even when an image is magnified using the lenses 8305 as in FIG. 20C, the user does not perceive pixels, and a more realistic image can be displayed.

FIG. 20A to FIG. 20C each illustrate an example in which one display portion 8302 is provided. This structure can reduce the number of components.

The display portion 8302 can display an image for the right eye and an image for the left eye side by side on a right region and a left region, respectively. Thus, a three-dimensional image using binocular disparity can be displayed.

One image which can be seen by both eyes may be displayed on the entire display portion 8302. A panorama image can thus be displayed from end to end of the field of view, which can provide a higher sense of reality. Here, the head-mounted display 8300 preferably has a mechanism for changing the curvature of the display portion 8302 to an optimal value in accordance with the size of the user's head, the position of the user's eyes, or the like. For example, the user himself/herself may adjust the curvature of the display portion 8302 by operating a dial 8307 for adjusting the curvature of the display portion 8302. Alternatively, a sensor for detecting the size of the user's head, the position of the user's eyes, or the like (e.g., a camera, a contact sensor, and a noncontact sensor) may be provided on the housing 8301, and a mechanism for adjusting the curvature of the display portion 8302 on the basis of data detected by the sensor may be provided.

In the case where the lenses 8305 are used, a mechanism for adjusting the position and angle of the lenses 8305 in synchronization with the curvature of the display portion 8302 is preferably provided. Alternatively, the dial 8306 may have a function of adjusting the angle of the lenses.

Figure 20D:
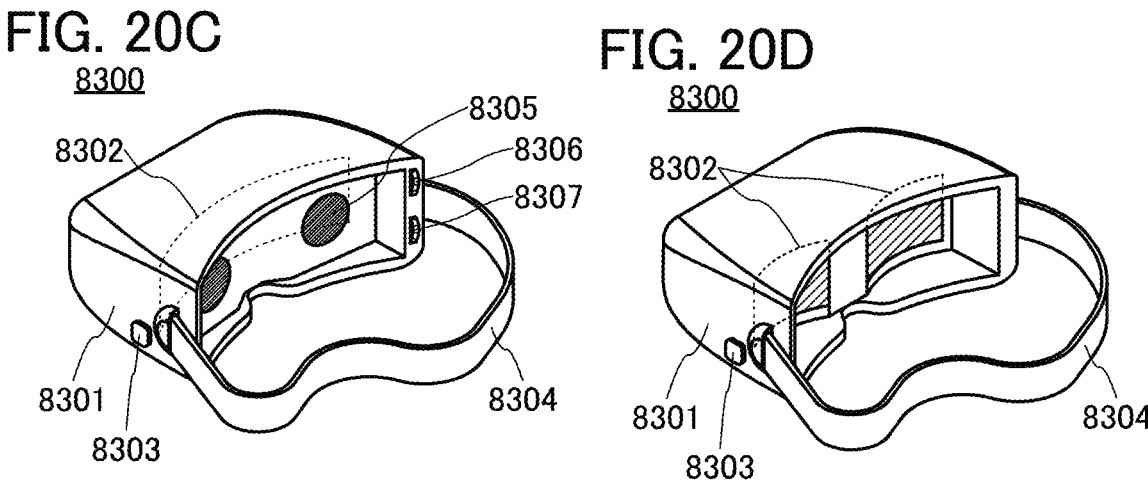
Figure 20E:
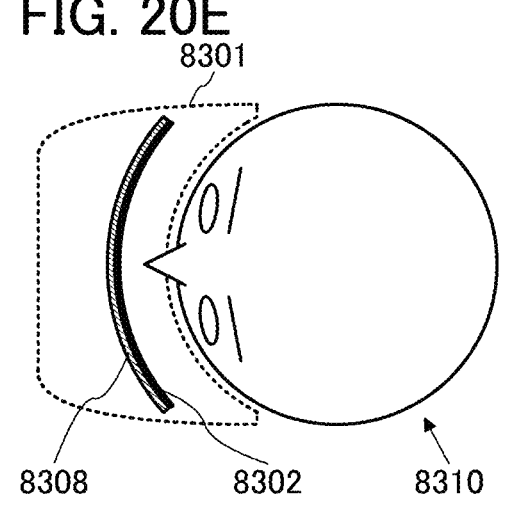
Figure 20F:
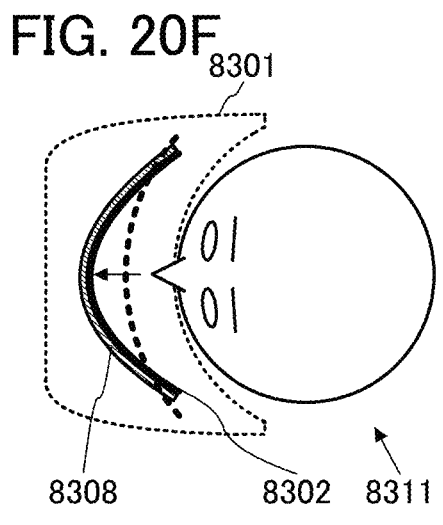

FIG. 20E and FIG. 20F illustrate an example of including a driver portion 8308 that controls the curvature of the display portion 8302. The driver portion 8308 is fixed to at least a part of the display portion 8302. The driver portion 8308 has a function of changing the shape of the display portion 8302 when the part that is fixed to the display portion 8302 changes in shape or moves. FIG. 20E is a schematic diagram illustrating the case where a user 8310 having a relatively large head wears the housing 8301. In that case, the driver portion 8308 adjusts the shape of the display portion 8302 so that the curvature is relatively small (the radius of curvature is large).

In contrast, FIG. 20F illustrates the case where a user 8311 having a smaller head than the user 8310 wears the housing 8301. The user 8311 has a shorter distance between the eyes than the user 8310. In that case, the driver portion 8308 adjusts the shape of the display portion 8302 so that the curvature of the display portion 8302 is large (the radius of curvature is small). In FIG. 20F, the position and shape of the display portion 8302 in FIG. 20E are denoted by a dashed line.

When the head-mounted display 8300 has such a mechanism for adjusting the curvature of the display portion 8302, an optimal display can be offered to a variety of users of all ages and genders.

When the curvature of the display portion 8302 is changed in accordance with contents displayed on the display portion 8302, the user can have a more realistic sensation. For example, shaking can be expressed by vibrating the curvature of the display portion 8302. In this way, it is possible to produce various effects according to the scene in contents, and provide the user with new experiences. A further realistic display can be provided when the display portion 8302 operates in conjunction with a vibration module provided in the housing 8301.

Note that the head-mounted display 8300 may include two display portions 8302 as illustrated in FIG. 20D.

Since the two display portion 8302 are included, the user's eyes can see their respective display portions. Thus, a high-resolution image can be displayed even when a three-dimensional display using parallax or the like is performed. In addition, the display portion 8302 is curved around an arc with the user's eye as an approximate center. Thus, distances between the user's eye and display surfaces of the display portion become equal; thus, the user can see a more natural image. Even when the luminance or chromaticity of light from the display portion is changed depending on the angle at which the user see it, since the user's eye is positioned in a normal direction of the display surface of the display portion, the influence of the change can be substantially ignorable and thus a more realistic image can be displayed.

Note that this embodiment can be combined with any of the other embodiments described in this specification as appropriate.

Embodiment 6

In this embodiment, a display module that can be manufactured using the display apparatus of one embodiment of the present invention is described.

Figures 21A, 21B:
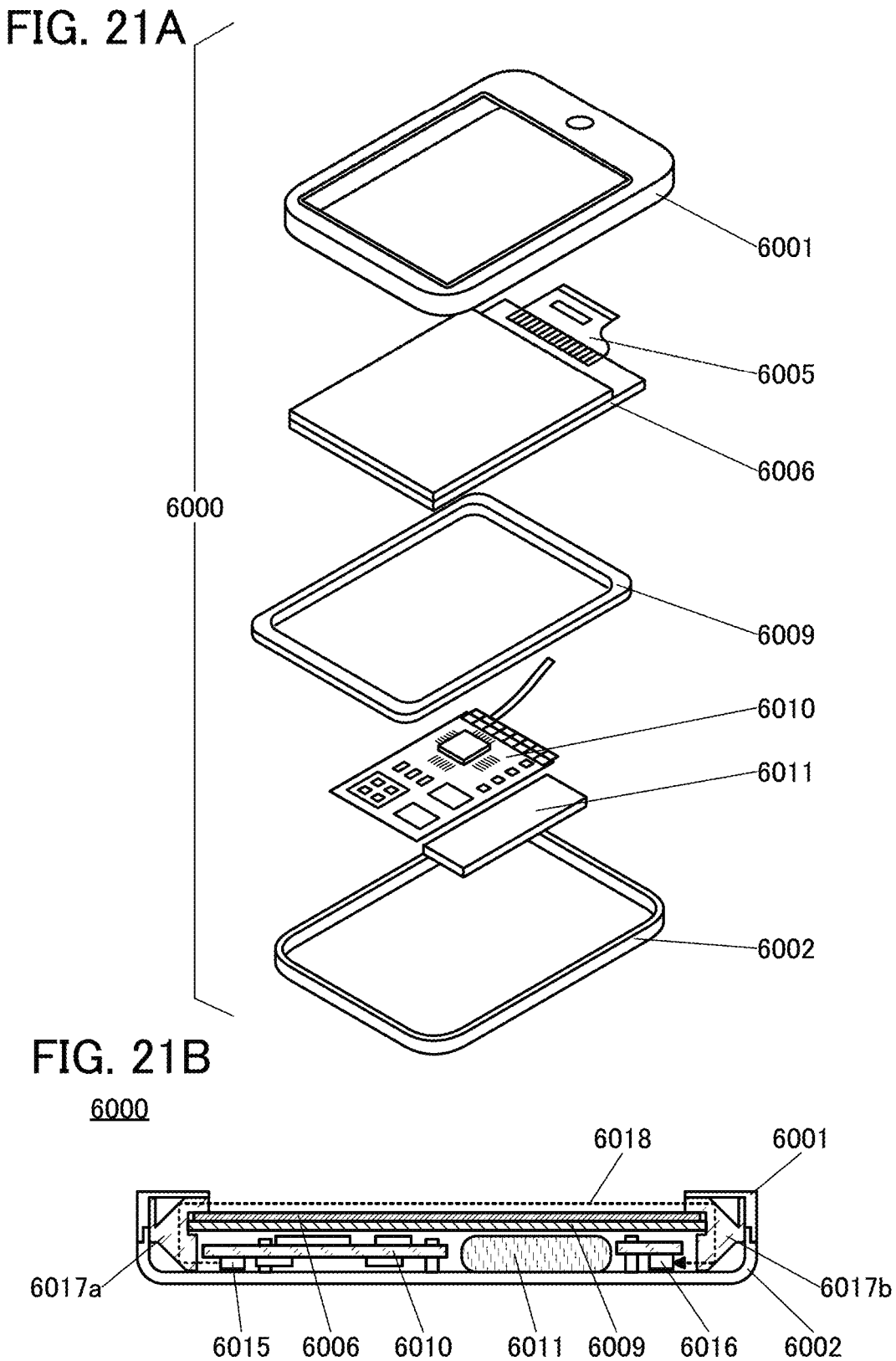
FIG. 21A and FIG. 21B are diagrams illustrating a structure example of a display module.

In a display module 6000 illustrated in FIG. 21A, a display apparatus 6006 to which an FPC 6005 is connected, a frame 6009, a printed circuit board 6010, and a battery 6011 are provided between an upper cover 6001 and a lower cover 6002.

A display apparatus manufactured using the display apparatus of one embodiment of the present invention can be used as the display apparatus 6006, for example. With the display apparatus 6006, a display module with extremely low power consumption can be achieved.

The shape and size of the upper cover 6001 and the lower cover 6002 can be changed as appropriate in accordance with the size of the display apparatus 6006. The display apparatus 6006 may have a function of a touch panel.

The frame 6009 may have a function of protecting the display apparatus 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like.

FIG. 21B is a schematic cross-sectional view of the display module 6000 including an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in regions surrounded by the upper cover 6001 and the lower cover 6002.

The display apparatus 6006 overlaps with the printed circuit board 6010 and the battery 6011 with the frame 6009 therebetween. The display apparatus 6006 and the frame 6009 are fixed to the light guide portion 6017a and the light guide portion 6017b.

Light 6018 emitted from the light-emitting portion 6015 travels over the display apparatus 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display apparatus 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electric signal can be used. A photodiode that can receive infrared rays can be suitably used.

The light guide portion 6017*a* and the light guide portion 6017*b* which transmit the light 6018 allow the light-emitting portion 6015 and the light-receiving portion 6016 to be placed under the display apparatus 6006, inhibiting a malfunction of the touch sensor due to external light reaching the light-receiving portion 6016. Particularly when a resin that absorbs visible light and transmits infrared rays is used, a malfunction of the touch sensor can be inhibited more effectively.

Note that this embodiment can be combined with any of the other embodiments described in this specification as appropriate.

Embodiment 7

Figures 22A, 22B:
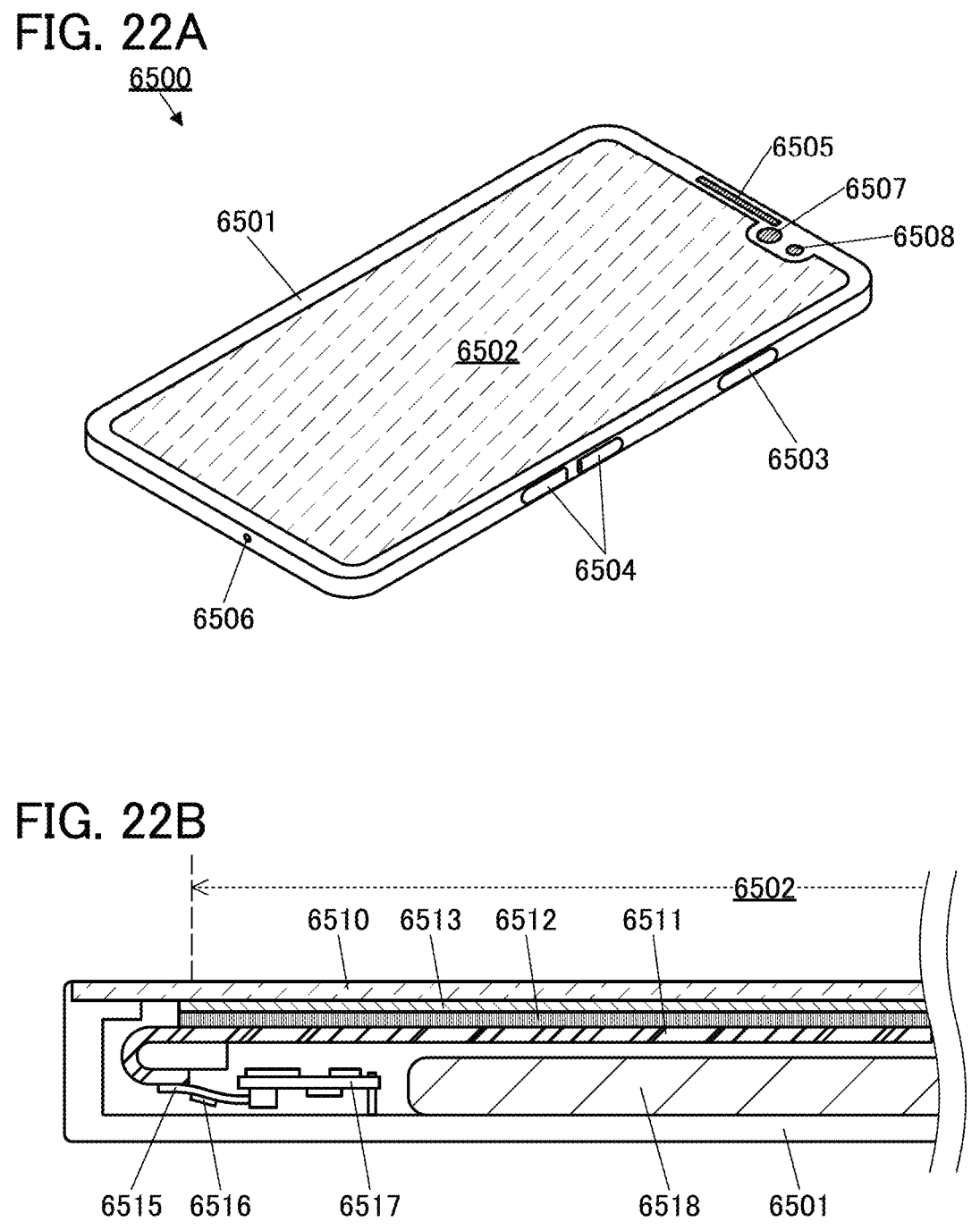

In this embodiment, examples of an electronic device for which the display apparatus of one embodiment of the present invention can be used is described. An electronic device 6500 illustrated in FIG. 22A is a portable information terminal that can be used as a smartphone.

The electronic device 6500 includes a housing 6501, a display portion 6502, a power button 6503, buttons 6504, a speaker 6505, a microphone 6506, a camera 6507, and a light source 6508. The display portion 6502 has a touch panel function.

The display apparatus of one embodiment of the present invention can be used in the display portion 6502. FIG. 22B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, and a battery 6518 are placed in a space surrounded by the housing 6501 and the protective member 6510.

The display panel 6511, the optical member 6512, and the touch sensor panel 6513 are fixed to the protective member 6510 with an adhesive layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517. A flexible display panel can be used as the display panel 6511, for example. Thus, an extremely lightweight electronic device can be obtained. Furthermore, since the display panel 6511 is extremely thin, the battery 6518 with a high capacity can be mounted without an increase in the thickness of the electronic device. Moreover, part of the display panel 6511 is bent to provide a connection portion with the FPC 6515 on the back side of the pixel portion, whereby an electronic device with a narrow bezel can be obtained.

Note that this embodiment can be combined with any of the other embodiments described in this specification as appropriate.

Embodiment 8

In this embodiment, electronic devices each including a display apparatus manufactured using one embodiment of the present invention are described.

Electronic devices described below as examples each include the display apparatus of one embodiment of the present invention in a display portion. Thus, the electronic devices achieve high resolution. In addition, the electronic devices can each achieve both high resolution and a large screen.

One embodiment of the present invention includes the display apparatus and at least one of an antenna, a battery, a housing, a camera, a speaker, a microphone, a touch sensor, and an operation button.

The electronic device of one embodiment of the present invention may include a secondary battery, and it is preferable that the secondary battery be capable of being charged by contactless power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

A display portion in an electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a cellular phone, a portable game machine, a portable information terminal, and an audio reproducing device, in addition to electronic devices with comparatively large screens, such as a television device, a notebook personal computer, a monitor device, digital signage, a pachinko machine, and a game machine.

An electronic device using one embodiment of the present invention can be incorporated along a flat surface or a curved surface of an inside wall or an outside wall of a building such as a house or a building, an interior or an exterior of a car, or the like.

FIG. 23A is a diagram illustrating appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like. The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

The display apparatus of one embodiment of the present invention can be used for the display portion 8002 of the camera 8000 and the display portion 8102 of the finder 8100. Note that a finder may be incorporated in the camera 8000. FIG. 23B is an external view of an information terminal 5900 that is an example of a wearable terminal. The information terminal 5900 includes a housing 5901, a display portion 5902, an operation button 5903, an operator 5904, and a band 5905.

The wearable terminal can display an image with high display quality on the display portion 5902 by including the display apparatus described in the above embodiment.

FIG. 23C is a diagram illustrating the appearance of a portable game machine 5200 which is an example of a game machine. The portable game machine 5200 includes a housing 5201, a display portion 5202, and a button 5203.

Videos displayed on the portable game machine 5200 can be output with a display apparatus such as a television device, a personal computer display, a game display, and a head-mounted display. The portable game machine 5200 can display an image with high display quality on the display portion 5202 by including the display apparatus described in the above embodiment. In addition, the portable game machine 5200 with low power consumption can be provided. Moreover, heat generation from a circuit can be reduced owing to low power consumption; thus, the influence of heat generation on the circuit itself, a peripheral circuit, and a module can be reduced.

Figure 24A:
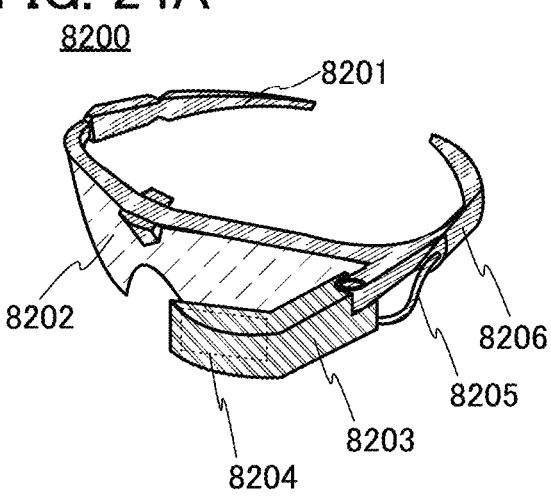
FIG. 24A to FIG. 24D are diagrams illustrating structure examples of electronic devices.

FIG. 24A is a diagram illustrating appearance of a head-mounted display 8200.

The head-mounted display 8200 includes a mounting portion 8201, a lens 8202, a main body 8203, a display portion 8204, a cable 8205, and the like. In addition, a battery 8206 is incorporated in the mounting portion 8201.

The cable 8205 supplies power from the battery 8206 to the main body 8203. The main body 8203 includes a wireless receiver or the like and can display received video information on the display portion 8204. In addition, the main body 8203 is provided with a camera, and information on the movement of the user's eyeball or eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have a function of displaying the user's biological information on the display portion 8204, a function of changing a video displayed on the display portion 8204 in accordance with the movement of the user's head, or the like.

The display apparatus of one embodiment of the present invention can be used for the display portion 8204.

Figure 24B:
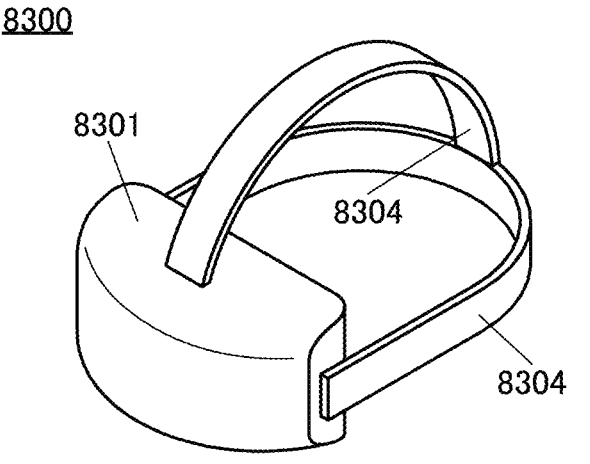
Figure 24C:
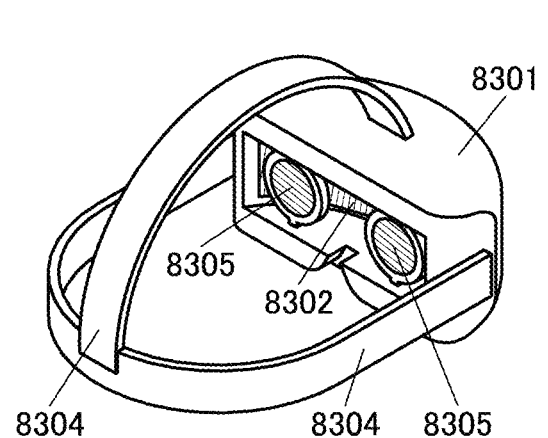
Figure 24D:
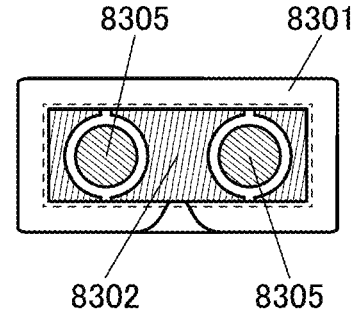

FIG. 24B to FIG. 24D are diagrams illustrating appearance of the head-mounted display 8300. The head-mounted display 8300 includes the housing 8301, the display portion 8302, the band-shaped fixing unit 8304, and a pair of lenses 8305.

A user can see display on the display portion 8302 through the lenses 8305. Note that the display portion 8302 is preferably curved and placed because the user can feel a high realistic sensation. In addition, when another image displayed on a different region of the display portion 8302 is viewed through the lenses 8305, three-dimensional display using parallax or the like can also be performed. Note that the number of display portions 8302 provided is not limited to one; two display portions 8302 may be provided so that one display portion is provided for one eye of the user.

Note that the display apparatus of one embodiment of the present invention can be used in the display portion 8302. The display apparatus including the semiconductor device of one embodiment of the present invention has an extremely high resolution; thus, even when a video is magnified by the lenses 8305 as in FIG. 24D, the user does not perceive pixels, and a more realistic video can be displayed. Note that this embodiment can be combined with any of the other embodiments described in this specification as appropriate.

REFERENCE NUMERALS

100: display apparatus, 101: substrate, 102: substrate, 111: insulator, 112: insulator, 112a: insulator, 112b: insulator, 113: insulator, 113a: insulator, 113b: insulator, 113c: insulator, 113A: insulator, 113B: insulator, 114: insulator, 114a: insulator, 114b: insulator, 116: insulator, 117: insulator, 121: conductor, 121a: conductor, 121b: conductor, 121c: conductor, 122: conductor, 122a: conductor, 122b: conductor, 122c: conductor, 122A: conductor, 122B: conductor, 123: conductor, 126: conductor, 132_1: resin layer, 132_2: resin layer, 141: EL layer, 141A: EL layer, 141a: EL layer, 141B: EL layer, 141Bm: EL layer, 141b: EL layer, 141C: EL layer, 141c: EL layer, 150: light-emitting device, 150a: light-emitting device, 150b: light-emitting device, 150c: light-emitting device, 161: resin layer, 162a: coloring layer, 162b: coloring layer, 162c: coloring layer, 163: black matrix, 164: adhesive layer, 165: adhesive layer, 170: transistor, 171: element isolation layer, 172a: low-resistance region, 172b: low-resistance region, 173: semiconductor region, 174: insulator, 175: conductor, 176: insulator, 500: transistor, 503: conductor, 503a: conductor, 503b: conductor, 512: insulator, 514: insulator, 516: insulator, 522: insulator, 524: insulator, 530: oxide, 530a: oxide, 530b: oxide, 530ba: region, 530bb: region, 530bc: region, 540a: conductor, 540b: conductor, 541a: insulator, 541b: insulator, 542a: conductor, 542b: conductor, 544: insulator, 550: insulator, 550a: insulator, 550b: insulator, 552: insulator, 554: insulator, 560: conductor, 560a: conductor, 560b: conductor, 571a: insulator, 571b: insulator, 574: insulator, 576: insulator, 580: insulator, 581: insulator, 1280: display module, 1281: display portion, 1290: FPC, 1291: substrate, 1292: substrate, 1430a: light-emitting device, 1430b: light-emitting device, 1430c: light-emitting device, 4400a: light-emitting unit, 4400b: light-emitting unit, 4411: light-emitting layer, 4412: light-emitting layer, 4413: light-emitting layer, 4420: layer, 4420-1: layer, 4420-2: layer, 4430: layer, 4430-1: layer, 4430-2: layer, 4440: intermediate layer, 5200: portable game machine, 5201: housing, 5202: display portion, 5203: button, 5900: information terminal, 5901: housing, 5902: display portion, 5903: operation button, 5904: operator, 5905: band, 6000: display module, 6001: upper cover, 6002: lower cover, 6005: FPC, 6006: display apparatus, 6009: frame, 6010: printed circuit board, 6011: battery, 6015: light-emitting portion, 6016: light-receiving portion, 6017a: guide portion, 6017b: guide portion, 6018: light, 6500: electronic device, 6501: housing, 6502: display portion, 6503: power source button, 6504: button, 6505: speaker, 6506: microphone, 6507: camera, 6508: light source, 6510: protection member, 6511:

display panel, 6512: optical member, 6513: touch sensor panel, 6515: FPC, 6516: IC, 6517: printed circuit board, 6518: battery, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8303: operation button, 8304: fixing unit, 8305: lens, 8306: dial, 8307: dial, 8308: driver portion, 8310: user, 8311: user

The invention claimed is:

1. A method for manufacturing a display apparatus comprising a first insulator, a second insulator, a third insulator, a first conductor, a second conductor, and a first EL layer, the method comprising a first step to a ninth step, wherein the first step comprises a step of forming the first conductor over the first insulator, wherein the second step comprises a step of forming the second insulator over the first insulator and over the first conductor, wherein the third step comprises a step of forming a first opening portion reaching the first conductor in a region of the second insulator overlapping with the first conductor, wherein the fourth step comprises a step of applying a first positive photoresist to a portion including regions over the first insulator, over the second insulator, and over the first conductor, wherein the fifth step comprises a step of performing light exposure and development on the first photoresist to form a second opening portion with an inversely tapered structure reaching the first conductor and the second insulator in a region of the first photoresist overlapping with the first opening portion and the first conductor, wherein the sixth step comprises a step of forming the first EL layer over the first conductor and the second insulator positioned on a bottom portion of the second opening portion of the first photoresist and over the first photoresist, wherein the seventh step comprises a step of forming the second conductor over the first EL layer, wherein the eighth step comprises a step of forming the third insulator over the second conductor, and wherein the ninth step comprises a step of performing light exposure and development on the first photoresist to remove the first photoresist and the first EL layer, the second conductor, and the third insulator formed over the first photoresist so that a light-emitting device comprising the first EL layer, the second conductor, and the third insulator is formed over the first conductor.

2. The method for manufacturing a display apparatus, according to claim 1, wherein the second insulator comprises an organic material and an inorganic material overlapping with an upper portion of the organic material, wherein the organic material comprises polyimide, and wherein the inorganic material comprises at least one selected from silicon oxide, silicon oxynitride, silicon nitride oxide, silicon nitride, aluminum oxide, aluminum oxynitride, aluminum nitride oxide, and aluminum nitride.

3. The method for manufacturing a display apparatus, according to claim 2, wherein the display apparatus comprises a first transistor positioned below the first insulator and a second transistor positioned below the first transistor, wherein the first transistor comprises a metal oxide in a channel formation region, and wherein the second transistor comprises silicon in a channel formation region.

4. The method for manufacturing a display apparatus, according to claim 1, wherein the display apparatus comprises a first transistor positioned below the first insulator and a second transistor positioned below the first transistor, wherein the first transistor comprises a metal oxide in a channel formation region, and wherein the second transistor comprises silicon in a channel formation region.

5. A method for manufacturing a display apparatus comprising a first insulator, a second insulator, a third insulator, a first conductor, a second conductor, a third conductor, a fourth conductor, a first EL layer, a second EL layer, and a third EL layer, the method comprising a first step to a sixteenth step, wherein the first step comprises a step of forming the first conductor, the second conductor, and the third conductor over the first insulator, wherein the second step comprises a step of forming the second insulator over the first insulator, over the first conductor, over the second conductor, and over the third conductor, wherein the third step comprises a step of forming a first opening portion reaching the first conductor in a region of the second insulator overlapping with the first conductor, wherein the fourth step comprises a step of forming the first EL layer over the first conductor, over the second conductor, over the third conductor, and over the second insulator, wherein the fifth step comprises a step of applying a first positive photoresist to a portion including a region over the first EL layer, wherein the sixth step comprises a step of performing light exposure and development on the first photoresist to form a second opening portion with an inversely tapered structure reaching the first EL layer in a region of the first photoresist overlapping with the second conductor and the third conductor, wherein the seventh step comprises a step of removing the first EL layer positioned on a bottom portion of the second opening portion of the first photoresist by dry etching treatment to expose the second conductor, the third conductor, and the second insulator at the bottom portion of the second opening portion of the first photoresist, wherein the eighth step comprises a step of forming the second EL layer over the second conductor, the third conductor, and the second insulator positioned on the bottom portion of the second opening portion of the first photoresist and over the first photoresist, wherein the ninth step comprises a step of performing light exposure and development on the first photoresist to remove the first photoresist and the second EL layer formed over the first photoresist, wherein the tenth step comprises a step of applying a second positive photoresist to a portion including regions over the first EL layer and over the second EL layer, wherein the eleventh step comprises a step of performing light exposure and development on the second photoresist to form a third opening portion with an inversely tapered structure reaching the second EL layer in a region of the second photoresist overlapping with the third conductor, wherein the twelfth step comprises a step of removing the second EL layer positioned on a bottom portion of the third opening portion of the second photoresist by dry etching treatment to expose the third conductor and the second insulator at the bottom portion of the third opening portion of the second photoresist, wherein the thirteenth step comprises a step of forming the third EL layer over the second photoresist, over the third conductor positioned on the bottom portion of the third opening portion of the second photoresist, and over the second insulator, wherein the fourteenth step comprises a step of performing light exposure and development on the second photoresist to remove the second photoresist and the third EL layer formed over the second photoresist, wherein the fifteenth step comprises a step of forming the fourth conductor over the first EL layer, over the second EL layer, and over the third EL layer, and wherein the sixteenth step comprises a step of forming the third insulator over the fourth conductor.

6. The method for manufacturing a display apparatus, according to claim 5, wherein the second insulator comprises an organic material and an inorganic material, wherein the inorganic material overlaps with an upper portion of the organic material, wherein the organic material comprises polyimide, and wherein the inorganic material comprises at least one selected from silicon oxide, silicon oxynitride, silicon nitride oxide, silicon nitride, aluminum oxide, aluminum oxynitride, aluminum nitride oxide, and aluminum nitride.

7. The method for manufacturing a display apparatus, according to claim 5, wherein the display apparatus comprises a first transistor positioned below the first insulator and a second transistor positioned below the first transistor, wherein the first transistor comprises a metal oxide in a channel formation region, and wherein the second transistor comprises silicon in a channel formation region.

8. The method for manufacturing a display apparatus, according to claim 6, wherein the display apparatus comprises a first transistor positioned below the first insulator and a second transistor positioned below the first transistor, wherein the first transistor comprises a metal oxide in a channel formation region, and wherein the second transistor comprises silicon in a channel formation region.

* * * * *